United States Patent
Yamazaki et al.

(10) Patent No.: US 8,350,621 B2
(45) Date of Patent: Jan. 8, 2013

(54) ANALOG CIRCUIT AND SEMICONDUCTOR DEVICE

(75) Inventors: Shunpei Yamazaki, Tokyo (JP); Jun Koyama, Kanagawa (JP); Atsushi Hirose, Kanagawa (JP); Masashi Tsubuku, Kanagawa (JP); Kosei Noda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/568,186

(22) Filed: Aug. 7, 2012

(65) Prior Publication Data

US 2012/0299003 A1 Nov. 29, 2012

Related U.S. Application Data

(63) Continuation of application No. 12/907,559, filed on Oct. 19, 2010, now Pat. No. 8,242,837.

(30) Foreign Application Priority Data

Oct. 21, 2009 (JP) ................................ 2009-242853

(51) Int. Cl.
*H01L 25/00* (2006.01)

(52) U.S. Cl. ........ 327/581; 327/108; 327/515; 327/566; 327/567

(58) Field of Classification Search ............. 327/108, 327/109, 512, 514, 515, 538, 543, 564, 565, 327/566, 567, 574, 581
See application file for complete search history.

(56) References Cited

U.S. PATENT DOCUMENTS

| | | | |
|---|---|---|---|
| 5,680,343 | A | 10/1997 | Kamaya |
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,071,771 | B2 * | 7/2006 | Takano et al. ................. 327/543 |

(Continued)

FOREIGN PATENT DOCUMENTS

EP 1737044 A1 12/2006

(Continued)

OTHER PUBLICATIONS

Oba, F et al., "Defect energetics in ZnO: A hybrid Hartree-Fock density functional study," Phys. Rev. B (Physical Review. B), 2008, vol. 77, pp. 245202-1-245202-6.

(Continued)

*Primary Examiner* — Jeffrey Zweizig
(74) *Attorney, Agent, or Firm* — Fish & Richardson P.C.

(57) ABSTRACT

An object is to obtain a semiconductor device having a high sensitivity in detecting signals and a wide dynamic range, using a thin film transistor in which an oxide semiconductor layer is used. An analog circuit is formed with the use of a thin film transistor including an oxide semiconductor which has a function as a channel formation layer, has a hydrogen concentration of $5 \times 10^{19}$ atoms/cm$^3$ or lower, and substantially functions as an insulator in the state where no electric field is generated. Thus, a semiconductor device having a high sensitivity in detecting signals and a wide dynamic range can be obtained.

20 Claims, 25 Drawing Sheets

U.S. PATENT DOCUMENTS

| | | |
|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,705,283 B2 | 4/2010 | Arao et al. |
| 7,732,819 B2 | 6/2010 | Akimoto et al. |
| 7,791,072 B2 | 9/2010 | Kumomi et al. |
| 7,791,074 B2 | 9/2010 | Iwasaki |
| 8,053,717 B2 * | 11/2011 | Koyama et al. ............ 250/214 R |
| 8,124,922 B2 * | 2/2012 | Koyama et al. ............ 250/214 R |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0030265 A1 | 2/2005 | Miyagawa |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0182671 A1 | 8/2007 | Nathan et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2010/0033450 A1 | 2/2010 | Koyama et al. |
| 2010/0065839 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0276689 A1 | 11/2010 | Iwasaki |
| 2010/0279462 A1 | 11/2010 | Iwasaki |

FOREIGN PATENT DOCUMENTS

| | | |
|---|---|---|
| EP | 2226847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 08-297983 A | 11/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-167157 A | 6/2005 |
| JP | 2006-165527 A | 6/2006 |
| JP | 2006-165528 A | 6/2006 |
| JP | 2006-165529 A | 6/2006 |
| JP | 2007-103918 A | 4/2007 |
| WO | WO 2004/114391 A1 | 12/2004 |
| WO | WO 2007/029844 A1 | 3/2007 |

OTHER PUBLICATIONS

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA Amoled Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA Amoled Display,"AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4): a Zn4s conductor", Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09: SID International Symposium Digest of Technical Papers, May 31, 2009, pp. 184-187.
Osada, T et al., "Development of Driver-Integrated Panel Using Amorphous In-Ga-Zn-Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.
Park, J et al., "Amorphous Indium-Gallium-Zinc Oxide TFTS and Their Application for Large Size Amoled," AM-FPD '08 Digest of Technical Papers, Jul. 2, 2008, pp. 275-278.
Park, S et al., "Challenge to Future Displays: Transparent AM-OLED Driven by Peald Grown Zno TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. Amoled Display With Driver Circuit Using Amorphous In-Ga-Zn-Oxide TFTS," IDW '09 : Proceedings of the 16th International Display Workshops, 2009, pp. 689-692.
Son, K et al., "42.4L: Late-News Paper: 4 Inch QVGA Amoled Driven by the Threshold Voltage Controlled Amorphous Gizo (Ga2O3-1n2O3-ZnO) TFT," SID Digest '08: SID International Symposium Digest of Technical Papers, May 20, 2008, vol. 39, pp. 633-636.
Takahashi, M et al., "Theoretical Analysis of IGZO Transparent Amorphous Oxide.Semiconductor," IDW '08: Proceedings of the 15th International Display Workshops, Dec. 3, 2008, pp. 1637-1640.
Tsuda, K et al., "Ultra Low Power Consumption Technologies for Mobile TFT-LCDs," IDW '02: Proceedings of the 9th International Display Workshops, Dec. 4, 2002, pp. 295-298.
Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
Charlene Chen et al.; "P-14: AM-OLED Pixel Circuits Based on a-InGaZnO Thin Film Transistors"; SID Digest '09: SID International Symposium Digest of Technical Papers; 2009; pp. 1128-1131.
International Search Report, PCT Application No. PCT/JP2010/068100, dated Jan. 11, 2011, 2 pages.
Written Opinion, PCT Application No. PCT/JP2010/068100, dated Jan. 11, 2011, 3 pages.
Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09: SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and SN-Doped Zinc Indium Oxide Thin Film Transistors for Amoled Back-Plane," SID Digest '09: SID International Symposium Digest of Technical Papers, May 31, 2009, pp. 280-283.
Clark, S et al., "First Principles Methods Using Castep," Zeitschrift fur Kristallographie, 2005, vol. 220, pp. 567-570.
Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In-Ga-Zn-0 TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.
Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.
Hayashi, R et al., "42.1: Invited Paper: Improved Amorphous In-Ga-Zn-0 Tfts," SID Digest '08: SID International Symposium Digest of Technical Papers, May 20, 2008, vol. 39, pp. 621-624.
Hirao, T et al., "Novel Top-Gate Zinc Oxide Thin-Film Transistors (ZNO TFTS) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07: SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.
Ikeda., T et al., "Full-Functional System Liquid Crystal Display Using CG-Silicon Technology," SID Digest '04: SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch Wxga Amoled Display Driven by Indium-Gallium-Zinc Oxide TFTs Array," SID Digest '08: SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission Amoled Display on Plastic Film and Its Bending Properties," SID Digest '09: SID International Symposium Digest of Technical Papers, May 31, 2009, pp. 983-985.
Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08: SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07: SID International Symposium Digest of Technical Papers, 2007, vol. 38, pp. 1673-1676.

Mo, Y et al., "Amorphous Oxide TFT Backplanes for Large Size Amoled Displays," IDW '08: Proceedings of the 6th International Display Workshops, Dec. 3, 2008, pp. 581-584.

Nakamura, "Synthesis of Homologous Compound with New Long-Period Structure," Nirim Newsletter, Mar., 1995, vol. 150, pp. 1-4 with English translation.

Nakamura, M et al.,"The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem Oleds," SID Digest '09 : SID International Symposium Digest of Technical Papers, May 31, 2009, vol. 40, pp. 899-902.

* cited by examiner

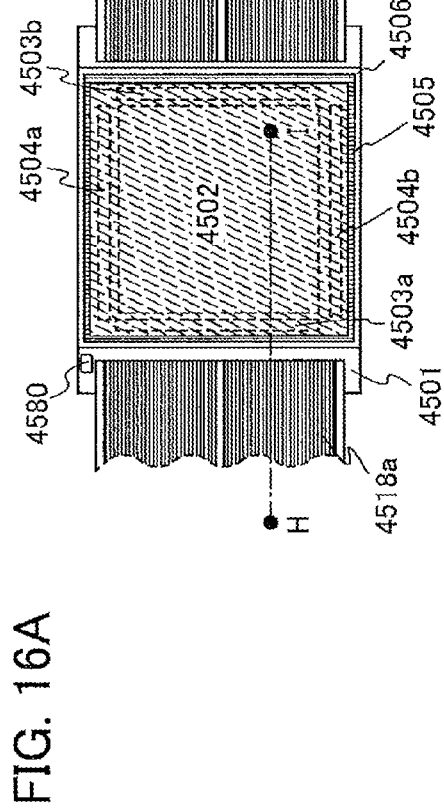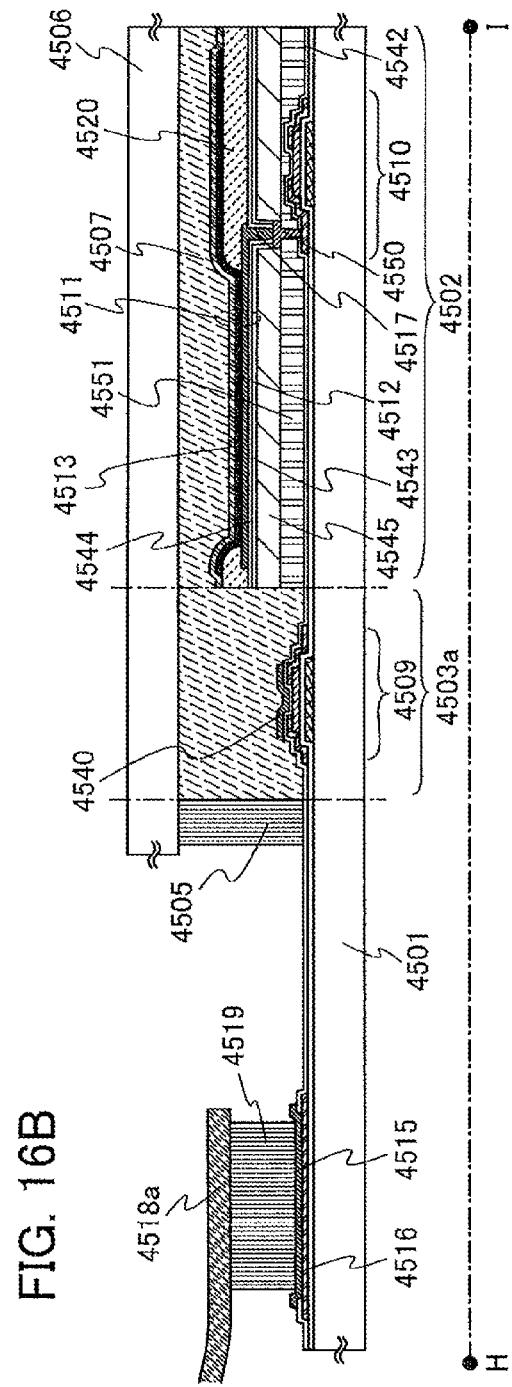
FIG. 16A
FIG. 16B

ANALOG CIRCUIT AND SEMICONDUCTOR DEVICE

CROSS-REFERENCE TO RELATED APPLICATIONS

This application is a continuation of U.S. application Ser. No. 12/907,559, filed Oct. 19, 2010, now allowed, which claims the benefit of a foreign priority application filed in Japan as Serial No. 2009-242853 on Oct. 21, 2009, both of which are incorporated by reference.

TECHNICAL FIELD

An embodiment of the present invention relates to an analog circuit including a field effect transistor in which an oxide semiconductor is used. Further, an embodiment of the present invention relates to a semiconductor device including the analog circuit.

In this specification, a semiconductor device means all types of devices which can function by utilizing semiconductor characteristics, and an electrooptic device, a semiconductor circuit, and electric equipment are all semiconductor devices.

BACKGROUND ART

A technique for forming a thin film transistor (TFT) by using a semiconductor thin film formed over a substrate having an insulating surface has attracted attention. Thin film transistors are used for display devices typified by a liquid crystal TV set. As a semiconductor thin film that can be applied to the thin film transistors, a silicon-based semiconductor material is known, and as another material, an oxide semiconductor attracts attention.

As a material of oxide semiconductor, zinc oxide or a material containing zinc oxide as a component are known. Further, a thin film transistor formed using an amorphous metal oxide (an oxide semiconductor) having an electron carrier concentration less than $10^{18}/cm^3$ is disclosed (Patent Documents 1 to 3).

REFERENCE

Patent Document

[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

However, a difference from the stoichiometric composition in an oxide semiconductor arises in a thin film formation process. For example, electric conductivity of the oxide semiconductor changes due to the excess or deficiency of oxygen. Further, hydrogen that enters the oxide semiconductor thin film during the formation of the thin film forms an oxygen (O)-hydrogen (H) bond and serves as an electron donor, which is a factor of changing electric conductivity. Furthermore, since the O—H bond is a polar molecule, it serves as a factor of varying characteristics of an active device such as a thin film transistor manufactured using an oxide semiconductor.

Even when the electron carrier concentration is less than $10^{18}/cm^3$, the oxide semiconductor is substantially n-type and the on/off ratio of the thin film transistors disclosed in Patent Documents 1 to 3 is only $10^3$. A reason of such low on/off ratio of the thin film transistors is high off-state current.

A circuit formed including a thin film transistor with low on/off ratio tends to operate unstably. In addition, in the case where such a thin film transistor is used in an analog circuit, an enough dynamic range cannot be obtained. Further, high off-state current causes a problem in that the detection sensitivity to weak signals cannot be increased. Furthermore, high off-state current also causes a problem of unnecessary current flow, which increases power consumption.

In view of the above-described problems, it is an object of an embodiment of the present invention to reduce malfunction of a circuit including a thin film transistor which is formed using an oxide semiconductor.

Another object of an embodiment of the present invention is to increase the dynamic range of a circuit including a thin film transistor which is formed using an oxide semiconductor.

Another object of an embodiment of the present invention is to increase sensitivity in detecting signals of a circuit including a thin film transistor which is formed using an oxide semiconductor.

Another object of an embodiment of the present invention is to reduce power consumption of a circuit including a thin film transistor which is folined using an oxide semiconductor.

In an embodiment of the present invention, an analog circuit is formed with the use of a thin film transistor in which a channel region is formed using an oxide semiconductor which is an intrinsic or substantially intrinsic semiconductor and is an oxide semiconductor having a larger energy gap than a silicon semiconductor, which is obtained by removing impurities (hydrogen, moisture, hydride, hydroxide, or the like) serving as an electron donor in an oxide semiconductor.

Specifically, an analog circuit is formed with the use of a thin film transistor in which a channel region is formed using an oxide semiconductor in which hydrogen or OH group is removed so that hydrogen be included therein at lower than or equal to $5\times10^{19}/cm^3$, preferably lower than or equal to $5\times10^{18}/cm^3$, and further preferably lower than or equal to $5\times10^{17}/cm^3$, whereby the carrier concentration becomes $5\times10^{14}/cm^3$ or lower, preferably $5\times10^{12}/cm^3$ or lower.

Impurities such as hydrogen which forms a donor is reduced as much as possible so that the energy gap of the oxide semiconductor is 2 eV or larger, preferably 2.5 eV or larger, and farther preferably 3 eV or larger, whereby the carrier concentration is set to be $1\times10^{14}/cm^3$ or lower, preferably $1\times10^{12}/cm^3$ or lower.

By using the purified oxide semiconductor for a channel region of a thin film transistor, even when the channel width is 10 mm, a drain current of $1\times10^{-13}$ A or lower within a gate voltage range of −5 V to −20 V can be realized in the case where the drain voltage is 1 V and 10 V.

An embodiment of the present invention is an analog circuit which includes: a reference transistor; a mirror transistor; and a detector. The reference transistor is electrically connected to the detector. A drain and a gate of the reference transistor are electrically connected to each other. The gate of the reference transistor is electrically connected to a gate of the mirror transistor. The reference transistor and the mirror transistor include a channel region which is formed using an oxide semiconductor having a hydrogen concentration of $5\times10^{19}$ atoms/$cm^3$ or lower.

Another embodiment of the present invention is an analog circuit which includes: a first thin film transistor having a first terminal which is electrically connected to a high power supply potential (also referred to as a high potential side power supply); a second thin film transistor having a first terminal which is electrically connected to the high power supply potential; and a detector between the high power supply potential and the first terminal of the first thin film transistor. A gate of the first thin film transistor is electrically connected, to a point between the detector and the first terminal of the first thin film transistor. A gate of the second thin film transistor is electrically connected to the gate of the first thin film transistor. A second terminal of the first thin film transistor and a second terminal of the second thin film transistor are electrically connected to a low power supply potential (also referred to as a low potential side power supply). The first thin film transistor and the second thin film transistor include a channel region which is formed using an oxide semiconductor having a hydrogen concentration of $5 \times 10^{19}$ atoms/cm$^3$ or lower.

In this specification, the concentration is measured by secondary ion mass spectrometry (hereinafter also referred to as SIMS). However, the measurement method is not limited to SIMS when particular description of another measurement method is made.

Another embodiment of the present invention is a semiconductor device including any of the above-described analog circuits.

With an embodiment of the present invention, an analog circuit is formed using a thin film transistor in which a purified oxide semiconductor is used, whereby a semiconductor device having a high sensitivity in detecting signals and a wide dynamic range can be obtained.

By using the thin film transistor in which a highly-purified oxide semiconductor is used, a semiconductor device which operates stably and has low power consumption can be obtained.

BRIEF DESCRIPTION OF DRAWINGS

In the accompanying drawings:

FIGS. 16A and 16B show a semiconductor device;

BEST MODE FOR CARRYING OUT THE INVENTION

Embodiments of the present invention will be described with reference to the drawings. However, the present invention is not limited to the following description, and it will be easily understood by those skilled in the art that various changes and modifications can be made in modes and details without departing from the spirit and scope of the present invention. Therefore, the present invention should not be construed as being limited to the description of the following embodiments.

Note that functions of the source and the drain may be switched in the case where transistors of different polarities are employed or in the case where the direction of a current flow changes in a circuit operation. Therefore, the terms "source" and "drain" can be used to denote the drain and the source, respectively, in this specification.

Note that since a source terminal and a drain terminal of a transistor switch depending on the structure, operating conditions, and the like of the transistor, it is difficult to define which is a source terminal or a drain terminal. Therefore, one of a source terminal and a drain terminal is referred to as a first terminal and the other is referred to as a second terminal for distinction in this specification.

Note that the size, the thickness of a layer, or a region of each structure illustrated in drawings or the like of embodiments is exaggerated for simplicity in some cases. Therefore, embodiments of the present invention are not limited to such scales. Further, in this specification, ordinal numbers such as "first", "second", and "third" are used in order to avoid confusion among components, and the terms do not limit the components numerically.

Embodiment 1

A thin film transistor disclosed in this specification in which a purified oxide semiconductor is used can be applied to an analog circuit. As a typical example of the analog circuit, a current mirror circuit can be given, for example. In the case of using a current mirror circuit as a current amplifier circuit, the dynamic range of the current amplifier circuit can be increased, and particularly the sensitivity to a small electric current can be improved.

In this embodiment, a photodetector will be described with reference to FIG. 1 as an example of applying the thin film transistor in which a purified oxide semiconductor is used to a current mirror circuit.

Figure 1:
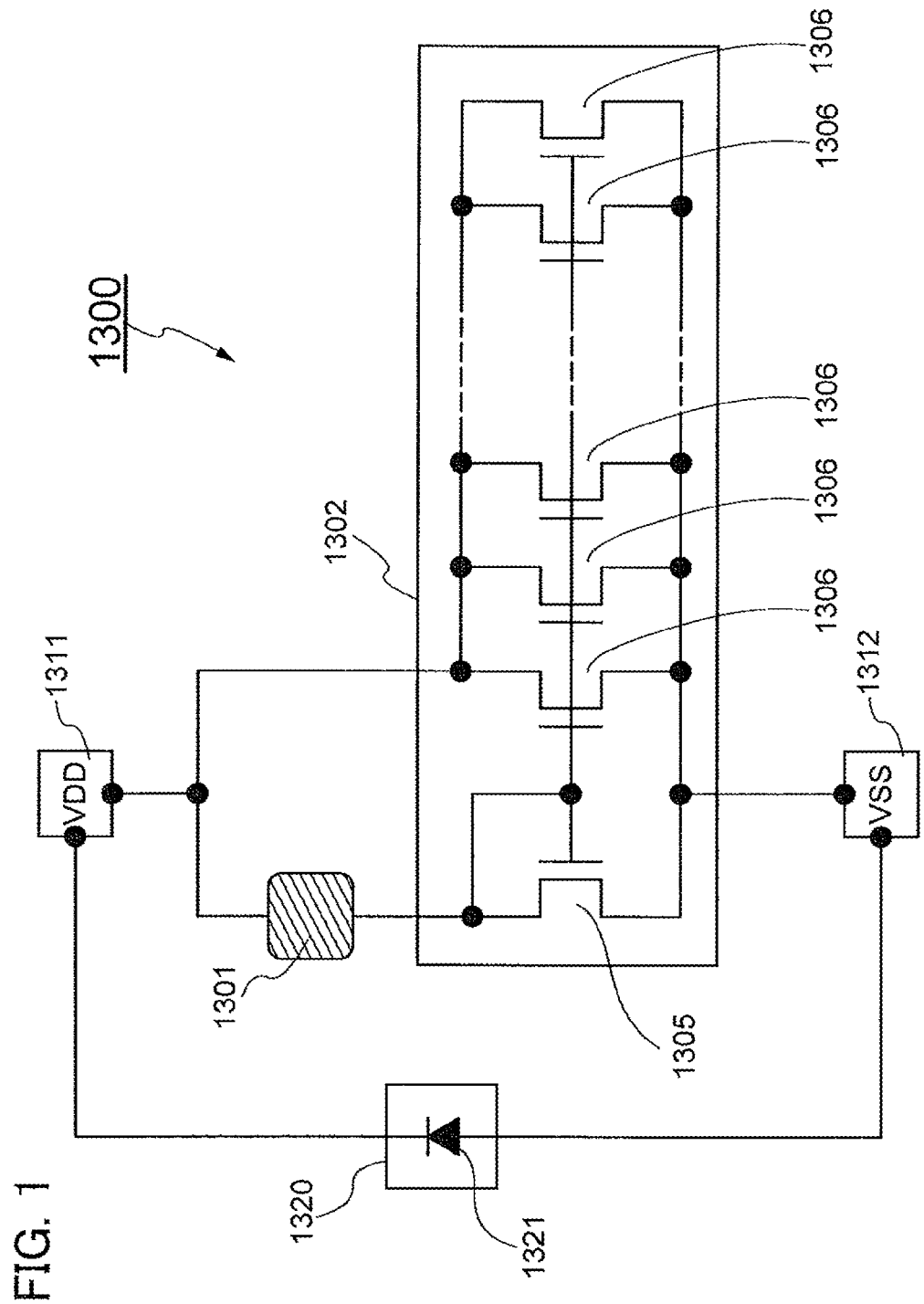
FIG. 1 shows a circuit structure of a semiconductor device.

A photodetector 1300 illustrated in FIG. 1 includes a detector 1301, an amplifier circuit 1302, a power supply terminal 1311 to which a high power supply potential VDD is supplied, a power supply terminal 1312 to which a low power supply potential VSS is supplied, and a protection circuit 1320. In the photodetector 1300, a potential of the power supply terminal 1312 can be a ground potential GND.

The protection circuit 1320 includes a diode 1321. The diode 1321 is provided between the power supply terminal 1311 and the power supply terminal 1312, a cathode of the diode 1321 is electrically connected to the power supply terminal 1311, and an anode of the diode 1321 is electrically connected to the power supply terminal 1312. In the case where an overvoltage (a surge) is applied to the power supply terminal 1311 and/or the power supply terminal 1312 because of ESD or the like, the power supply terminal 1311 and the power supply terminal 1312 are short-circuited by the diode 1321, so that overvoltage can be prevented from being applied to the amplifier circuit 1302 and the detector 1301.

As the diode 1321, a thin film transistor whose gate terminal and drain terminal are connected to each other and which has similar characteristics as a diode can be used. A thin film transistor using a purified oxide semiconductor disclosed in this specification has a feature of an extremely small off-current value. By forming a diode with the use of the thin film transistor using a purified oxide semiconductor disclosed in this specification, leak current of the diode when being applied with a reverse bias can be extremely small. A plurality of diodes formed using such thin film transistors may be connected in series or in parallel.

A photoelectric conversion element which converts received light into electric signals is used as the detector 1301. As the photoelectric conversion element, a photodiode, a phototransistor, or the like can be used. The amplifier circuit 1302 is a circuit for amplifying an output current of the detector 1301. Here, the amplifier circuit 1302 is formed using a current mirror circuit. The current mirror circuit includes one transistor 1305 and a plurality of transistors 1306 connected in parallel to each other. Thin film transistors in which a purified oxide semiconductor is used are employed as the transistors 1305 and 1306.

The transistor 1305 is a reference transistor for detecting an output current of the detector 1301, and the transistors 1306 are mirror transistors which operate based on the current detected by the transistor 1305.

Current flow between the power supply terminal 1311 and the power supply terminal 1312 can be adjusted by the number of transistors 1306. For example, in order to amplify the current flowing between the power supply terminal 1311 and the power supply terminal 1312 to an amount 100 times as large as the output current of the detector 1301 in the case where the transistor 1305 and the transistors 1306 are formed using transistors having the same current-voltage characteristics, ninety-nine transistors 1306 are connected in parallel for one transistor 1305. With this structure, the amplifier circuit 1302 formed using the current mirror circuit can become an amplifier circuit having an amplification factor of 100, so that the output current from the detector 1301 can be amplified by 100 times and detected.

The transistors 1306 may have the same structure as the transistor 1305 except the channel width that is longer than that of the transistor 1305, and the above-described amplifier circuit 1302 can be formed using the transistor 1305 and the transistor 1306 having such a structure. For example, in the case where twenty transistors 1306 each having a channel width that is 4.95 times as long as that of the transistor 1305 are used and connected in parallel for one transistor 1305, the amplification factor of the amplifier circuit 1302 can be 100.

Further, the amplifier circuit 1302 having an amplification factor of 100 can also be formed in the case where the transistor 1306 has the same structure as the transistor 1305 except the channel width that is 99 times as long as that of the transistor 1305 and one transistor 1306 is connected for one transistor 1305. This structure has an advantage of simple circuit structure but increases the possibility of significantly impairing the whole function of the amplifier circuit 1302 when the function of the transistor 1306 is impaired.

Therefore, for the increase in redundancy, it is preferable that the amplifier circuit 1302 have a structure in which the plurality of transistors 1306 is connected in parallel. With the structure in which the plurality of transistors 1306 is connected in parallel, even if the function of part of the plurality of transistors 1306 is impaired, the influence on the amplifier circuit 1302 can be suppressed and thus the highly-reliable amplifier circuit 1302 that can operate stably can be obtained. For example, in the case where ten transistors 1306 are connected in parallel, even if the function of one of the transistors 1306 is impaired, the influence therefrom is supposed to be one tenth.

Further, when the plurality of transistors 1306 is connected in parallel, characteristic variation of the transistors 1306 can be reduced and the amplifier circuit 1302 can operate stably with high reliability.

The amplifier circuit 1302 can have high reliability when the number of transistors 1306 connected in parallel is two or more, preferably five or more. Thus, a photodetector using a highly-reliable current mirror circuit can be manufactured.

In the case where the thin film transistors used in the amplifier circuit 1302 have high off-state current, the signal-to-noise ratio becomes low at the time of detecting a small amount of light. That is, the off-state current becomes an unignorable amount relative to the output current from the detector 1301, so that the output current from the detector 1301 cannot be obtained precisely.

In conventional thin film transistors in which amorphous silicon or polycrystalline silicon is used, the off state current can be made small to some extent by reducing the channel width or increasing the channel length; however a reduction in an on current is a problem at this time. Thus, it has been difficult to balance the detection of a small amount of light and detection of a large amount of light and to obtain a wide dynamic range.

In a thin film transistor disclosed in this specification in which a purified oxide semiconductor is used, even if the channel width is increased, the off-state current can be much smaller than that of conventional thin film transistors. Accordingly, a current mirror circuit which has favorable sensitivity to a small amount of current and has a wide dynamic range can be manufactured. In other words, a photodetector having a wide dynamic range can be manufactured.

The photodetector in which a photoelectric conversion element is used as the detector 1301 has been described in this embodiment, any of the other detectors can be employed as the detector 1301. For example, a temperature sensor can be employed as the detector 1301 to form a temperature detection device. Alternatively, an audio sensor can be employed as the detector 1301, so that not only an audio detection device but also an audio amplifier can be formed.

A current mirror circuit using a thin film transistor disclosed in this specification in which a purified oxide semiconductor is used is not limited to the photodetector described in this embodiment and can be applied to another semiconductor device.

Embodiment 2

Figure 2:
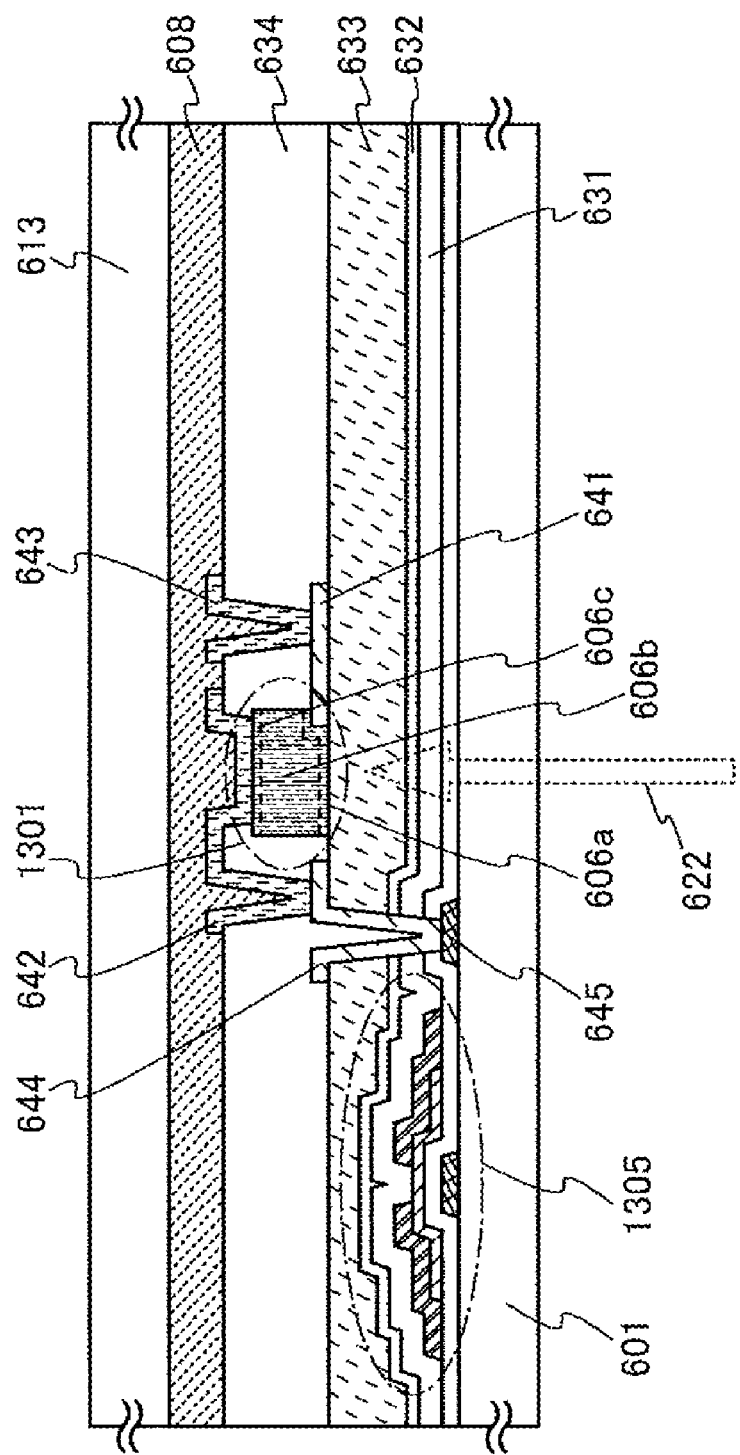
FIG. 2 shows a cross-sectional structure of a semiconductor device.

In this embodiment, an example of a stacked structure of the photodetector 1300 described in Embodiment 1 will be described. An example in which a photodiode is used as the detector 1301 will be described in this embodiment. FIG. 2 is a cross-sectional view illustrating part of the photodetector 1300.

FIG. 2 is a cross-sectional view illustrating the detector 1301 and the transistor 1305 in the photosensor. The detector 1301 functioning as a sensor and the transistor 1305 are provided over a substrate 601. A substrate 613 is provided over the detector 1301 and the transistor 1305 with an adhesive layer 608 interposed therebetween.

A substrate used as the substrate 601 needs to have a light-transmitting property and also have such heat resistance as to withstand heat treatment in the manufacturing process. For example, a glass substrate made of aluminosilicate glass, barium borosilicate glass, aluminoborosilicate glass, or the like can be used. Alternatively, a plastic substrate or the like can be used as appropriate.

An insulating layer 631, a protective insulating layer 632, an interlayer insulating layer 633, and an interlayer insulating layer 634 are provided over the transistor 1305. The detector 1301 is provided over the interlayer insulating layer 633 and has a structure in which a first semiconductor layer 606a, a second semiconductor layer 606b, and a third semiconductor layer 606c are stacked from the interlayer insulating layer 633 side. The first semiconductor layer 606a is electrically connected to an electrode layer 641 which is provided over the interlayer insulating layer 633, and the third semiconductor layer 606c is electrically connected to an electrode layer 642 which is provided over the interlayer insulating layer 634.

The electrode layer 641 is electrically connected to a conductive layer 643 which is formed in the interlayer insulating layer 634, and the electrode layer 642 is electrically connected to a gate electrode layer 645 through an electrode layer 644. The gate electrode layer 645 is electrically connected to a gate electrode layer of the transistor 1305. That is, the detector 1301 is electrically connected to the transistor 1305.

Here, a pin photodiode in which a semiconductor layer having a p-type conductivity as the first semiconductor layer 606a, a high-resistance semiconductor layer (I-type semiconductor layer) as the second semiconductor layer 606b, and a semiconductor layer having an, n-type conductivity as the third semiconductor layer 606c are stacked is illustrated as an example.

The first semiconductor layer 606a is a p-type semiconductor layer and can be formed using an amorphous silicon film containing an impurity element imparting a p-type conductivity. The first semiconductor layer 606a is formed by a plasma CVD method with use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method, an ion doping method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The first semiconductor layer 606a is preferably formed to have a thickness greater than or equal to 10 nm and less than or equal to 50 nm.

The second semiconductor layer 606b is an I-type semiconductor layer (intrinsic semiconductor layer) and is formed using an amorphous silicon film. As for formation of the second semiconductor layer 606b, an amorphous silicon film is formed with use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 606b may be alternatively formed by an LPCVD method, a vapor deposition method, a sputtering method, or the like. The second semiconductor layer 606b is preferably formed to have a thickness greater than or equal to 200 nm and less than or equal to 1000 nm. Ideally, an intrinsic semiconductor layer refers to a semiconductor layer which does not contain an impurity and whose Fermi level is positioned substantially in the center of a forbidden band; however, the second semiconductor layer 606b may be formed using a semiconductor into which an impurity serving as a donor (e.g., phosphorus (P) or the like) or an impurity serving as an acceptor (e.g., boron (B) or the like) is added in order that the Fermi level is positioned substantially in the center of the forbidden band.

The third semiconductor layer 606c is an n-type semiconductor layer and is formed using an amorphous silicon film containing an impurity element imparting an n-type conductivity. The third semiconductor layer 606c is formed by a plasma CVD method with use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method, an ion doping method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The third semiconductor layer 606c is preferably formed to have a thickness greater than or equal to 20 nm and less than or equal to 200 nm.

The first semiconductor layer 606a, the second semiconductor layer 606b, and the third semiconductor layer 606c are not necessarily formed using an amorphous semiconductor, and they may be formed using a polycrystalline semiconductor, a microcrystalline semiconductor, or a semiamorphous semiconductor (an SAS).

Considering Gibbs free energy, the microcrystalline semiconductor is in a metastable state that is intermediate between an amorphous state and a single crystal state. That is, the microcrystalline semiconductor is in a third state that is stable in terms of free energy, and has short-range order and lattice distortion. Columnar or needle-like crystals grow in the direction of the noting to the surface of the substrate. The Raman spectrum of microcrystalline silicon, which is a typical example of a microcrystalline semiconductor, is shifted to a lower wavenumber side than 520 $cm^{-1}$ that represents single crystal silicon. In other words, the Raman spectrum of microcrystalline silicon has a peak between 520 $cm^{-1}$ that represents single crystal silicon and 480 $cm^{-1}$ that represents amorphous silicon. Furthermore, the microcrystalline semiconductor film contains 1 atomic % or more of hydrogen or halogen to terminate dangling bonds. The microcrystalline semiconductor film may further contain a rare gas element such as helium, argon, krypton, or neon to further promote lattice distortion, whereby a favorable microcrystalline semiconductor film with improved stability can be obtained.

This microcrystalline semiconductor film can be formed by a high-frequency plasma CVD method with a frequency of several tens of megahertz to several hundreds of megahertz, or a microwave plasma CVD apparatus with a frequency of 1 GHz or more. Typically, the microcrystalline semiconductor film can be formed using silicon hydride such as $SiH_4$, $Si_2H_6$, $SiH_2Cl_2$, or $SiHCl_3$, or silicon halide such as $SiCl_4$ or $SiF_4$, which is diluted with hydrogen. Furthermore, the microcrystalline semiconductor film can be formed with a gas containing silicon hydride and hydrogen which is diluted by one or more kinds of rare gas elements selected from helium, argon, krypton, and neon.

In the dilution of silicon hydride, the flow rate ratio of hydrogen to silicon hydride is set to 5:1 to 200:1, preferably, 50:1 to 150:1, and more preferably, 100:1. Further, a carbide gas such as $CH_4$ or $C_2H_6$, a germanium gas such as $GeH_4$ or $GeF_4$, $F_2$, or the like may be mixed into the gas containing silicon.

In addition, since the mobility of holes generated by the photoelectric effect is lower than that of electrons, a pin photo diode has better characteristics when a surface on the p-type semiconductor layer side is used as a light-receiving plane. Here, an example where light 622 which the detector 1301 receives from a surface of the substrate 601, over which a pin photodiode is formed, is converted into electric signals will be described. Further, light from the semiconductor layer having a conductivity type opposite from that of the semiconductor layer on the light-receiving plane is disturbance light; therefore, the electrode layer is preferably formed using a light-blocking conductive film. Note that a surface on the n-type semiconductor layer side can alternatively be used as the light-receiving plane.

As the substrate 613, a substrate similar to the substrate 601 can be used. Since the substrate 613 is positioned opposite from the light-receiving plane, a light-blocking substrate such as a metal substrate of aluminum, stainless-steel, or the like or a semiconductor substrate of silicon or the like can be used as the substrate 613.

The insulating layer 631, the protective insulating layer 632, the interlayer insulating layer 633, and, the interlayer insulating layer 634 can be formed using an insulating material by a sputtering method, a spin coating method, a dipping method, spray coating, a droplet discharge method (e.g., an ink-jet method, screen printing, or offset printing), roll coating, curtain coating, knife coating, or the like depending on the material.

As the insulating layer 631, a single layer or a stacked layer of an oxide insulating layer such as a silicon oxide layer, a silicon oxynitride layer, an aluminum oxide layer, an aluminum oxynitride layer, or the like can be used.

As an inorganic insulating material of the protective insulating layer 632, a single layer or a stacked layer of a nitride insulating layer such as a silicon nitride layer, a silicon nitride oxide layer, an aluminum nitride layer, an aluminum nitride oxide layer, or the like can be used. High-density plasma CVD with use of microwaves (2.45 GHz) is preferably employed since formation of a dense and high-quality insulating layer having high withstand voltage is possible.

For reduction of the surface roughness, an insulating film functioning as a planarization insulating film is preferably used as the interlayer insulating layers 633 and 634. The interlayer insulating layers 633 and 634 can be formed using an organic material having heat resistance such as an acrylic resin, polyimide, a benzocyclobutene-based resin, polyamide, or an epoxy resin. As an alternative to such organic materials, it is possible to use a single layer or stacked layers of a low-dielectric constant material (a low-k material), a siloxane-based resin, phosphosilicate glass (PSG), borophosphosilicate glass (BPSG), or the like.

By the detector 1301 detecting incident light, information on an object can be read. Note that a light source such as a backlight can be used at the time of reading information on an object.

A transistor described as an example in the above embodiment can be used as the transistor 1305. A transistor including an oxide layer purified by intentionally eliminating an impurity such as hydrogen, moisture, hydroxyl, or hydride (also referred to as a hydrogen compound) from an oxide semiconductor layer has a suppressed variation in electric characteristics and is electrically stable. Therefore, a semiconductor device with high reliability can be provided.

This embodiment can be implemented in appropriate combination with any structure described in the other embodiments.

Embodiment 3

In this embodiment, an example of a thin film transistor which is included in the analog circuit described in Embodiment 1 will be described.

An embodiment of the thin film transistor of this embodiment and a manufacturing method thereof will be described with reference to FIGS. 3A and 3B and FIGS. 4A to 4E.

Figure 3A:
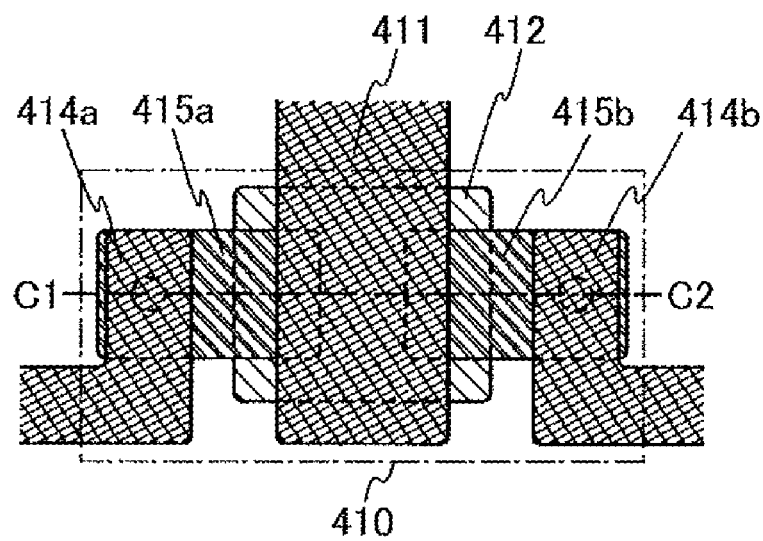
FIGS. 3A and 3B show a top-surface structure and a cross-sectional structure, respectively, of a semiconductor device.
Figure 3B:
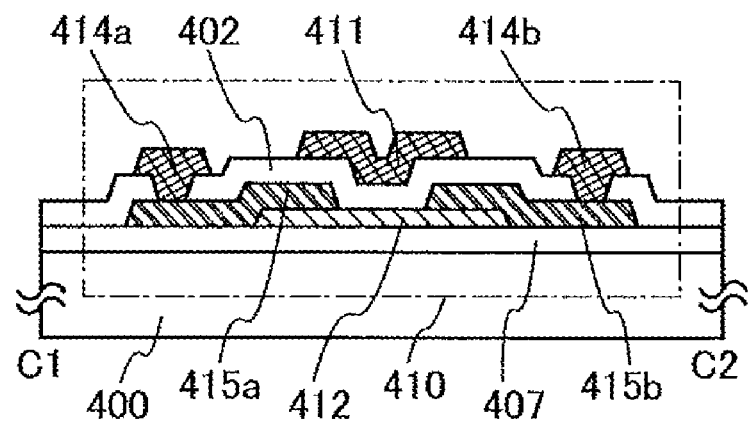

An example of a top-surface structure and a cross-sectional structure of the thin film transistor are illustrated in FIGS. 3A and 3B. A thin film transistor 410 illustrated in FIGS. 3A and 3B is a thin film transistor having a top-gate structure.

FIG. 3A is a top view of the thin film transistor 410 having a top-gate structure, and FIG. 3B is a cross-sectional structure taken along line C1-C2 of FIG. 3A.

The thin film transistor 410 includes, over a substrate 400 having an insulating surface, an insulating layer 407, an oxide semiconductor layer 412, a source or drain electrode layer 415a, a source or drain electrode layer 415b, a gate insulating layer 402, and a gate electrode layer 411. A wiring layer 414a and a wiring layer 414b are provided in contact with and electrically connected to the source or drain electrode layer 415a and the source or drain electrode layer 415b, respectively.

Although the thin film transistor 410 is described as a single-gate thin film transistor, a multi-gate thin film transistor including a plurality of channel regions can be formed when needed.

A process for manufacturing the thin film transistor 410 over the substrate 400 will be described below with reference to FIGS. 4A to 4E.

Although there is no particular limitation on a substrate which can be used as the substrate 400 having an insulating surface, the substrate needs to have at least heat resistance high enough to withstand heat treatment to be performed later. As the substrate 400 having an insulating surface, a glass substrate formed of barium borosilicate glass, aluminoborosilicate glass, or the like can be used.

In the case where a glass substrate is used and the temperature of the heat treatment to be performed later is high, a glass substrate whose strain point is greater than or equal to 730° C. is preferably used. As the glass substrate, a substrate of a glass material such as aluminosilicate glass, aluminoborosilicate glass, or barium borosilicate glass is used, for example. Note that by containing a larger amount of barium oxide (BaO)

than boron oxide ($B_2O_3$), a glass substrate that is heat-resistant and of more practical use can be obtained. Therefore, a glass substrate containing BaO and $B_2O_3$ so that the amount of BaO is larger than that of $B_2O_3$ is preferably used.

Note that a substrate formed of an insulator such as a ceramic substrate, a quartz substrate, or a sapphire substrate may be used instead of the above glass substrate. Alternatively, crystallized glass or the like can be used. Further alternatively, a plastic substrate or the like can be used as appropriate.

The insulating layer 407 serving as a base film is formed over the substrate 400 having an insulating surface. The insulating layer 407 that is in contact with the oxide semiconductor layer 412 is preferably formed using an oxide insulating layer such as a silicon oxide layer, a silicon oxynitride layer, an aluminum oxide layer, an aluminum oxynitride layer, or the like.

As a formation method of the insulating layer 407, a plasma CVD method, a sputtering method, or the like can be used. In order to prevent the insulating layer 407 from containing a large amount of hydrogen, the insulating layer 407 is preferably formed by a sputtering method.

In this embodiment, a silicon oxide layer is formed by a sputtering method as the insulating layer 407. The silicon oxide layer is formed as the insulating layer 407 over the substrate 400 in such a manner that the substrate 400 is transferred to a treatment chamber, a sputtering gas containing high-purity oxygen from which hydrogen and moisture have been removed is introduced, and a silicon semiconductor target is used. Further, the substrate 400 may be kept at room temperature or may be heated.

For example, the silicon oxide layer is formed by a RF sputtering method in such conditions that quartz (preferably, synthetic quartz) is used, the substrate temperature is 108° C., the distance between the substrate and the target (T-S distance) is 60 mm, the pressure is 0.4 Pa, the high-frequency power is 1.5 kW, and an atmosphere of oxygen and argon (the flow ratio of an oxygen flow rate of 25 sccm to an argon flow rate of 25 sccm=1:1) is used. The thickness is 100 nm. Instead of quartz (preferably, synthetic quartz), a silicon target can be used as the target for forming the silicon oxide layer. Oxygen or a mixed gas of oxygen and argon is used as the sputtering gas.

In this case, it is preferable to remove residual moisture in the treatment chamber during the film formation of the insulating layer 407, in order to prevent hydroxyl or moisture from being contained in the insulating layer 407.

In order to remove residual moisture from the treatment chamber, an adsorption-type vacuum pump is preferably used. For example, a cryopump, an ion pump, or a titanium sublimation pump is preferably used. As an exhaustion unit, a turbo pump to which a cold trap is added may be used. From the chamber in which exhaustion is performed with the use of a cryopump, a hydrogen atom, a compound including a hydrogen atom such as water ($H_2O$), or the like, for example, is exhausted. Accordingly, the concentration of an impurity included in the insulating layer 407 formed in the film formation chamber can be reduced.

As a sputtering gas used in formation of the insulating layer 407, a high-purity gas in which the concentration of an impurity such as hydrogen, water, hydroxyl, or hydride is reduced to approximately the ppm level or the ppb level is preferably used.

Examples of a sputtering method include an RF sputtering method in which a high-frequency power source is used as a sputtering power source, a DC sputtering method in which a direct-current power source is used, and a pulsed DC sputtering method in which a bias is applied in a pulsed manner. An RF sputtering method is mainly used in the case of forming an insulating film, and a DC sputtering method is mainly used in the case of forming a metal film.

In addition, there is also a multi-source sputtering apparatus in which a plurality of targets of different materials can be set. With the multi-source sputtering apparatus, films of different materials can be deposited to be stacked in one chamber, and films of plural kinds of materials can be deposited by electric discharge at the same time in one chamber.

In addition, there are also a sputtering apparatus provided with a magnet system inside the chamber and used for a magnetron sputtering method, and a sputtering apparatus used for an ECR sputtering method in which plasma generated with the use of microwaves is used without using glow discharge.

In addition, as a film formation method using a sputtering method, there are also a reactive sputtering method in which a target substance and a sputtering gas component are chemically reacted with each other during film formation to form a thin film of a compound thereof, and a bias sputtering method in which voltage is also applied to a substrate during film formation.

The insulating layer 407 may have a stacked structure and, for example, may have a stacked structure in which a nitride insulating layer such as a silicon nitride layer, a silicon nitride oxide layer, an aluminum nitride layer, or an aluminum nitride oxide layer and the above-described oxide insulating layer are stacked in this order over the substrate 400.

For example, a silicon nitride layer is formed using a silicon target by introducing a sputtering gas which contains high-purity nitrogen and from which hydrogen and moisture have been removed, to a space between the silicon oxide layer and the substrate. Also in this case, it is preferable that the silicon nitride layer be formed while residual moisture in the treatment chamber is removed in a manner similar to that of the silicon oxide layer.

Also in the case of forming the silicon nitride layer, the substrate may be heated during the film formation.

In the case where a silicon nitride layer and a silicon oxide layer are stacked as the insulating layer 407, the silicon nitride layer and the silicon oxide layer can be formed in the same treatment chamber using a common silicon target. First, a sputtering gas containing nitrogen is introduced and a silicon nitride layer is formed using a silicon target placed inside the treatment chamber, and then the sputtering gas is switched to a sputtering gas containing oxygen and a silicon oxide layer is formed using the same silicon target. Since the silicon nitride layer and the silicon oxide layer can be formed in succession without exposure to the air, an impurity such as hydrogen or moisture can be prevented from being adsorbed on a surface of the silicon nitride layer.

Then, an oxide semiconductor film is formed to a thickness of greater than or equal to 2 nm and less than or equal to 200 nm over the insulating layer 407.

In order that the oxide semiconductor film contains as little hydrogen, hydroxyl, and moisture as possible, it is preferable that an impurity adsorbed on the substrate 400, such as hydrogen or moisture, be eliminated and exhausted by preheating the substrate 400, over which the insulating layer 407 is formed, in a preheating chamber of a sputtering apparatus, as a pretreatment for film formation. As an exhaustion unit provided for the preheating chamber, a cryopump is preferably used. Note that this preheating treatment can be omitted. This preheating may be performed on the substrate 400 before formation of the gate insulating layer 402 to be formed later or may be performed on the substrate 400 over which the source or drain electrode layer 415a and the source or drain electrode layer 415b have been formed, in a similar manner.

Note that before the oxide semiconductor film is formed by a sputtering method, dust on a surface of the insulating layer 407 is preferably removed by reverse sputtering in which an argon gas is introduced and plasma is generated. The reverse sputtering is a method in which, without application of a voltage to a target side, a voltage is applied to a substrate side with use of a high-frequency power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used.

The oxide semiconductor film is formed by a sputtering method. As the oxide semiconductor film, any of the following is used: an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Sn—O-based oxide semiconductor film, an In—Zn—O-based oxide semiconductor film, a Sn—Zn—O-based oxide semiconductor film, an Al—Zn—O-based oxide semiconductor film, an In—Ga—O-based oxide semiconductor film, an In—O-based oxide semiconductor film, a Sn—O-based oxide semiconductor film, and a Zn—O-based oxide semiconductor film. In this embodiment, the oxide semiconductor film is formed by a sputtering method with use of an In—Ga—Zn—O-based metal oxide target. The oxide semiconductor film can be formed by a sputtering method in a rare gas (typically, argon) atmosphere, an oxygen atmosphere, or a mixed atmosphere including a rare gas (typically, argon) and oxygen. In the case of using a sputtering method, a film may be formed using a target including silicon oxide ($SiO_x$ (x>0)) at 2 wt % to 10 wt % inclusive. Addition of silicon oxide ($SiO_x$ (x>0)) which hinders crystallization into the oxide semiconductor layer can suppress crystallization of the oxide semiconductor layer at the time when heat treatment is performed after formation of the oxide semiconductor layer in the manufacturing process. The oxide semiconductor layer is preferably in an amorphous state; however, the oxide semiconductor layer may be partly crystallized.

The oxide semiconductor preferably includes In, and further preferably includes In and Ga. In order to obtain an I-type (intrinsic) oxide semiconductor layer, dehydration or dehydrogenation to be described later is effective.

As a sputtering gas used in formation of the oxide semiconductor film, a high-purity gas in which the concentration of an impurity such as hydrogen, water, hydroxyl, or hydride is reduced to approximately the ppm level or the ppb level is preferably used.

As a target for forming the oxide semiconductor film by a sputtering method, a metal oxide target containing zinc oxide as its main component can be used. As another example of the metal oxide target, a metal oxide target including In, Ga, and Zn ($In_2O_3$:$Ga_2O_3$:$ZnO$=1:1:1 in a molar ratio, In:Ga:Zn=1:1:0.5 in an atomic ratio) can be used. As the metal oxide target including In, Ga, and Zn, any of targets having the following composition can also be used: In:Ga:Zn=1:1:1 or 1:1:2 in an atomic ratio. The filling rate of the metal oxide target is higher than or equal to 90% and lower than or equal to 100%, and preferably higher than or equal to 95% and lower than or equal to 99.9%. The use of the metal oxide target having a high filling rate makes it possible to form a dense oxide semiconductor film.

The oxide semiconductor film is formed over the substrate 400 in such a manner that the substrate is held inside a treatment chamber which is kept in a reduced pressure state, a sputtering gas from which hydrogen and moisture have been removed is introduced while residual moisture in the treatment chamber is removed, and a metal oxide is used as a target. In order to remove residual moisture from the treatment chamber, an adsorption-type vacuum pump is preferably used. For example, a cryopump, an ion pump, or a titanium sublimation pump is preferably used. As an exhaustion unit, a turbo pump to which a cold trap is added may be used. From the chamber in which exhaustion is performed with the use of a cryopump, a hydrogen atom, a compound including a hydrogen atom such as water ($H_2O$) (preferably, a compound including a carbon atom as well), or the like, for example, is exhausted. Accordingly, the concentration of an impurity included in the oxide semiconductor film formed in the film formation chamber can be reduced. The substrate may be heated when the oxide semiconductor film is foiined.

As an example of film formation conditions, the following conditions are employed: the substrate temperature is room temperature, the distance between the substrate and the target is 60 mm, the pressure is 0.4 Pa, the direct-current (DC) power is 0.5 kW, and an atmosphere of oxygen and argon (at an oxygen flow rate of 15 sccm and at an argon flow rate of 30 sccm) is used. A pulse direct current (DC) power supply is preferable because powder substances (also referred to as particles or dust) generated in the film formation can be reduced and the film thickness can be made uniform. The oxide semiconductor film preferably has a thickness greater than or equal to 5 nm and less than or equal to 30 nm. Note that appropriate thickness of the oxide semiconductor film varies depending on the material; therefore, the thickness may be determined as appropriate depending on the material.

Figure 4A:
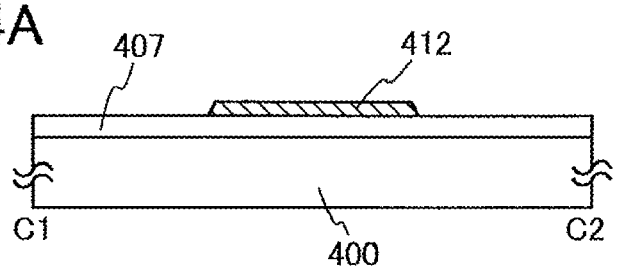
FIGS. 4A to 4E show a manufacturing process of a semiconductor device.
Figure 4B:
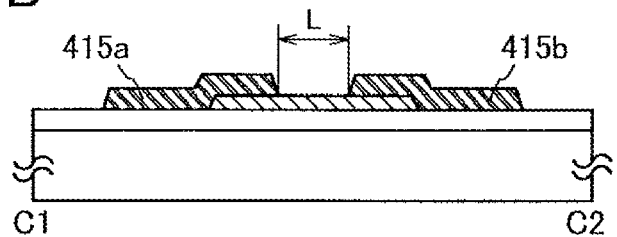

Next, the oxide semiconductor film is processed into the island-shaped oxide semiconductor layer 412 in a first photolithography step (see FIG. 4A). Further, a resist mask for forming the island-shaped oxide semiconductor layer 412 may be formed using an ink-jet method. When the resist mask is formed by an ink-jet method, a photomask is not used; thus, the manufacturing cost can be reduced.

For this etching of the oxide semiconductor film, wet etching, dry etching, or both of them may be employed.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RE (reactive ion etching) method or an ICP (inductively coupled plasma) etching method can be used. In order to etch the layer into a desired shape, the etching conditions (the amount of electric power applied to a coil-shaped electrode, the amount of electric power applied to an electrode on a substrate side, the temperature of the electrode on the substrate side, or the like) are adjusted as appropriate.

As an etchant used for wet etching, a solution obtained by mixing phosphoric acid, acetic acid, and nitric acid, or the like can be used. In addition, ITO07N (produced by KANTO CHEMICAL CO., INC.) may also be used.

After the wet etching, the etchant is removed by cleaning together with the material which is etched off. Waste liquid of the etchant containing the removed material may be purified and the material contained in the waste liquid may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

In this embodiment, the oxide semiconductor film is processed into the island-shaped oxide semiconductor layer 412 by a wet etching method using a solution obtained by mixing phosphoric acid, acetic acid, and nitric acid as an etchant.

Next in this embodiment, first heat treatment is performed on the oxide semiconductor layer 412. The temperature of the first heat treatment is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, the oxide semiconductor layer is obtained. Dehydration or dehydrogenation of the oxide semiconductor layer 412 can be performed through the first heat treatment.

The heat treatment apparatus is not limited to the electric furnace and may be the one provided with a device for heating a process object using heat conduction or heat radiation from a heating element such as a resistance heating element. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which does not react with a process object by heat treatment, such as nitrogen or a rare gas such as argon is used.

For example, as the first heat treatment, GRTA may be performed in the following manner. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment in a short time.

Note that in the first heat treatment, it is preferable that water, hydrogen, and the like be not contained in nitrogen or a rare gas such as helium, neon, or argon. Alternatively, it is preferable that nitrogen or a rare gas such as helium, neon, or argon introduced into a heat treatment apparatus have a purity of 6N (99.9999%) or more, preferably, 7N (99.99999%) or more (that is, the impurity concentration is set to 1 ppm or lower, preferably, 0.1 ppm or lower).

By reduction of an impurity in the oxide semiconductor in the above-described manner, an I-type or substantially I-type oxide semiconductor (a purified oxide semiconductor) can be obtained. Specifically, hydrogen or OH group in the oxide semiconductor is removed so that hydrogen be included in the oxide semiconductor at lower than or equal to $5\times10^{19}/cm^3$, preferably lower than or equal to $5\times10^{18}/cm^3$, and further preferably lower than or equal to $5\times10^{17}/cm^3$, whereby the carrier concentration becomes $5\times10^{14}/cm^3$ or lower, preferably $5\times10^{12}/cm^3$ or lower. Thus, an I-type or substantially I-type oxide semiconductor (a purified oxide semiconductor) can be obtained.

Further, the oxide semiconductor layer may be crystallized to be a microcrystalline layer or a polycrystalline layer depending on the condition of the first heat treatment or a material of the oxide semiconductor layer. For example, the oxide semiconductor layer may be crystallized to be a microcrystalline oxide semiconductor layer having a degree of crystallization of 90% or more, or 80% or more. The oxide semiconductor layer may become an amorphous oxide semiconductor layer containing no crystalline component depending on the condition of the first heat treatment or a material of the oxide semiconductor layer. The oxide semiconductor layer may become an oxide semiconductor layer in which a microcrystalline portion (with a grain diameter greater than or equal to 1 nm and less than or equal to 20 nm, typically greater than or equal to 2 nm and less than or equal to 4 nm) is mixed into an amorphous oxide semiconductor.

The first heat treatment may be performed on the oxide semiconductor film before being processed into the island-shaped oxide semiconductor layer, instead of on the island-shaped oxide semiconductor layer. In that case, after the first heat treatment, the substrate is taken out of the heating apparatus and a photolithography step is performed.

The heat treatment having an effect of dehydrating or dehydrogenating the oxide semiconductor layer may be performed at any of the following timings: after the oxide semiconductor layer is formed; after a source electrode and a drain electrode are fog wed over the oxide semiconductor layer; and after a gate insulating layer is formed over the source electrode and the drain electrode.

Next, a conductive film is formed over the insulating layer 407 and the oxide semiconductor layer 412. The conductive film may be formed by a sputtering method or a vacuum evaporation method. As a material of the conductive film, it is possible to use an element selected from aluminum (Al), chromium (Cr), copper (Cu), tantalum (Ta), titanium (Ti), molybdenum (Mo), and tungsten (W), an alloy containing any of the elements, an alloy film combining the elements, or the like. Alternatively, one or more materials selected from manganese (Mn), magnesium (Mg), zirconium (Zr), beryllium (Be), and thorium (Th) may be used. Further, the metal conductive film may have a single-layer structure or a stacked structure including two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum (Al) and one or a plurality of elements selected from titanium, tantalum, tungsten, molybdenum, chromium, neodymium, and scandium may be used.

A resist mask is formed over the conductive film by a second photolithography step. Selective etching is performed, so that a source or drain electrode layer 415a and a source or drain electrode layer 415b are formed. Then, the resist mask is removed (see FIG. 4B). It is preferable that end portions of the formed source and drain electrode layers have a tapered shape to improve coverage with a gate insulating layer stacked thereover.

In this embodiment, a titanium film having a thickness of 150 nm is formed by a sputtering method as the conductive film for forming the source or drain electrode layer 415a and the source or drain electrode layer 415b.

Note that each material and etching conditions are adjusted as appropriate so that the insulating layer 407 below the oxide semiconductor layer 412 is not exposed by removal of the oxide semiconductor layer 412 at the time of etching the conductive film.

In this embodiment, a Ti film is used as the conductive film, an In—Ga—Zn—O-based oxide semiconductor is used as the oxide semiconductor layer 412, and an ammonia hydrogen peroxide solution (a mixture of ammonia, water, and a hydrogen peroxide solution) is used as an etchant.

Note that in the second photolithography step, the oxide semiconductor layer 412 may be partly etched in some cases, so that an oxide semiconductor layer having a groove (a depression portion) is formed. A resist mask for forming the source or drain electrode layer 415a and the source or drain electrode layer 415b may be formed by an ink-jet method. When the resist mask is formed by an ink-jet method, a photomask is not used; thus, the manufacturing cost can be reduced.

For light exposure at the formation of the resist mask in the second photolithography step, ultraviolet rays, KrF laser light, or ArF laser light is used. The channel length L of the thin film transistor to be completed later is determined by the distance between a lower end portion of the source electrode layer and a lower end portion of the drain electrode layer, which are adjacent to each other over the oxide semiconductor layer 412. In the case where the channel length L is shorter than 25 nm and light exposure for forming the resist mask in the second photolithography step is performed, extreme ultraviolet rays having a wavelength as extremely short as several nanometers to several tens of nanometers are used. Light exposure using extreme ultraviolet rays has high resolution and large depth of focus. Therefore, the channel length L of the thin film transistor to be completed later can be set at larger than or equal to 10 nm and less than or equal to 1000 nm, whereby circuit operation speed can be increased. In addition, since the off state current is extremely low, lower power consumption can be achieved.

Figure 4C:
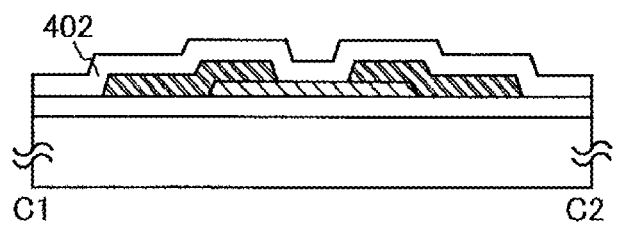

Next, the gate insulating layer 402 is formed over the insulating layer 407, the oxide semiconductor layer 412, the source or drain electrode layer 415a, and the source or drain electrode layer 415b (see FIG. 4C).

The gate insulating layer 402 can be formed to have a single-layer structure or a stacked structure of a silicon oxide layer, a silicon nitride layer, a silicon oxynitride layer, a silicon nitride oxide layer, or an aluminum oxide layer by a plasma CVD method, a sputtering method, or the like. In order to prevent the gate insulating layer 402 from containing a large amount of hydrogen, the gate insulating layer 402 is preferably formed by a sputtering method. In the case of forming a silicon oxide film by a sputtering method, a silicon target or a quartz target is used as a target, and oxygen or a mixed gas of oxygen and argon is used as a sputtering gas.

The gate insulating layer 402 can have a structure in which a silicon oxide layer and a silicon nitride layer are stacked in this order over the source or drain electrode layer 415a and source or drain electrode layer 415b. For example, the gate insulating layer 402 having a thickness of 100 nm may be formed in such a manner that a silicon oxide layer ($SiO_x$ (x>0)) having a thickness of 5 nm to 300 nm inclusive is formed as a first gate insulating layer and a silicon nitride layer ($SiN_y$ (y>0)) having a thickness of 50 nm to 200 nm inclusive is stacked over the first gate insulating layer as a second gate insulating layer by a sputtering method. In this embodiment, a silicon oxide layer having a thickness of 100 nm is formed by an RF sputtering method under a pressure of 0.4 Pa, a high-frequency power of 1.5 kW, and an atmosphere of oxygen and argon (the flow ratio of an oxygen flow rate of 25 sccm to an argon flow rate of 25 sccm=1:1).

Figure 4D:
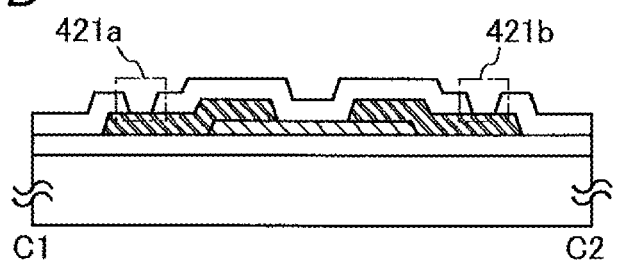

Next in a third photolithography step, a resist mask is formed, and selective etching is performed to remove part of the gate insulating layer 402, so that an opening 421a and an opening 421b which reach the source or drain electrode layer 415a and the source or drain electrode layer 415b respectively are formed (see FIG. 4D).

Then, a conductive film is formed over the gate insulating layer 402 and the openings 421a and 421b, and the gate electrode layer 411 and the wiring layers 414a and 414b are formed by a fourth photolithography step. Note that a resist mask may be formed by an ink-jet method. When the resist mask is formed by an ink-jet method, a photomask is not used; thus, the manufacturing cost can be reduced.

The gate electrode layer 411 and the wiring layers 414a and 414b can be formed to have a single-layer structure or a stacked structure using a metal material such as molybdenum, titanium, chromium, tantalum, tungsten, aluminum, copper, neodymium, or scandium or an alloy material which contains any of these materials as its main component.

For example, as a two-layer structure of the gate electrode layer 411 and the wiring layers 414a and 414b, any of the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable. Note that the gate electrode layer can also be formed using a light-transmitting conductive film. As a light-transmitting conductive film, a light-transmitting conductive oxide or the like can be given.

In this embodiment, the gate electrode layer 411 and the wiring layers 414a and 414b are formed using a titanium film having a thickness of 150 nm by a sputtering method.

Next, second heat treatment (preferably at 200° C. to 400° C., for example at 250° C. to 350° C.) is performed in an inert gas atmosphere or an oxygen gas atmosphere. In this embodiment, the second heat treatment is performed at 250° C. in a nitrogen atmosphere for one hour. The second heat treatment may be performed after a protective insulating layer or a planarization insulating layer is formed over the thin film transistor 410.

Furthermore, heat treatment may be performed at 100° C. to 200° C. inclusive for one hour to 30 hours in the air. This heat treatment may be performed at a fixed heating temperature. Alternatively, the following change in the heating temperature may be conducted plural times repeatedly: the heating temperature is increased from room temperature to a temperature of 100° C. to 200° C. and then decreased to room temperature. This heat treatment may be performed under a reduced pressure. Under a reduced pressure, the heat treatment time can be shortened.

Figure 4E:
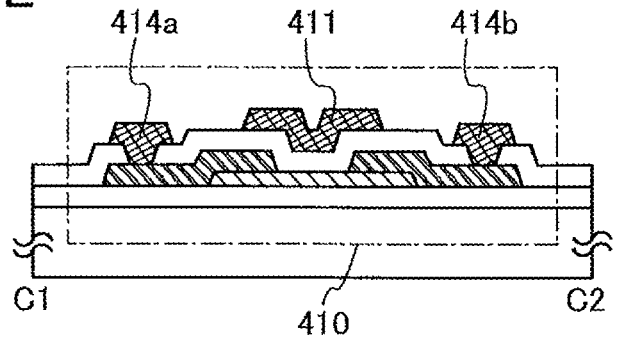

Through the above-described process, the thin film transistor 410 including, the oxide semiconductor layer 412 in which the concentration of hydrogen, moisture, hydride, or hydroxide is reduced can be formed (see FIG. 4E). The thin film transistor 410 can be used as the thin film transistor included in the analog circuit of Embodiments 1 and 2.

A protective insulating layer or a planarization insulating layer for planarization may be provided over the thin film transistor 410. For example, a protective insulating layer can be formed to have a single-layer structure or a stacked structure including a silicon oxide layer, a silicon nitride layer, a silicon oxynitride layer, a silicon nitride oxide layer, or an aluminum oxide layer.

The planarization insulating layer can be formed using an organic material having heat resistance, such as polyimide, an acrylic resin, a benzocyclobutene-based resin, polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. Note that the planarization insulating layer may be formed by stacking a plurality of insulating films using these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the planarization insulating layer. The planarization insulating layer can be formed, depending on the material, by a method such as a sputtering method, an SOG method, a spin coating method, a dipping method, a spray coating method, or a droplet discharge method (e.g., an ink-jet method, screen printing, or offset printing), or with the use of a tool such as a doctor knife, a roll coater, a curtain coater, or a knife coater.

When the oxide semiconductor film is formed, residual moisture in a reaction atmosphere is removed in the above-described manner; thus, the concentration of hydrogen and hydride in the oxide semiconductor film can be reduced. Thus, the oxide semiconductor film can be stabilized.

The oxide semiconductor which becomes I-type or becomes substantially I-type (an oxide semiconductor which is purified) due to removal of an impurity is extremely sensitive to an interface state density or an interface electric charge; therefore, an interface with the gate insulating film is important. Thus, higher quality is demanded for the gate insulating film (GI) in contact with the purified oxide semiconductor.

For example, high-density plasma CVD with use of microwaves (2.45 GHz) is preferably employed since formation of a dense and high-quality insulating film having high withstand voltage is possible. When the purified oxide semiconductor and the high-quality gate insulating film are in close contact with each other, the interface state density can be reduced and favorable interface characteristics can be obtained. If an insulating film that is favorable as a gate insulating film can be formed, other film formation methods such as a sputtering method and a plasma CVD method can be employed. Alternatively, an insulating film whose film quality and interface characteristics with the oxide semiconductor are improved by heat treatment performed after formation of the insulating film may be used. In any case, any insulating film that has a reduced interface state density with the oxide semiconductor and can form a favorable interface as well as having a favorable film quality as a gate insulating film can be used.

Further, when an oxide semiconductor containing impurities is subjected to a gate bias-temperature stress test (BT test) at 85° C., at a voltage applied to the gate of $2 \times 10^6$ V/cm, for 12 hours, a bond between the impurity and a main component of the oxide semiconductor is cleaved by a high electric field (B: bias) and a high temperature (7 temperature), and a generated dangling bond induces drift of threshold voltage ($V_{th}$). In contrast, the present invention makes it possible to obtain a thin film transistor which is stable to a BT test by removing impurities in an oxide semiconductor, especially hydrogen, water, and the like as much as possible to obtain a favorable characteristic of an interface between the oxide semiconductor and a gate insulating film as described above.

When the above-described thin film transistor is used in the analog circuit described in Embodiment 1, the analog circuit can have stable electric characteristics and high reliability.

This embodiment can be implemented in appropriate combination with any of the other embodiments.

Embodiment 4

In this embodiment, an example of a thin film transistor which is included in the analog circuit described in Embodiment 1 will be described. Note that as for the same portions as or portions having functions similar to those in Embodiment 3 and the same steps as or steps similar to those in Embodiment 3, Embodiment 3 may be referred to, and repetitive description thereof will be omitted. In addition, detailed description of the same portions is not repeated.

In this embodiment, an embodiment of a thin film transistor and a manufacturing method thereof will be described with reference to FIGS. 5A and 5B and FIGS. 6A to 6E.

Figure 5A:
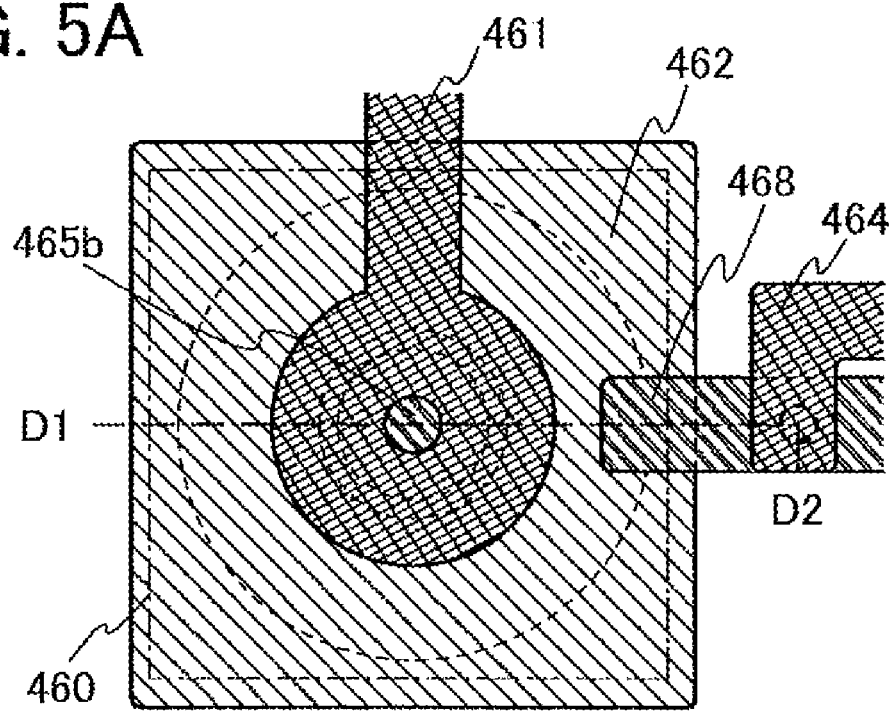
FIGS. 5A and 5B show a top-surface structure and a cross-sectional structure, respectively, of a semiconductor device.
Figure 5B:
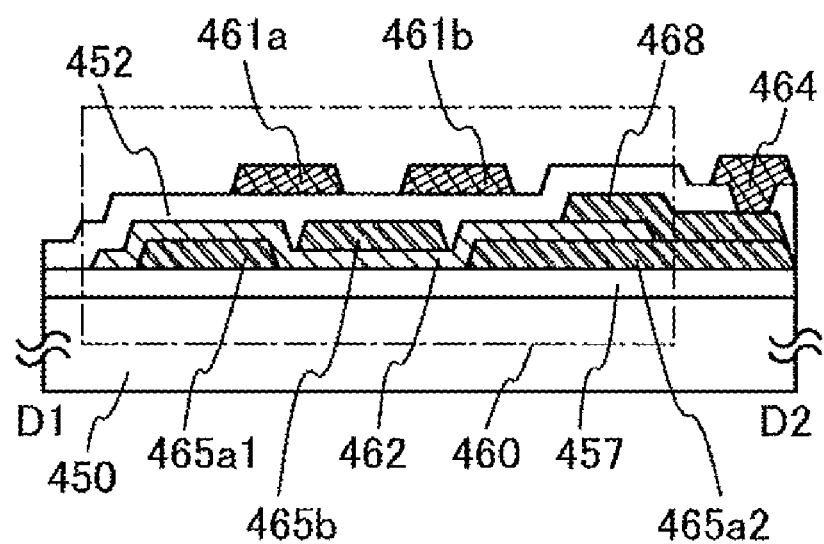

An example of a top-surface structure and a cross-sectional structure of the thin film transistor are illustrated in FIGS. 5A and 5B. A thin film transistor 460 illustrated in FIGS. 5A and 5B is a thin film transistor having a top-gate structure.

FIG. 5A is a plan view of the thin film transistor 460 having a top-gate structure, and FIG. 5B is a cross-sectional structure taken along line D1-D2 of FIG. 5A.

The thin film transistor 460 includes, over a substrate 450 having an insulating surface, an insulating layer 457, source or drain electrode layers 465a1 and 465a2, an oxide semiconductor layer 462, a source or drain electrode layer 465b, a wiring layer 468, a gate insulating layer 452, and a gate electrode layer 461 (461a, 461b). The source or drain electrode layers 465a1 and 465a2 are electrically connected to the wiring layer 464 through the wiring layer 468. In addition, although not illustrated, the source or drain electrode layer 465b is also electrically connected to a wiring layer through an opening provided in the gate insulating layer 452.

A process for manufacturing the thin film transistor 460 over the substrate 450 will be described below with reference to FIGS. 6A to 6E.

First, the insulating layer 457 serving as a base film is formed over the substrate 450 having an insulating surface.

In this embodiment, a silicon oxide layer is formed by a sputtering method as the insulating layer 457. The silicon oxide layer is formed as the insulating layer 457 over the substrate 450 in such a manner that the substrate 450 is transferred to a treatment chamber, a sputtering gas containing high-purity oxygen from which hydrogen and moisture have been removed is introduced, and a silicon target or quartz (synthetic quartz) is used. Oxygen or a mixed gas of oxygen and argon is used as a sputtering gas.

For example, the silicon oxide layer is formed by a RF sputtering method in such conditions that quartz (preferably, synthetic quartz) having a purity of 6N is used, the substrate temperature is 108° C., the distance between the substrate and the target (T-S distance) is 60 mm, the pressure is 0.4 Pa, the high-frequency power is 1.5 kW, and an atmosphere of oxygen and argon (the flow ratio of an oxygen flow rate of 25 sccm to an argon flow rate of 25 sccm=1:1) is used. The thickness is 100 nm. Instead of quartz (preferably, synthetic quartz), a silicon target can be used as the target for forming the silicon oxide layer.

In this case, it is preferable to remove residual moisture in the treatment chamber during the film formation of the insulating layer 457, in order to prevent hydroxyl or moisture from being contained in the insulating layer 457. From the chamber in which exhaustion is performed with the use of a cryopump, a hydrogen atom, a compound including a hydrogen atom such as water ($H_2O$), or the like, for example, is exhausted. Accordingly, the concentration of an impurity included in the insulating layer 457 formed in the film formation chamber can be reduced.

As a sputtering gas used in formation of the insulating layer 457, a high-purity gas in which the concentration of an impurity such as hydrogen, water, hydroxyl, or hydride is reduced to approximately the ppm level or the ppb level is preferably used.

The insulating layer 457 may have a stacked structure and, for example, may have a stacked structure in which a nitride insulating layer such as a silicon nitride layer, a silicon nitride oxide layer, an aluminum nitride layer, or an aluminum nitride oxide layer and the above-described oxide insulating layer are stacked in this order over the substrate 450.

For example, a silicon nitride layer is formed using a silicon target by introducing a sputtering gas which contains high-purity nitrogen and from which hydrogen and moisture have been removed, to a space between the silicon oxide layer and the substrate. Also in this case, it is preferable that the silicon nitride layer be formed while residual moisture in the treatment chamber is removed, in a manner similar to that of the silicon oxide layer.

Next, a conductive film is formed over the insulating layer 457. A resist mask is formed over the conductive film by a first photolithography step. Selective etching is performed, so that the source or drain electrode layers 465a1 and 465a2 are formed. Then, the resist mask is removed (see FIG. 6A). The source or drain electrode layers 465a1 and 465a2 are separated in the cross-sectional view, they are one continuous film. It is preferable that end portions of the formed source and drain electrode layers have a tapered shape to improve coverage with a gate insulating layer stacked thereover.

As a material of the source or drain electrode layers 465a1 and 465a2, an element selected from Al, Cr, Cu, Ta, Ti, Mo, and W; an alloy containing any of the above elements as its component; an alloy film containing these elements in combination; and the like can be given. Alternatively, one or more materials selected from manganese, magnesium, zirconium, beryllium, and thorium may be used. The metal conductive film may have a single-layer structure or a stacked structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum and one or a plurality of elements selected from titanium, tantalum, tungsten, molybdenum, chromium, neodymium, and scandium may be used.

In this embodiment, the source or drain electrode layers 465a1 and 465a2 are formed using a titanium film having a thickness of 150 nm by a sputtering method.

Next, an oxide semiconductor film having a thickness larger than or equal to 2 nm and less than or equal to 200 nm is formed over the insulating layer 457 and the source or drain electrode layers 465a1 and 465a2.

Figure 6A:
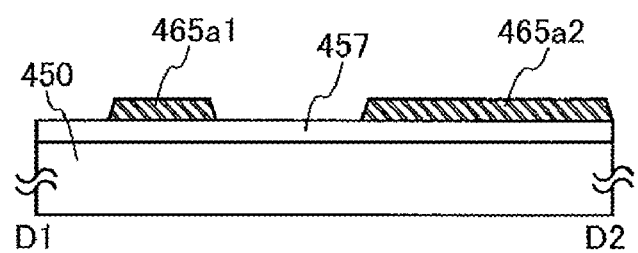
FIGS. 6A to 6E show a manufacturing process of a semiconductor device.
Figure 6B:
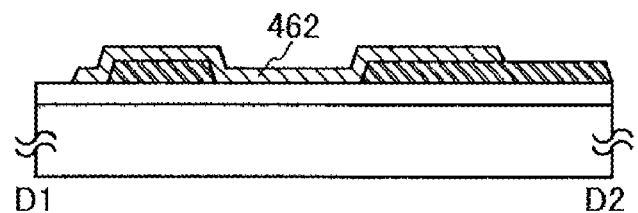
Figure 6C:
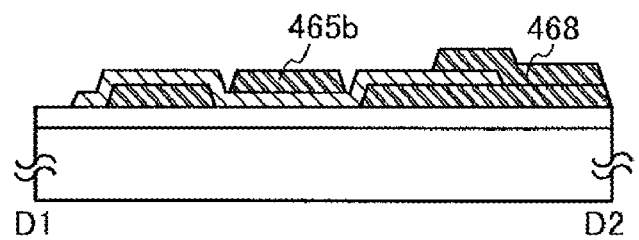

Then, the oxide semiconductor film is processed into the island-shaped oxide semiconductor layer 462 by a second photolithography step (see FIG. 6B). In this embodiment, the oxide semiconductor film is formed by a sputtering method with use of an In—Ga—Zn—O-based metal oxide target.

The oxide semiconductor film is formed over the substrate 450 in such a manner that the substrate is held inside a treatment chamber which is kept in a reduced pressure state, a sputtering gas from which hydrogen and moisture have been removed is introduced while residual moisture in the treatment chamber is removed, and a metal oxide is used as a target. In order to remove residual moisture from the treatment chamber, an adsorption-type vacuum pump is preferably used. For example, a cryopump, an ion pump, or a titanium sublimation pump is preferably used. As an exhaustion unit, a turbo pump to which a cold trap is added may be used. From the chamber in which exhaustion is performed with the use of a cryopump, a hydrogen atom, a compound including a hydrogen atom such as water ($H_2O$) (preferably, a compound including a carbon atom as well), or the like, for example, is exhausted. Accordingly, the concentration of an impurity included in the oxide semiconductor film formed in the film formation chamber can be reduced. The substrate may be heated when the oxide semiconductor film is formed.

As a sputtering gas used in formation of the oxide semiconductor film, a high-purity gas in which the concentration of an impurity such as hydrogen, water, hydroxyl, or hydride is reduced to approximately the ppm level or the ppb level is preferably used.

As an example of film formation conditions, the following conditions are employed: the substrate temperature is room temperature, the distance between the substrate and the target is 60 mm, the pressure is 0.4 Pa, the direct-current (DC) power is 0.5 kW, and an atmosphere of oxygen and argon (at an oxygen flow rate of 15 sccm and at an argon flow rate of 30 sccm) is used. A pulse direct current (DC) power supply is preferable because powder substances (also referred to as particles or dust) generated in the film formation can be reduced and the film thickness can be made uniform. The oxide semiconductor film preferably has a thickness greater than or equal to 5 nm and less than or equal to 30 nm. Note that appropriate thickness of the oxide semiconductor film varies depending on the material; therefore, the thickness may be determined as appropriate depending on the material.

In this embodiment, the oxide semiconductor film is processed into the island-shaped oxide semiconductor layer 462 by a wet etching method using a solution obtained by mixing phosphoric acid, acetic acid, and nitric acid as an etchant.

In this embodiment, first heat treatment is performed on the oxide semiconductor layer 462. The temperature of the first heat treatment is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, the oxide semiconductor layer is obtained. Dehydration or dehydrogenation of the oxide semiconductor layer 462 can be performed through the first heat treatment.

The heat treatment apparatus is not limited to the electric furnace and may be the one provided with a device for heating a process object using heat conduction or heat radiation from a heating element such as a resistance heating element. For example, an RTA (rapid thermal annealing) apparatus such as a GRTA (gas rapid thermal annealing) apparatus or an LRTA (lamp rapid thermal annealing) apparatus can be used. For example, as the first heat treatment, GRTA may be performed in the following manner. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment in a short time.

Note that in the first heat treatment, it is preferable that water, hydrogen, and the like be not contained in nitrogen or a rare gas such as helium, neon, or argon. Alternatively, it is preferable that nitrogen or a rare gas such as helium, neon, or argon introduced into a heat treatment apparatus have a purity of 6N (99.9999%) or more, preferably, 7N (99.99999%) or more (that is, the impurity concentration is set to 1 ppm or lower, preferably, 0.1 ppm or lower).

Further, the oxide semiconductor layer may be crystallized to be a microcrystalline layer or a polycrystalline layer depending on the condition of the first heat treatment or a material of the oxide semiconductor layer.

The first heat treatment may be performed on the oxide semiconductor film before being processed into the island-shaped oxide semiconductor layer, instead of on the island-shaped oxide semiconductor layer. In that case, after the first heat treatment, the substrate is taken out of the heating apparatus and a photolithography step is performed.

The heat treatment having an effect of dehydrating or dehydrogenating the oxide semiconductor layer may be performed at any of the following timings: after the oxide semiconductor layer is formed; after a source electrode or a drain electrode is stacked over the oxide semiconductor layer; and after a gate insulating layer is formed over the source electrode and the drain electrode.

Next, a conductive film is formed over the insulating layer 457 and the oxide semiconductor layer 462. A resist mask is formed over the conductive film by a third photolithography step. Selective etching is performed, so that the source or drain electrode layer 465b and the wiring layer 468 are formed. Then, the resist mask is removed (see FIG. 6C). The source or drain electrode layer 465b and the wiring layer 468 may be formed using a material and a process which are similar to those of the source or drain electrode layers 465a1 and 465a2.

In this embodiment, the source or drain electrode layer 465b and the wiring layer 468 are formed using a titanium film having a thickness of 150 nm by a sputtering method. Since an example where the source or drain electrode layers 465a1 and 465a2 and the source or drain electrode layer 465b are both formed using a titanium film is described in this embodiment, the etching selectivity of the source or drain electrode layer 465b with respect to the source or drain electrode layers 465a1 and 465a2 is not high. Therefore, the wiring layer 468 is provided over a part of the source or drain electrode layer 465a2, which is not covered with the oxide semiconductor layer 462, in order that the source or drain electrode layers 465a1 and 465a2 are not etched at the time of etching for forming the source or drain electrode layer 465b. In the case where the source or drain electrode layers 465a1 and 465a2 and the source or drain electrode layer 465b are formed using different materials between which etching selectivity is high in the etching step, the wiring layer 468 which protects the source or drain electrode layer 465a2 at the time of etching need not necessarily be formed.

Note that each material and etching conditions are adjusted as appropriate so that the oxide semiconductor layer 462 is not removed by etching of the conductive film.

In this embodiment, a Ti film is used as the conductive film, an In—Ga—Zn—O-based oxide semiconductor is used as the oxide semiconductor layer 462, and an ammonia hydrogen peroxide solution (a mixture of ammonia, water, and a hydrogen peroxide solution) is used as an etchant.

Note that in the third photolithography step, the oxide semiconductor layer 462 may be partly etched in some cases, so that an oxide semiconductor layer having a groove (a depression portion) is formed. A resist mask for forming the source or drain electrode layer 465b and the wiring layer 468 may be formed by an ink-jet method. When the resist mask is formed by an ink-jet method, a photomask is not used; thus, the manufacturing cost can be reduced.

Next, the gate insulating layer 452 is formed over the insulating layer 457, the oxide semiconductor layer 462, the source or drain electrode layers 465a1 and 465a2, and the source or drain electrode layer 465b.

The gate insulating layer 452 can be formed to have a single-layer structure or a stacked structure of a silicon oxide layer, a silicon nitride layer, a silicon oxynitride layer, a silicon nitride oxide layer, or an aluminum oxide layer by a plasma CVD method, a sputtering method, or the like. In order to prevent the gate insulating layer 452 from containing a large amount of hydrogen, the gate insulating layer 452 is preferably formed by a sputtering method. In the case of forming a silicon oxide film by a sputtering method, a silicon target or a quartz target is used as a target, and oxygen or a mixed gas of oxygen and argon is used as a sputtering gas.

The gate insulating layer 452 can have a structure in which a silicon oxide layer and a silicon nitride layer are stacked from the source or drain electrode layers 465a1 and 465a2 and source or drain electrode layer 465b side. In this embodiment, a silicon oxide layer having a thickness of 100 nm is formed by an RF sputtering method under a pressure of 0.4 Pa, a high-frequency power of 1.5 kW, and an atmosphere of oxygen and argon (the flow ratio of an oxygen flow rate of 25 sccm to an argon flow rate of 25 sccm=1:1).

Figure 6D:
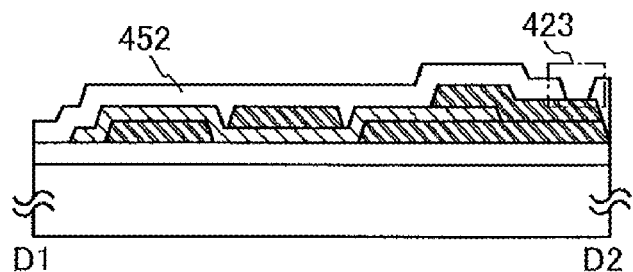

Next in a fourth photolithography step, a resist mask is formed, and selective etching is performed to remove part of the gate insulating layer 452, so that an opening 423 which reaches the wiring layer 468 is formed (see FIG. 6D). Although not illustrated, an opening reaching the source or drain electrode layer 465b may be formed at the time of forming the opening 423. In this embodiment, after an interlayer insulating layer is further stacked, the opening reaching the source or drain electrode layer 465b is formed, and then a wiring layer for electric connection is formed in the opening.

Then, a conductive film is formed over the gate insulating layer 452 and the opening 423, and the gate electrode layer 461 (461a, 461b) and the wiring layer 464 are formed by a fifth photolithography step. Note that a resist mask may be formed by an ink jet method. When the resist mask is formed by an ink-jet method, a photomask is not used; thus, the manufacturing cost can be reduced.

The gate electrode layer 461 (461a, 461b) and the wiring layer 464 can be formed to have a single-layer structure or a stacked structure using a metal material such as molybdenum, titanium, chromium, tantalum, tungsten, aluminum, copper, neodymium, or scandium or an alloy material which contains any of these materials as its main component.

In this embodiment, the gate electrode layer 461 (461a, 461b) and the wiring layer 464 are formed using a titanium film having a thickness of 150 nm by a sputtering method.

Next, second heat treatment (preferably at 200° C. to 400° C., for example at 250° C. to 350° C.) is performed in an inert gas atmosphere or an oxygen gas atmosphere. In this embodiment, the second heat treatment is performed at 250° C. in a nitrogen atmosphere for one hour. The second heat treatment may be performed after a protective insulating layer or a planarization insulating layer is formed over the thin film transistor 410.

Furthermore, heat treatment may be performed at 100° C. to 200° C. inclusive for one hour to 30 hours in the air. This heat treatment may be performed at a fixed heating temperature. Alternatively, the following change in the heating temperature may be conducted plural times repeatedly: the heating temperature is increased from room temperature to a temperature of 100° C. to 200° C. and then decreased to room temperature. This heat treatment may be performed under a reduced pressure. Under a reduced pressure, the heat treatment time can be shortened.

Figure 6E:
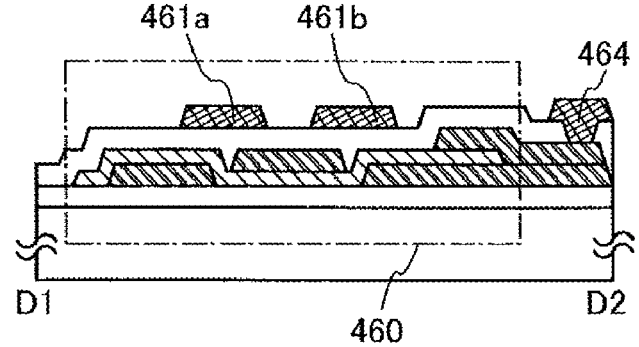

Through the above-described process, the thin film transistor 460 including the oxide semiconductor layer 462 in which the concentration of hydrogen, moisture, hydride, or hydroxide is reduced can be formed (see FIG. 6E).

A protective insulating layer or a planarization insulating layer for planarization may be provided over the thin film transistor 460. Although not illustrated, an opening reaching the source or drain electrode layer 465*b* is formed in the gate insulating layer 452 and the protective insulating layer or the planarization insulating layer, and a wiring layer electrically connected to the source or drain electrode layer 465*b* is formed in the opening.

When the oxide semiconductor film is formed, residual moisture in a reaction atmosphere is removed in the above-described manner; thus, the concentration of hydrogen and hydride in the oxide semiconductor film can be reduced. Thus, the oxide semiconductor film can be stabilized.

When the above-described thin film transistor is used in the analog circuit described in Embodiment 1, the analog circuit can have stable electric characteristics and high reliability.

This embodiment can be implemented in appropriate combination with any of the other embodiments.

Embodiment 5

In this embodiment, an example of a thin film transistor included in the analog circuit described in Embodiment 1 will be described. Note that as for portions that are the same as those in the other embodiments and portions and steps that are similar to those in the other embodiments, descriptions of the other embodiments can be referred to, and descriptions thereof are not repeated. In addition, detailed description of the same parts is omitted.

Thin film transistors of this embodiment will be described with reference to FIGS. 7A and 7B.

Figure 7A:
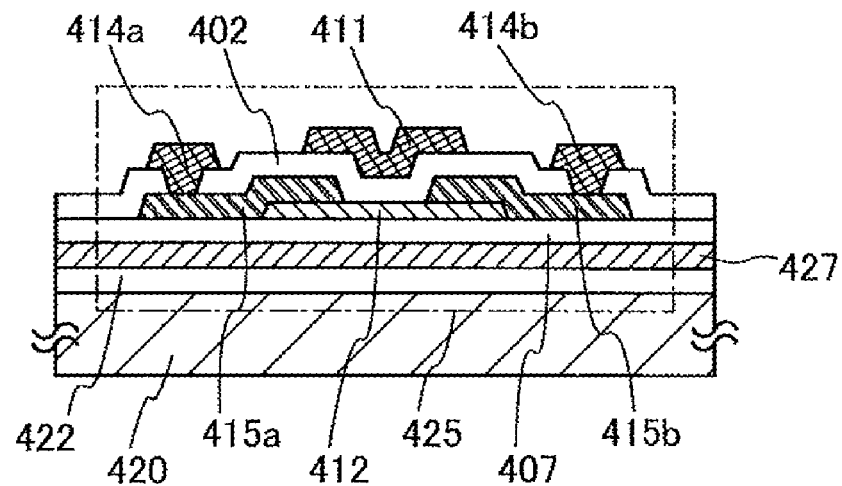
FIGS. 7A and 7B each show a cross-sectional structure of a semiconductor device.
Figure 7B:
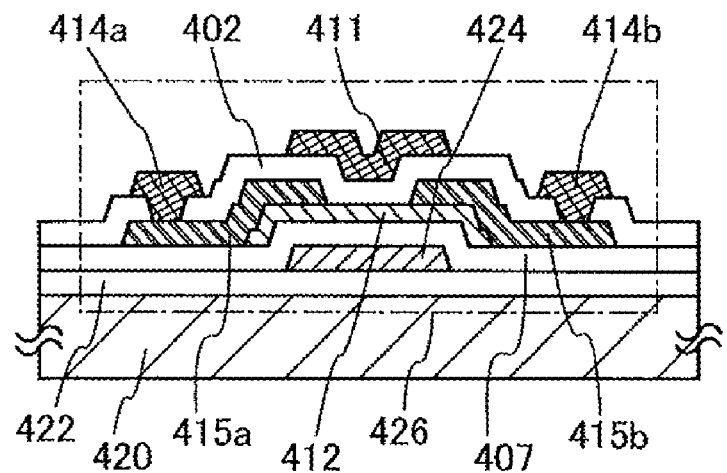

FIGS. 7A and 7B illustrate examples of cross-sectional structures of the thin film transistors. Each of a thin film transistors 425 and a thin film transistor 426 illustrated in FIGS. 7A and 7B is a thin film transistor with a structure in which an oxide semiconductor layer is interposed between a conductive layer and a gate electrode layer.

In FIGS. 7A and 7B, a silicon substrate is used as a substrate, and the thin film transistor 425 and the thin film transistor 426 are each provided over an insulating layer 422 provided over a silicon substrate 420.

In FIG. 7A, a conductive layer 427 is provided between the insulating layer 422 provided over the silicon substrate 420 and an insulating layer 407 so as to overlap with at least the entire oxide semiconductor layer 412.

Note that FIG. 7B illustrates an example in which a conductive layer between the insulating layer 422 and the insulating layer 407 is processed into a conductive layer 424 by etching and overlaps with part of the oxide semiconductor layer 412, which includes at least a channel region.

The conductive layer 427 and the conductive layer 424 may be formed of a metal material which can withstand the temperature of heat treatment performed later; as such a metal material, an element selected from titanium (Ti), tantalum (Ta), tungsten (W), molybdenum (Mo), chromium (Cr), neodymium (Nd), and scandium (Sc), an alloy containing any of the above elements as a component, an alloy film containing a combination of any of these elements, a nitride containing any of the above elements as its component, or the like can be used. In addition, the conductive layers 427 and 424 may each have a single-layer structure or a stacked structure. For example, a single-layer structure of a tungsten layer, a stacked structure including a tungsten nitride layer and a tungsten layer, or the like can be used.

Further, the potential of the conductive layers 427 and 424 may be the same as or different from that of a gate electrode layer 411 of the thin film transistors 425 and 426. The conductive layers 427 and 424 can also function as a second gate electrode layer. In addition, the potential of the conductive layers 427 and 424 may be fixed potential such as GND or 0 V or may be in an electrically floating state without being connected to anything.

The conductive layers 427 and 424 make it possible to control electric characteristics of the thin film transistors 425 and 426, respectively.

This embodiment can be implemented in combination with any of the other embodiments as appropriate.

Here, a thin film transistor of an embodiment of the present invention in which an oxide semiconductor is used is described with reference to energy band diagrams.

Figure 22:
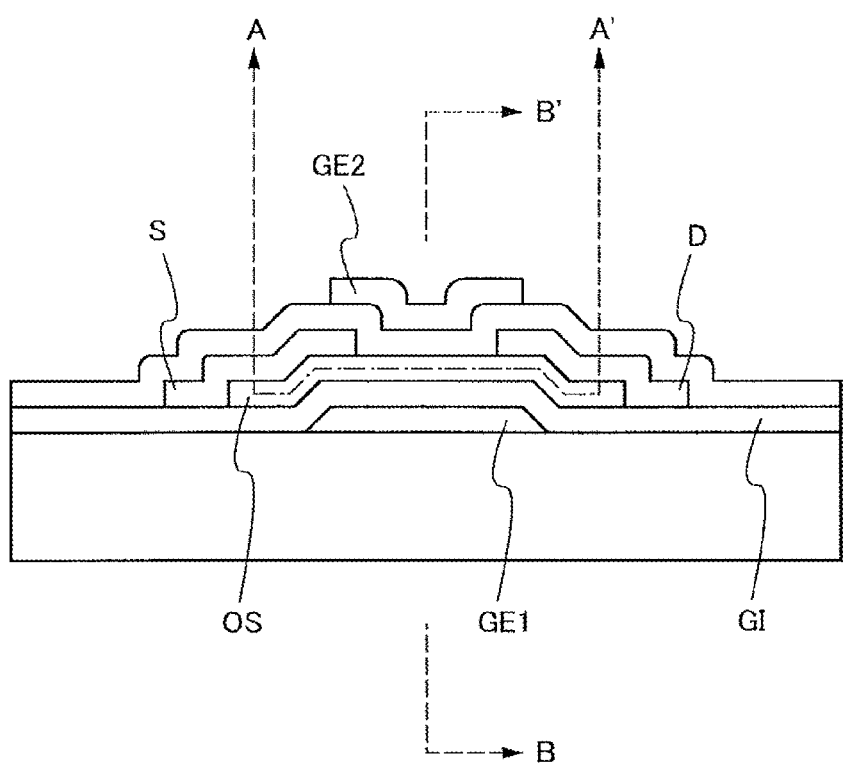
FIG. 22 is a longitudinal section view of an inverted staggered thin film transistor in which an oxide semiconductor is used.

FIG. 22 is a longitudinal section view of an inverted staggered thin film transistor in which an oxide semiconductor is used. An oxide semiconductor layer (OS) is provided over a gate electrode (GEI) with a gate insulating film (GI) interposed therebetween, and a source electrode (S) and a drain electrode (D) are provided thereover.

Figure 23A:
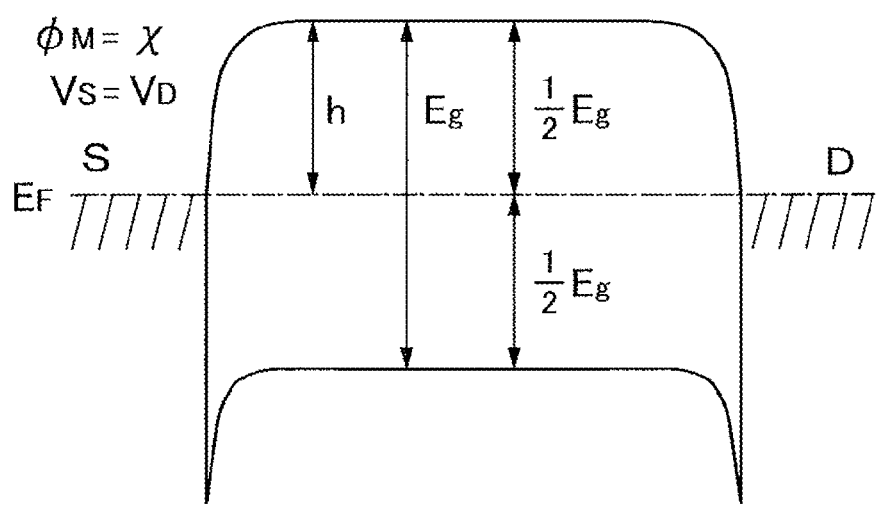
FIGS. 23A and 23B are energy band diagrams (schematic diagrams) along the section A-A' of FIG. 22.
Figure 23B:
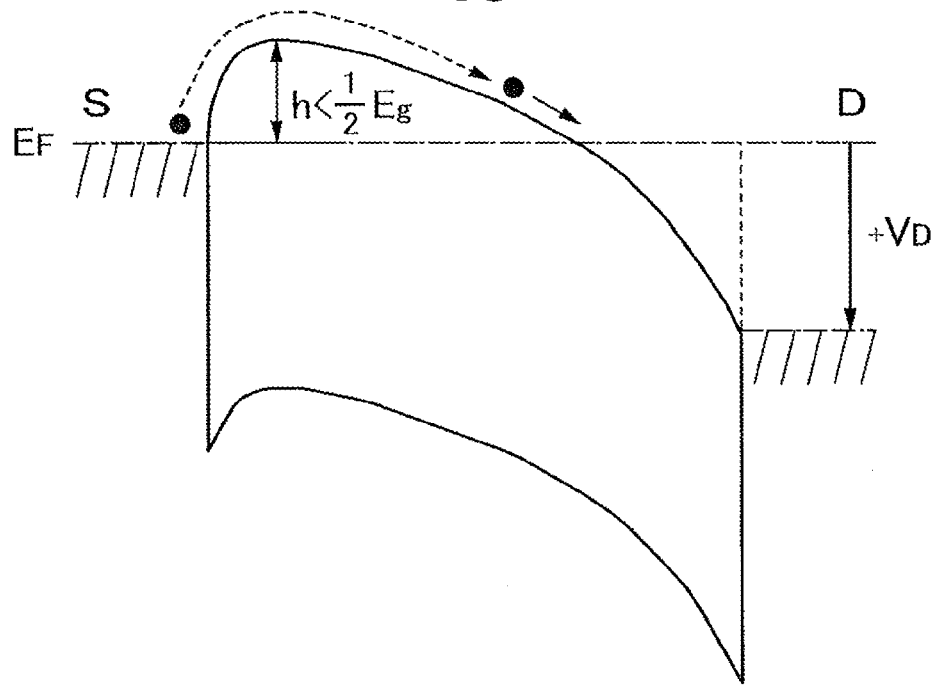

FIGS. 23A and 23B are energy band diagrams (schematic diagrams) along the section A-A' illustrated in FIG. 22. FIG. 23A illustrates the case where the voltage between the source and the drain is zero (VD=0 V, the potential of the source and the potential of the drain are the same), and FIG. 23B illustrates the case where a positive potential with respect to the source is applied to the drain (VD>0).

Figure 24A:
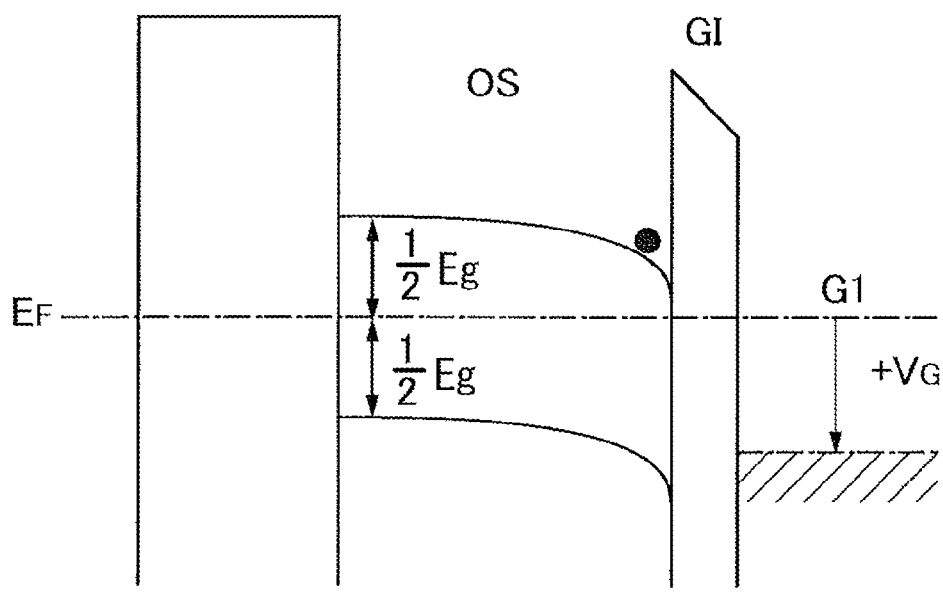
FIG. 24A shows a state in which a positive potential (+VG) is applied to a gate (G1)
Figure 24B:
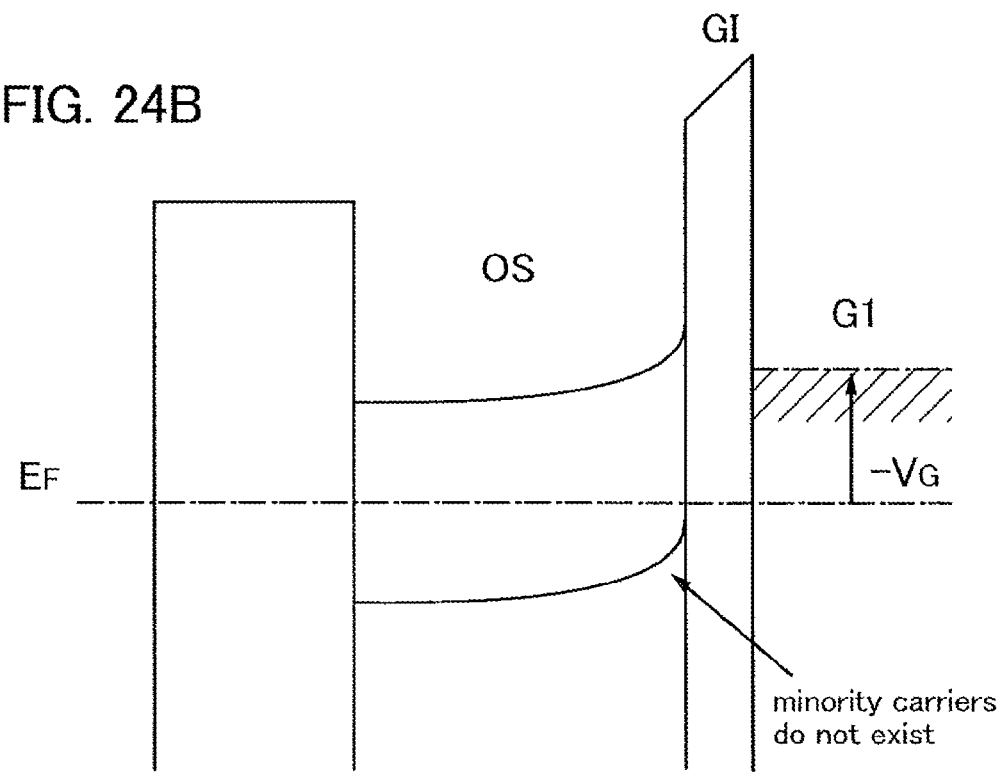
FIG. 24B shows a state in which a negative potential (−VG) is applied to the gate (G1)

FIGS. 24A and 24B are energy band diagrams (schematic diagrams) along the section B-B' illustrated in FIG. 22. FIG. 24A illustrates an on state in which a positive potential (+VG) is applied to the gate (G1) and carriers (electrons) flow between the source and the drain. FIG. 24B illustrates an off state in which a negative potential (−VG) is applied to the gate (G1) and minority carriers do not flow.

Figure 25:
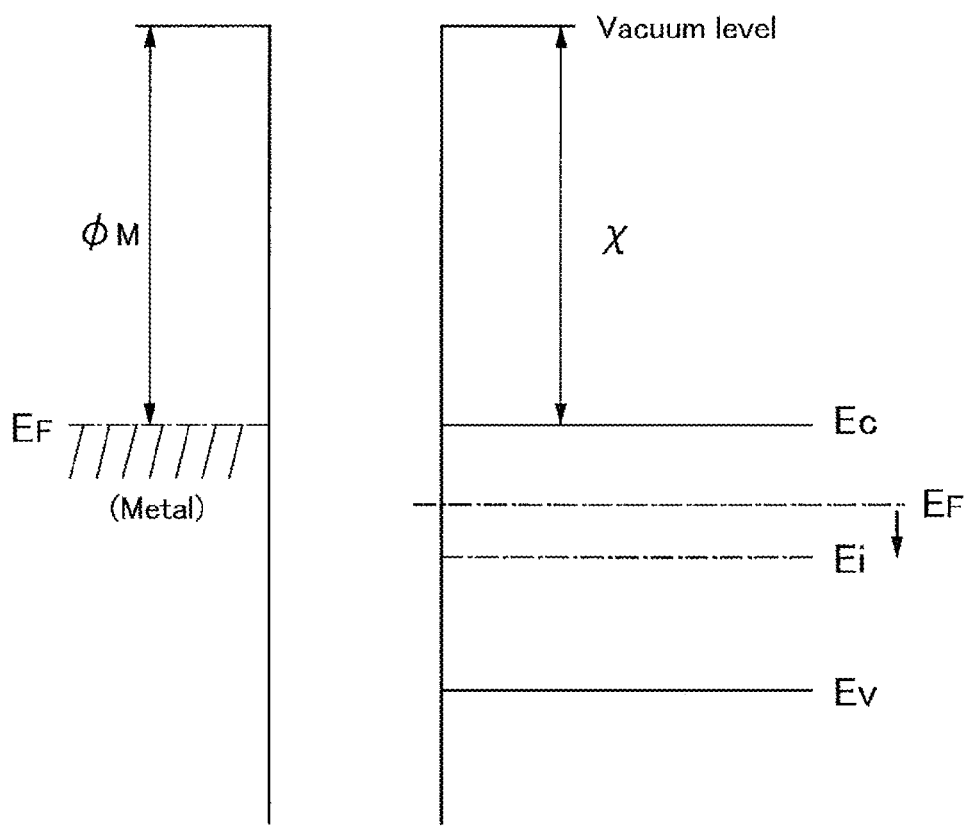
FIG. 25 shows a relation between the vacuum level and the work function of a metal (ϕM), and between the vacuum level and the electron affinity of an oxide semiconductor (χ).

FIG. 25 shows the relations between the vacuum level and the work function of a metal ($\phi M$) and between the vacuum level and the electron affinity ($\chi$) of an oxide semiconductor.

Because metal is degenerated, the Fermi level is located in the conduction band. On the other hand, a conventional oxide semiconductor is typically an n-type semiconductor, in which case the Fermi level (Ef) is away from the intrinsic Fermi level (Ei) located in the middle of a band gap and is located closer to the conduction band. Note that it is known that part of hydrogen is a donor in an oxide semiconductor and is one factor causing an oxide semiconductor to be an n-type semiconductor.

On the other hand, an oxide semiconductor of the present invention is an intrinsic (I-type) or a substantially intrinsic oxide semiconductor which is obtained by removing hydrogen that is an n-type impurity from an oxide semiconductor and purifying the oxide semiconductor so that an impurity other than main components of the oxide semiconductor is prevented from being contained therein as much as possible. In other words, a feature is that a purified I-type (intrinsic) semiconductor, or a semiconductor close thereto, is obtained not by adding an impurity but by removing an impurity such as hydrogen or water as much as possible. This enables the Fermi level (Ef) to be at the same level as the intrinsic Fermi level (Ei).

In the case where the band gap (Eg) of an oxide semiconductor is 3.15 eV, the electron affinity ($\chi$) is said to be 4.3 eV. The work function of titanium (Ti) included in the source electrode and the drain electrode is substantially equal to the electron affinity ($\chi$) of the oxide semiconductor. In that case, a Schottky barrier for electrons is not formed at an interface between the metal and the oxide semiconductor.

In other words, in the case where the work function of metal ($\phi M$) and the electron affinity ($\chi$) of the oxide semiconductor are equal to each other and the metal and the oxide semiconductor are in contact with each other, an energy band diagram (a schematic diagram) as illustrated in FIG. 23A is obtained.

In FIG. 23B, a black circle (●) represents an electron, and when a positive potential is applied to the drain, the electron is injected into the oxide semiconductor over the barrier (h) and flows toward the drain. In that case, the height of the barrier (h) changes depending on the gate voltage and the drain voltage; in the case where a positive drain voltage is applied, the height of the barrier (h) is smaller than the height of the barrier in FIG. 23A where no voltage is applied, i.e., ½ of the band gap (Eg).

In this case, as shown in FIG. 24A, the electron moves along the lowest region of the oxide semiconductor, which is energetically stable, at an interface between the gate insulating film and the purified oxide semiconductor.

In addition, in FIG. 24B, when a negative potential (reverse bias) is applied to the gate electrode (G1), the value of current is extremely close to zero because holes that are minority carriers are substantially zero.

For example, even when a thin film transistor has a channel width W of $1 \times 10^4$ μm and a channel length of 3 μm, the off-state current is $10^{-13}$ A or less and the subthreshold swing (S value) is 0.1 V/dec (the thickness of the gate insulating film: 100 nm).

As described above, the oxide semiconductor is purified so that the amount of impurities that are not main components of the oxide semiconductor are minimized, whereby favorable operation of the thin film transistor can be obtained.

Embodiment 6

In this embodiment, an example of a thin film transistor which is included in the analog circuit described in Embodiment 1 will be described.

An embodiment of the thin film transistor of this embodiment and a manufacturing method thereof will be described with reference to FIGS. 8A to 8E.

Figure 8A:
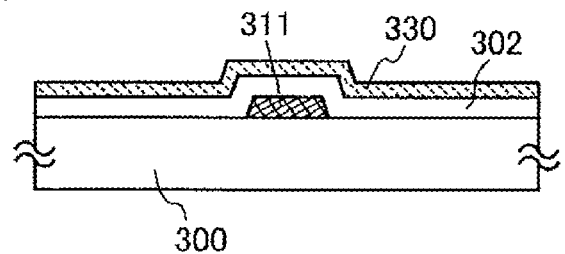
FIGS. 8A to 8E show a manufacturing process of a semiconductor device.
Figure 8B:
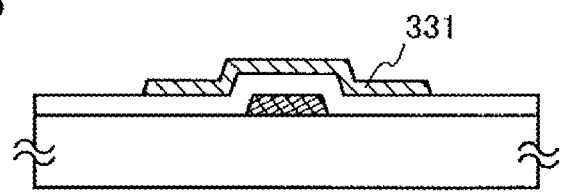
Figure 8C:
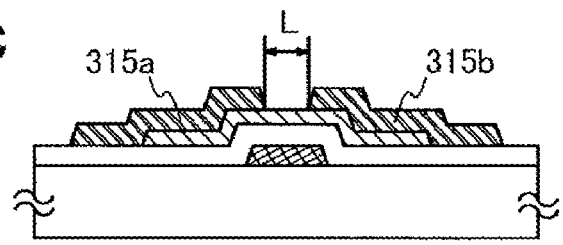
Figure 8D:
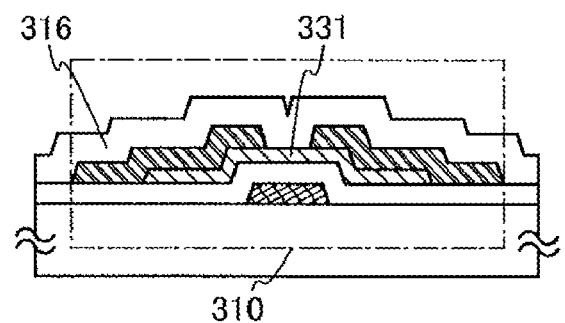
Figure 8E:
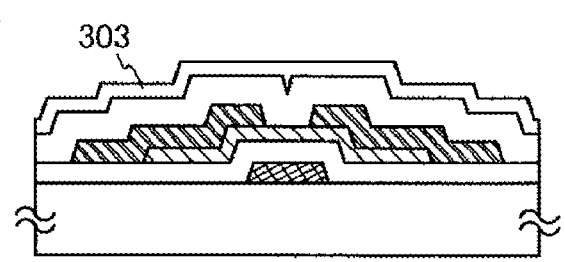

A thin film transistor 310 illustrated in FIG. 8D is a thin film transistor having a bottom-gate structure and is also called an inverted staggered thin film transistor.

Although the thin film transistor 310 is described as a single-gate thin film transistor, a multi-gate thin film transistor including a plurality of channel regions can be formed when needed.

A process for manufacturing the thin film transistor 310 over a substrate 300 will be described below with reference to FIGS. 8A to 8E.

First, a conductive film is formed over the substrate 300 having an insulating surface, and a first photolithography step is performed thereon, so that a gate electrode layer 311 is formed. It is preferable that an end portion of the formed gate electrode layer have a tapered shape to improve coverage with a gate insulating layer stacked thereover. Note that a resist mask may be formed by an ink-jet method. When the resist mask is formed by an ink-jet method, a photomask is not used; thus, the manufacturing cost can be reduced.

Although there is no particular limitation on a substrate which can be used as the substrate 300 having an insulating surface, the substrate needs to have at least heat resistance high enough to withstand heat treatment to be performed later. As the substrate 300 having an insulating surface, a glass substrate formed of barium borosilicate glass, aluminoborosilicate glass, or the like can be used.

In the case where a glass substrate is used and the temperature of the heat treatment to be performed later is high, a glass substrate whose strain point is greater than or equal to 730° C. is preferably used. As the glass substrate, a substrate of a glass material such as aluminosilicate glass, aluminoborosilicate glass, or barium borosilicate glass is used, for example. Note that by containing a larger amount of barium oxide (BaO) than boron oxide ($B_2O_3$), a glass substrate that is heat-resistant and of more practical use can be obtained. Therefore, a glass substrate containing BaO and $B_2O_3$ so that the amount of BaO is larger than that of $B_2O_3$ is preferably used.

Note that a substrate formed of an insulator such as a ceramic substrate, a quartz substrate, or a sapphire substrate may be used instead of the above glass substrate. Alternatively, crystallized glass or the like can be used.

Further, an insulating film serving as a base film may be provided between the substrate 300 and the gate electrode layer 311. The base film has a function of preventing diffusion of an impurity element from the substrate 300, and can be formed to have a single-layer structure or a stacked structure using one or more films selected from a silicon nitride film, a silicon oxide film, a silicon nitride oxide film, and a silicon oxynitride film.

The gate electrode layer 311 can be formed to have a single-layer structure or a stacked structure using a metal material such as molybdenum, titanium, chromium, tantalum, tungsten, aluminum, copper, neodymium, or scandium or an alloy material which contains any of these materials as its main component.

For example, as a two-layer structure of the gate electrode layer 311, any of the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, a two-layer structure of a titanium nitride layer and a molybdenum layer; and a two-layer structure of a tungsten nitride layer and a tungsten layer. As a three-layer structure, a stack of a tungsten layer or a tungsten nitride layer, a layer of an alloy of aluminum and silicon or an alloy of aluminum and titanium, and a titanium nitride layer or a titanium layer is preferable. Note that the gate electrode layer can also be formed using a light-transmitting conductive film. As a light-transmitting conductive film, a light-transmitting conductive oxide or the like can be given.

Next, a gate insulating layer 302 is formed over the gate electrode layer 311.

The gate insulating layer 302 can be formed to have a single-layer structure or a stacked structure of a silicon oxide layer, a silicon nitride layer, a silicon oxynitride layer, a silicon nitride oxide layer, or an aluminum oxide layer by a plasma CVD method, a sputtering method, or the like. For example, a silicon oxynitride layer may be formed by a plasma CVD method using $SiH_4$, oxygen, and nitrogen as a deposition gas. The thickness of the gate insulating layer 302 is greater than or equal to 100 nm and less than or equal to 500 nm; in the case where the gate insulating layer 302 is formed to have a stacked structure, for example, a first gate insulating layer with a thickness greater than or equal to 50 nm and less than or equal to 200 urn and a second gate insulating layer with a thickness greater than or equal to 5 nm and less than or equal to 300 nm are stacked.

In this embodiment, a silicon oxynitride layer having a thickness of 100 nm or less is formed by a plasma CVD method as the gate insulating layer 302.

Then, an oxide semiconductor film 330 is formed to a thickness of greater than or equal to 2 nm and less than or equal to 200 nm over the gate insulating layer 302.

As the oxide semiconductor film 330, any of the following is used: an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Sn—O-based oxide semiconductor film, an In—Zn—O-based oxide semiconductor film, a Sn—Zn—O-based oxide semiconductor film, an Al—Zn—O-based oxide semiconductor film, an In—Ga—O-based oxide semiconductor film, an In—O-based oxide semiconductor film, a Sn—O-based oxide semiconductor film, and a Zn—O-based oxide semiconductor film. In this embodiment, the oxide semiconductor film 330 is formed by a sputtering method with use of an In—Ga—Zn—O-based metal oxide target. A cross-sectional view at this stage is illustrated in FIG. 8A. The oxide semiconductor film 330 can be formed by a sputtering method in a rare gas (typically, argon) atmosphere, an oxygen atmosphere, or a mixed atmosphere including a rare gas (typically, argon) and oxygen. In the case of using a sputtering method, a film may be formed using a target including silicon oxide ($SiO_x$ (x>0)) at 2 wt % to 10 wt % inclusive.

As a target for forming the oxide semiconductor film by a sputtering method, a metal oxide target containing zinc oxide as its main component can be used. As another example of the metal oxide target, a metal oxide target including In, Ga, and Zn ($In_2O_3$:$Ga_2O_3$:ZnO=1:1:1 in a molar ratio, In:Ga:Zn=1:1:0.5 in an atomic ratio) can be used. As the metal oxide target including In, Ga, and Zn, any of targets having the following composition can also be used: In:Ga:Zn=1:1:1 or 1:1:2 in an atomic ratio. The filling rate of the metal oxide target is higher than or equal to 90% and lower than or equal to 100%, and preferably higher than or equal to 95% and lower than or equal to 99.9%. The use of the metal oxide target having a high filling rate makes it possible to form a dense oxide semiconductor film.

As a sputtering gas used in formation of the oxide semiconductor film 330, a high-purity gas in which the concentration of an impurity such as hydrogen, water, hydroxyl, or hydride is reduced to approximately the ppm level or the ppb level is preferably used.

The substrate is held inside a treatment chamber which is kept in a reduced pressure state, and the substrate temperature is set to be higher than or equal to 100° C. and lower than or equal to 600° C., preferably higher than or equal to 200° C. and lower than or equal to 400° C. By heating the substrate during deposition, the impurity concentration of the oxide semiconductor film formed can be reduced. In addition, damage by sputtering can be reduced. A sputtering gas from which hydrogen and moisture have been removed is introduced while residual moisture in the treatment chamber is removed, and a metal oxide is used as a target. Thus, the oxide semiconductor film 330 is formed over the substrate 300. In order to remove residual moisture from the treatment chamber, an adsorption-type vacuum pump is preferably used. For example, a cryopump, an ion pump, or a titanium sublimation pump is preferably used. As an exhaustion unit, a turbo pump to which a cold trap is added may be used. From the chamber in which exhaustion is performed with the use of a cryopump, a hydrogen atom, a compound including a hydrogen atom such as water ($H_2O$) (preferably, a compound including a carbon atom as well), or the like, for example, is exhausted. Accordingly, the concentration of an impurity included in the oxide semiconductor film formed in the film formation chamber can be reduced.

As an example of film formation conditions, the following conditions are employed: the distance between the substrate and the target is 100 mm, the pressure is 0.6 Pa, the direct-current (DC) power is 0.5 kW, and an oxygen atmosphere (the proportion of the oxygen flow is 100%) is used. A pulse direct current (DC) power supply is preferable because powder substances (also referred to as particles or dust) generated in the film formation can be reduced and the film thickness can be made uniform. The oxide semiconductor film preferably has a thickness greater than or equal to 2 nm and less than or equal to 200 nm and preferably has a thickness greater than or equal to 5 nm and less than or equal to 30 nm. Note that appropriate thickness of the oxide semiconductor film varies depending on the material; therefore, the thickness may be determined as appropriate depending on the material.

Next, the oxide semiconductor film 330 is processed into an island-shaped oxide semiconductor layer in a second photolithography step. A resist mask for forming the island-shaped oxide semiconductor layer may be formed using an ink-jet method. When the resist mask is formed by an ink-jet method, a photomask is not used; thus, the manufacturing cost can be reduced.

Next in this embodiment, first heat treatment is performed on the oxide semiconductor layer. Dehydration or dehydrogenation of the oxide semiconductor layer can be performed through the first heat treatment. The temperature of the first heat treatment is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 331 is obtained (see FIG. 8B).

The heat treatment apparatus is not limited to the electric furnace and may be the one provided with a device for heating a process object using heat conduction or heat radiation from a heating element such as a resistance heating element. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which does not react with a process object by heat treatment, such as nitrogen or a rare gas such as argon is used.

For example, as the first heat treatment, GRTA may be performed in the following manner. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment in a short time.

Note that in the first heat treatment, it is preferable that water, hydrogen, and the like be not contained in nitrogen or a rare gas such as helium, neon, or argon. Alternatively, it is preferable that nitrogen or a rare gas such as helium, neon, or argon introduced into a heat treatment apparatus have a purity of 6N (99.9999%) or more, preferably, 7N (99.99999%) or more (that is, the impurity concentration is set to 1 ppm or lower, preferably, 0.1 ppm or lower).

Further, the oxide semiconductor layer may be crystallized to be a microcrystalline layer or a polycrystalline layer depending on the condition of the first heat treatment or a material of the oxide semiconductor layer. For example, the oxide semiconductor layer may be crystallized to be a microcrystalline oxide semiconductor layer having a degree of crystallization of 90% or more, or 80% or more. The oxide semiconductor layer may become an amorphous oxide semiconductor layer containing no crystalline component depending on the condition of the first heat treatment or a material of the oxide semiconductor layer. The oxide semiconductor layer may become an oxide semiconductor layer in which a microcrystalline portion (with a grain diameter greater than or equal to 1 nm and less than or equal to 20 nm, typically greater than or equal to 2 nm and less than or equal to 4 nm) is mixed into an amorphous oxide semi conductor.

The first heat treatment may be performed on the oxide semiconductor film 330 before being processed into the island-shaped oxide semiconductor layer, instead of on the island-shaped oxide semiconductor layer. In that case, after the first heat treatment, the substrate is taken out of the heating apparatus and a photolithography step is performed.

The heat treatment having an effect of dehydrating or dehydrogenating the oxide semiconductor layer may be performed at any of the following timings: after the oxide semiconductor layer is formed; after a source electrode and a drain electrode are formed over the oxide semiconductor layer; and after a protective insulating film is formed over the source electrode and the drain electrode.

Further, in the case where a contact hole is formed in the gate insulating layer 302, the formation of the contact hole may be performed before or after the dehydration or dehydrogenation treatment of the oxide semiconductor film 330.

Note that the etching of the oxide semiconductor film may be dry etching, without limitation to wet etching.

The etching conditions (such as an etchant, etching time, and temperature) are appropriately adjusted depending on the material so that the material can be etched into a desired shape.

Next, a conductive film is formed over the gate insulating layer 302 and the oxide semiconductor layer 331. The conductive film may be formed by a sputtering method or a vacuum evaporation method. As a material of the conductive film, an element selected from Al, Cr, Cu, Ta, Ti, Mo, and W; an alloy containing any of the above elements as its component; an alloy film containing these elements in combination; and the like can be given. Alternatively, one or more materials selected from manganese, magnesium, zirconium, beryllium, and thorium may be used. The conductive film may have a single-layer structure or a stacked structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum and one or a plurality of elements selected from titanium, tantalum, tungsten, molybdenum, chromium, neodymium, and scandium may be used.

In the case where heat treatment is performed after formation of the conductive film, the conductive film preferably has heat resistance enough to withstand the heat treatment.

A resist mask is formed over the conductive film by a third photolithography step. Selective etching is performed, so that a source electrode layer 315*a* and a drain electrode layer 315*b* are formed. Then, the resist mask is removed (see FIG. 8C).

For light exposure at the formation of the resist mask in the third photolithography step, ultraviolet rays, KrF laser light, or ArF laser light is used. The channel length L of the thin film transistor to be completed later is determined by the distance between a lower end portion of the source electrode layer 315*a* and a lower end portion of the drain electrode layer 315*b*, which are adjacent to each other over the oxide semiconductor layer 331. In the case where the channel length L is shorter than 25 nm and light exposure for forming the resist mask in the third photolithography step is performed, extreme ultraviolet rays having a wavelength as extremely short as several nanometers to several tens of nanometers are used. Light exposure using extreme ultraviolet rays has high resolution and large depth of focus. Therefore, the channel length L of the thin film transistor to be completed later can be set at larger than or equal to 10 nm and less than or equal to 100 nm, whereby circuit operation speed is increased. In addition, since the off-state current is extremely low, lower power consumption can be achieved.

Note that each material and etching conditions are adjusted as appropriate so that the oxide semiconductor layer 331 is not removed by etching of the conductive film.

In this embodiment, a Ti film is used as the conductive film, an In—Ga—Zn—O-based oxide semiconductor is used as the oxide semiconductor layer 331, and an ammonia hydrogen peroxide solution (a mixture of ammonia, water, and a hydrogen peroxide solution) is used as an etchant.

Note that in the third photolithography step, the oxide semiconductor layer 331 may be partly etched in some cases, so that an oxide semiconductor layer having a groove (a depression portion) is formed. A resist mask for forming the source electrode layer 315*a* and the drain electrode layer 315*b* may be formed by an ink-jet method. When the resist mask is formed by an ink-jet method, a photomask is not used; thus, the manufacturing cost can be reduced.

Further, an oxide conductive layer may be formed between the oxide semiconductor layer 331 and the source and drain electrode layers 315*a* and 315*b*. The oxide semiconductor layer 331 and a metal layer for forming the source electrode layer 315*a* and the drain electrode layer 315*b* can be formed in succession. The oxide conductive layer can function as a source region and a drain region.

When the oxide conductive layer is provided as a source region and a drain region between the oxide semiconductor layer and the source and drain electrode layers, the source region and the drain region can have lower resistance and the transistor can operate at high speed.

In order to reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed by using one multi-tone mask. Thus, the number of light-exposure masks can be reduced and the number of corresponding photolithography steps can also be reduced, whereby simplification of a process can be realized.

Then, plasma treatment using a gas such as $N_2O$, $N_2$, or Ar is performed. This plasma treatment removes water or the like adsorbed on a surface of the oxide semiconductor layer which is exposed. In addition, plasma treatment may be performed using a mixed gas of oxygen and argon.

After the plasma treatment, the oxide insulating layer 316 serving as a protective insulating film and is in contact with part of the oxide semiconductor layer is formed without exposure to the air.

The oxide insulating layer 316 can be formed to a thickness of at least 1 nm by a method by which an impurity such as water or hydrogen does not enter the oxide insulating layer 316, such as a sputtering method, as appropriate. When hydrogen is contained in the oxide insulating layer 316, entry of the hydrogen to the oxide semiconductor layer or extraction of oxygen in the oxide semiconductor layer by the hydrogen is caused, thereby making the resistance of the backchannel of the oxide semiconductor layer low (to have an n-type conductivity), so that a parasitic channel might be formed. Therefore, it is important that a formation method in which hydrogen is not used is employed so that the oxide insulating layer 316 contains as little hydrogen as possible.

In this embodiment, a 200-nm-thick silicon oxide film is formed as the oxide insulating layer 316 by a sputtering method. The substrate temperature in film formation may be higher than or equal to room temperature and lower than or equal to 300° C. and in this embodiment, is 100° C. The formation of the silicon oxide film by a sputtering method can be performed in a rare gas (typically argon) atmosphere, an oxygen atmosphere, or an atmosphere of a rare gas (typically argon) and oxygen. As a target, a silicon oxide target or a silicon target may be used. For example, with the use of a silicon target, silicon oxide can be formed by a sputtering method under an atmosphere of oxygen and nitrogen. As the oxide insulating layer 316 which is formed in contact with the oxide semiconductor layer 331, an inorganic insulating film which does not include impurities such as moisture, a hydrogen ion, or Off and blocks entry of these from the outside is used. Typically, a silicon oxide film, a silicon oxynitride film, an aluminum oxide film, an aluminum oxynitride film, or the like is used.

In this case, the oxide insulating layer 316 is preferably formed while residual moisture in the treatment chamber is removed, in order to prevent hydrogen, hydroxyl, or moisture from being included in the oxide semiconductor layer 331 and the oxide insulating layer 316.

In order to remove residual moisture from the treatment chamber, an adsorption-type vacuum pump is preferably used. For example, a cryopump, an ion pump, or a titanium sublimation pump is preferably used. As an exhaustion unit, a turbo pump to which a cold trap is added may be used. From the chamber in which exhaustion is performed with the use of a cryopump, a hydrogen atom, a compound including a hydrogen atom such as water ($H_2O$), or the like, for example, is exhausted. Accordingly, the concentration of an impurity included in the oxide insulating layer 316 formed in the film formation chamber can be reduced.

As a sputtering gas used in formation of the oxide insulating layer 316, a high-purity gas in which the concentration of an impurity such as hydrogen, water, hydroxyl, or hydride is reduced to approximately the ppm level or the ppb level is preferably used.

Next, second heat treatment (preferably at 200° C. to 400° C., for example at 250° C. to 350° C.) is performed in an inert gas atmosphere or an oxygen gas atmosphere. For example, the second heat treatment is performed at 250° C. in a nitrogen atmosphere for one hour. In the second heat treatment, part of the oxide semiconductor layer (the channel region) is heated in the state of being in contact with the oxide insulating layer 316. In the case where heat treatment is performed in the state that the oxide semiconductor layer 331 and the oxide insulating layer 316 are in contact with each other, oxygen, which is one of major components of the oxide semiconductor and is reduced at the time of the first heat treatment, can be supplied from the oxide insulating layer 316 to the oxide semiconductor layer 331. Thus, the oxide semiconductor is purified to become I-type (intrinsic).

Through the above-described process, the thin film transistor 310 including the i-type oxide semiconductor layer 331 in which the concentration of hydrogen, moisture, hydride, or hydroxide is reduced by dehydration or dehydrogenation can be formed (see FIG. 8D).

Furthermore, heat treatment may be performed at 100° C. to 200° C. inclusive for one hour to 30 hours in the air. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100° C. to 200° C. and then decreased to room temperature. This heat treatment may be performed before the formation of the oxide insulating layer under a reduced pressure. Under a reduced pressure, the heat treatment time can be shortened. With this heat treatment, a normally-off thin film transistor can be obtained.

A protective insulating layer 303 may be additionally Ruined over the oxide insulating layer 316. For example, a silicon nitride film is formed by an RE sputtering method. Since an RF sputtering method has high productivity, it is preferably used as a film formation method of the protective insulating layer. As the protective insulating layer, an inorganic insulating film which does not include impurities such as moisture, a hydrogen ion, and $OH^-$ and blocks entry of these from the outside is used. Typically, a silicon nitride film, an aluminum nitride film, a silicon nitride oxide film, an aluminum nitride oxide film, or the like is used (see FIG. 8E).

In this embodiment, a silicon nitride film is formed as the protective insulating layer 303 in such a manner that the substrate 300 over which layers up to the oxide insulating layer 316 are formed is heated to a temperature of 100° C. to 400° C., a sputtering gas which contains high-purity nitrogen and from which hydrogen and moisture have been removed is used, and a silicon target is used. Also in this case, it is preferable that the protective insulating layer 303 be formed while residual moisture in the treatment chamber is removed, in a manner similar to that of the oxide insulating layer 316.

A planarization insulating layer for planarization may be provided over the protective insulating layer 303.

When the above-described thin film transistor is used in the analog circuit described in Embodiment 1, the analog circuit can have stable electric characteristics and high reliability.

This embodiment can be implemented in appropriate combination with any of the other embodiments.

Embodiment 7

In this embodiment, an example of a thin film transistor which is included in the analog circuit described in Embodiment 1 will be described.

An embodiment of the thin film transistor of this embodiment and a manufacturing method thereof will be described with reference to FIGS. 9A to 9D.

Figure 9A:
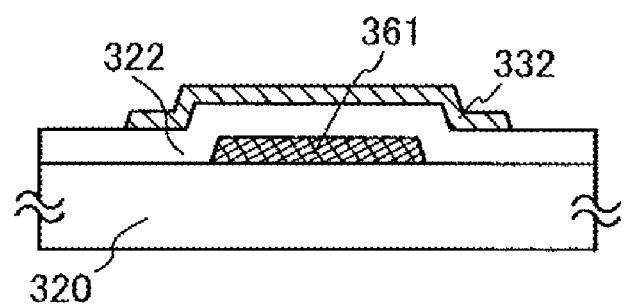
FIGS. 9A to 9D show a manufacturing process of a semiconductor device.
Figure 9B:
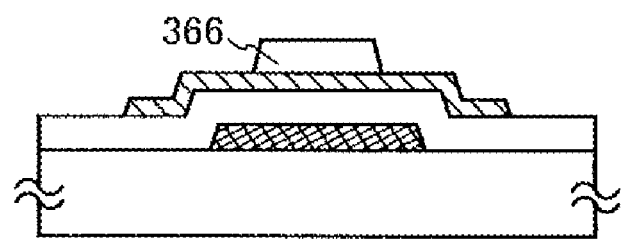
Figure 9C:
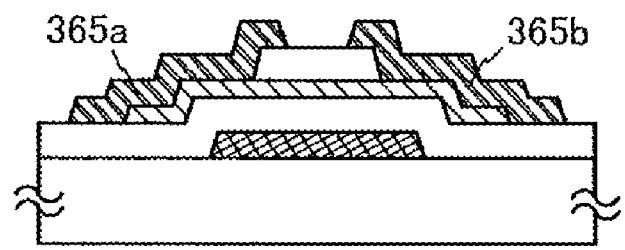
Figure 9D:
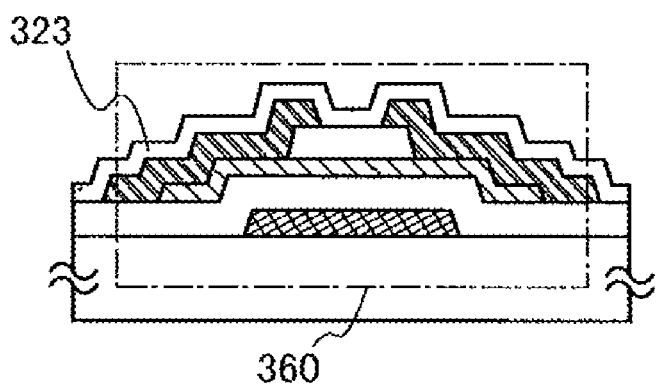

A thin film transistor 360 illustrated in FIG. 9D is a kind of bottom-gate thin film transistor called a channel-protective (channel-stop) thin film transistor and is also called an inverted staggered thin film transistor.

Although the thin film transistor 360 is described as a single-gate thin film transistor, a multi-gate thin film transistor including a plurality of channel regions can be formed when needed.

A process for manufacturing the thin film transistor 360 over a substrate 320 will be described below with reference to FIGS. 9A to 9D.

First, a conductive film is formed over the substrate 320 having an insulating surface, and a first photolithography step is performed thereon, so that a gate electrode layer 361 is formed. Note that a resist mask may be formed by an ink-jet method. When the resist mask is formed by an ink-jet method, a photomask is not used; thus, the manufacturing cost can be reduced.

The gate electrode layer 361 can be formed to have a single-layer structure or a stacked structure using a metal material such as molybdenum, titanium, chromium, tantalum, tungsten, aluminum, copper, neodymium, or scandium or an alloy material which contains any of these materials as its main component.

Next, a gate insulating layer 322 is formed over the gate electrode layer 361.

In this embodiment, a silicon oxynitride layer having a thickness of 100 nm or less is formed by a plasma CVD method as the gate insulating layer 322.

Then, an oxide semiconductor film is formed to a thickness of greater than or equal to 2 nm and less than or equal to 200 nm over the gate insulating layer 322, and the oxide semiconductor film is processed into an island-shaped oxide semiconductor layer 332 by a second photolithography step. In this embodiment, the oxide semiconductor film is formed by a sputtering method with use of an In—Ga—Zn—O-based metal oxide target.

In this case, the oxide semiconductor film is preferably formed while residual moisture in the treatment chamber is removed, in order to prevent hydrogen, hydroxyl, or moisture from being included in the oxide semiconductor film.

In order to remove residual moisture from the treatment chamber, an adsorption-type vacuum pump is preferably used. For example, a cryopump, an ion pump, or a titanium sublimation pump is preferably used. As an exhaustion unit, a turbo pump to which a cold trap is added may be used. From the chamber in which exhaustion is performed with the use of a cryopump, a hydrogen atom, a compound including a hydrogen atom such as water ($H_2O$), or the like, for example, is exhausted. Accordingly, the concentration of an impurity included in the oxide semiconductor film formed in the film formation chamber can be reduced.

As a sputtering gas used in formation of the oxide semiconductor film, a high-purity gas in which the concentration of an impurity such as hydrogen, water, hydroxyl, or hydride is reduced to approximately the ppm level or the ppb level is preferably used.

Next, dehydration or dehydrogenation of the oxide semiconductor layer 332 is performed. The temperature of first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer 332 in a nitrogen atmosphere at 450° C. for one hour, and then, the oxide semiconductor layer 332 is not exposed to the air so that entry of water and hydrogen into the oxide semiconductor layer 332 is prevented; thus, the dehydrated or dehydrogenated oxide semiconductor layer 332 is obtained (see FIG. 9A).

Then, plasma treatment using a gas such as $N_2O$, $N_2$, or Ar is performed. This plasma treatment removes water or the like adsorbed on a surface of the oxide semiconductor layer which is exposed. In addition, plasma treatment may be performed using a mixed gas of oxygen and argon.

Next, an oxide insulating layer is formed over the gate insulating layer 322 and the oxide semiconductor layer 332, and then a resist mask is formed by a third photolithography step. Selective etching is performed, so that an oxide insulating layer 366 functioning as a channel protective layer is formed. Then, the resist mask is removed. The oxide insulating layer 366 serving as a channel protective layer can prevent a portion of the oxide semiconductor layer 332, which serves as a channel formation region later, from being damaged in a later step (for example, reduction in thickness due to plasma or an etchant in etching).

In this embodiment, a 200-nm-thick silicon oxide film is formed as the oxide insulating layer 366 by a sputtering method. The substrate temperature in film formation may be higher than or equal to room temperature and lower than or equal to 300° C. and in this embodiment, is 100° C. The formation of the silicon oxide film by a sputtering method can be performed in a rare gas (typically argon) atmosphere, an oxygen atmosphere, or an atmosphere of a rare gas (typically argon) and oxygen. As a target, a silicon oxide target or a silicon target may be used. For example, with the use of a silicon target, silicon oxide can be formed by a sputtering method under an atmosphere of oxygen and nitrogen.

In this case, the oxide insulating layer 366 is preferably formed while residual moisture in the treatment chamber is removed, in order to prevent hydrogen, hydroxyl, or moisture from being included in the oxide semiconductor layer 332 and the oxide insulating layer 366.

In order to remove residual moisture from the treatment chamber, an adsorption-type vacuum pump is preferably used. For example, a cryopump, an ion pump, or a titanium sublimation pump is preferably used. As an exhaustion unit, a turbo pump to which a cold trap is added may be used. From the chamber in which exhaustion is performed with the use of a cryopump, a hydrogen atom, a compound including a hydrogen atom such as water ($H_2O$), or the like, for example, is exhausted. Accordingly, the concentration of an impurity included in the oxide insulating layer 366 formed in the film formation chamber can be reduced.

As a sputtering gas used in formation of the oxide insulating layer 366, a high-purity gas in which the concentration of an impurity such as hydrogen, water, hydroxyl, or hydride is reduced to approximately the ppm level or the ppb level is preferably used.

Next, second heat treatment (preferably at 200° C. to 400° C., for example at 250° C. to 350° C.) may be performed in an inert gas atmosphere or an oxygen gas atmosphere. For example, the second heat treatment is performed at 250° C. in a nitrogen atmosphere for one hour. In the second heat treatment, part of the oxide semiconductor layer (the channel region) is heated in the state of being in contact with the oxide insulating layer 366.

Next, a conductive film is formed over the gate insulating layer 322, the oxide semiconductor layer 332, and the oxide insulating layer 366, and then a resist mask is formed by a fourth photolithography step. Selective etching is performed, so that a source electrode layer 365a and a drain electrode layer 365b are formed. Then, the resist mask is removed (see FIG. 9C).

As a material of the source electrode layer 365a and the drain electrode layer 365b, an element selected from Al, Cr, Cu, Ta, Ti, Mo, and W; an alloy containing any of the above elements as its component; an alloy film containing these elements in combination; and the like can be given. The metal conductive film may have a single-layer structure or a stacked structure of two or more layers. The second heat treatment may be performed after the source electrode layer 365a and the drain electrode layer 365b are formed.

Through the above-described process, the thin film transistor 360 including the I-type oxide semiconductor layer 332 in which the concentration of hydrogen, moisture, hydride, or hydroxide is reduced by dehydration or dehydrogenation is formed.

Furthermore, heat treatment may be performed at 100° C. to 200 T inclusive for one hour to 30 hours in the air. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100° C. to 200° C. and then decreased to room temperature. This heat treatment may be performed before the formation of the oxide insulating layer under a reduced pressure. Under a reduced pressure, the heat treatment time can be shortened. With this heat treatment, a normally-off thin film transistor can be obtained.

Further, a protective insulating layer 323 may be formed over the source electrode layer 365a, the drain electrode layer 365b, and the oxide insulating layer 366. In this embodiment, the protective insulating layer 323 is formed using a silicon nitride film (see FIG. 9D).

Alternatively, an oxide insulating layer may be further formed over the source electrode layer 365a, the drain electrode layer 365b, and the oxide insulating layer 366, and then the protective insulating layer 323 may be stacked over the oxide insulating layer.

When the above-described thin film transistor is used in the analog circuit described in Embodiment 1, the analog circuit can have stable electric characteristics and high reliability.

This embodiment can be implemented in appropriate combination with any of the other embodiments.

Embodiment 8

In this embodiment, an example of a thin film transistor which is included in the analog circuit described in Embodiment 1 will be described.

An embodiment of the thin film transistor of this embodiment and a manufacturing method thereof will be described with reference to FIGS. 10A to 10D.

Although a thin film transistor 350 illustrated in FIG. 10D will be described as a single-gate thin film transistor, a multi-gate thin film transistor including a plurality of channel regions can be formed when needed.

A process for manufacturing the thin film transistor 350 over a substrate 340 will be described below with reference to FIGS. 10A to 10D.

First, a conductive film is formed over the substrate 340 having an insulating surface, and a first photolithography step is performed thereon, so that a gate electrode layer 351 is formed. In this embodiment, a tungsten film having a thickness of 150 nm is formed by a sputtering method as the gate electrode layer 351.

Next, a gate insulating layer 342 is formed over the gate electrode layer 351. In this embodiment, a silicon oxynitride layer having a thickness of 100 nm or less is formed by a plasma CVD method as the gate insulating layer 342.

Next, a conductive film is formed over the gate insulating layer 342. A resist mask is formed over the conductive film by a second photolithography step. Selective etching is performed, so that a source electrode layer 355a and a drain electrode layer 355b are formed. Then, the resist mask is removed (see FIG. 10A).

Figure 10A:
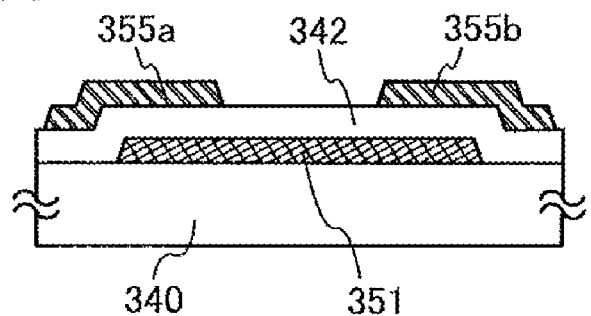
FIGS. 10A to 10D show a manufacturing process of a semiconductor device.
Figure 10B:
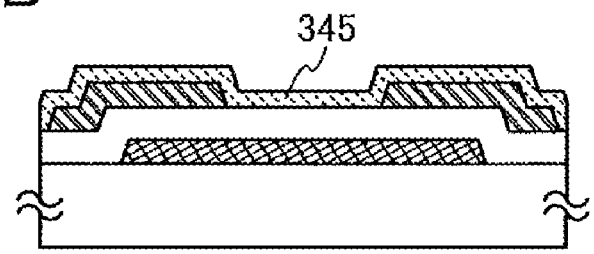
Figure 10C:
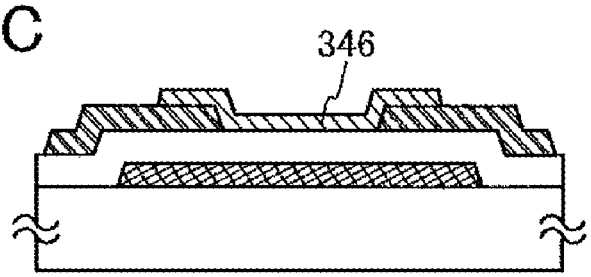
Figure 10D:
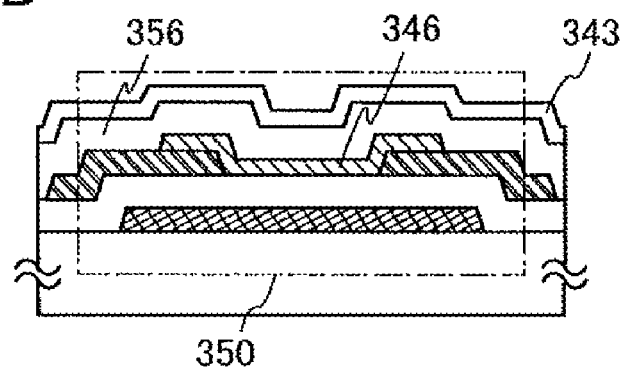

Next, an oxide semiconductor film 345 is formed (see FIG. 10B). In this embodiment, the oxide semiconductor film 345 is formed by a sputtering method with use of an In—Ga—Zn—O-based metal oxide target. The oxide semiconductor film 345 is processed into an island-shaped oxide semiconductor layer 346 by a third photolithography step.

In this case, the oxide semiconductor film 345 is preferably formed while residual moisture in the treatment chamber is removed, in order to prevent hydrogen, hydroxyl, or moisture from being included in the oxide semiconductor film 345.

In order to remove residual moisture from the treatment chamber, an adsorption-type vacuum pump is preferably used. For example, a cryopump, an ion pump, or a titanium sublimation pump is preferably used. As an exhaustion unit, a turbo pump to which a cold trap is added may be used. From the chamber in which exhaustion is performed with the use of a cryopump, a hydrogen atom, a compound including a hydrogen atom such as water ($H_2O$), or the like, for example, is exhausted. Accordingly, the concentration of an impurity included in the oxide semiconductor film 345 formed in the film formation chamber can be reduced.

As a sputtering gas used in formation of the oxide semiconductor film 345, a high-purity gas in which the concentration of an impurity such as hydrogen, water, hydroxyl, or hydride is reduced to approximately the ppm level or the ppb level is preferably used.

Next, dehydration or dehydrogenation of the oxide semiconductor layer 346 is performed. The temperature of first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer 346 in a nitrogen atmosphere at 450° C. for one hour, and then, the oxide semiconductor layer 346 is not exposed to the air so that entry of water and hydrogen into the oxide semiconductor layer 346 is prevented; thus, the dehydrated or dehydrogenated oxide semiconductor layer 346 is obtained (see FIG. 10C).

As the first heat treatment, GRTA may be performed in the following manner. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment in a short time.

An oxide insulating layer 356 serving as a protective insulating film is formed in contact with the oxide semiconductor layer 346.

The oxide insulating layer 356 can be formed to a thickness of at least 1 nm by a method by which an impurity such as water or hydrogen does not enter the oxide insulating layer 356, such as a sputtering method, as appropriate. When hydrogen is contained in the oxide insulating layer 356, entry of the hydrogen to the oxide semiconductor layer or extraction of oxygen in the oxide semiconductor layer by the hydrogen is caused, thereby making the resistance of the backchannel of the oxide semiconductor layer low (to have an n-type conductivity), so that a parasitic channel might be formed. Therefore, it is important that a formation method in which hydrogen is not used is employed so that the oxide insulating layer 356 contains as little hydrogen as possible.

In this embodiment, a 200-nm-thick silicon oxide film is formed as the oxide insulating layer 356 by a sputtering method. The substrate temperature in film formation may be higher than or equal to room temperature and lower than or equal to 300° C. and in this embodiment, is 100° C. The formation of the silicon oxide film by a sputtering method can be performed in a rare gas (typically argon) atmosphere, an oxygen atmosphere, or an atmosphere of a rare gas (typically argon) and oxygen. As a target, a silicon oxide target or a silicon target may be used, For example, with the use of a silicon target, silicon oxide can be formed by a sputtering method under an atmosphere of oxygen and nitrogen. As the oxide insulating layer 356 which is formed in contact with the oxide semiconductor layer 346, an inorganic insulating film which does not include impurities such as moisture, a hydrogen ion, or OH⁻ and blocks entry of these from the outside is used. Typically, a silicon oxide film, a silicon oxynitride film, an aluminum oxide film, an aluminum oxynitride film, or the like is used.

In this case, the oxide insulating layer 356 is preferably formed while residual moisture in the treatment chamber is removed, in order to prevent hydrogen, hydroxyl, or moisture from being included in the oxide semiconductor layer 346 and the oxide insulating layer 356.

In order to remove residual moisture from the treatment chamber, an adsorption-type vacuum pump is preferably used. For example, a cryopump, an ion pump, or a titanium sublimation pump is preferably used. As an exhaustion unit, a turbo pump to which a cold trap is added may be used. From the chamber in which exhaustion is performed with the use of a cryopump, a hydrogen atom, a compound including a hydrogen atom such as water ($H_2O$), or the like, for example, is exhausted. Accordingly, the concentration of an impurity included in the oxide insulating layer 356 formed in the film formation chamber can be reduced.

As a sputtering gas used in formation of the oxide insulating layer 356, a high-purity gas in which the concentration of an impurity such as hydrogen, water, hydroxyl, or hydride is reduced to approximately the ppm level or the ppb level is preferably used.

Next, second heat treatment (preferably at 200° C. to 400° C., for example at 250° C. to 350° C.) is performed in an inert gas atmosphere or an oxygen gas atmosphere. For example, the second heat treatment is performed at 250° C. in a nitrogen atmosphere for one hour. The second heat treatment is performed in the state that the oxide semiconductor layer is in contact with the oxide insulating layer 356.

Through the above-described process, the thin film transistor 350 including the I-type oxide semiconductor layer 346 in which the concentration of hydrogen, moisture, hydride, or hydroxide is reduced by dehydration or dehydrogenation can be formed.

Furthermore, heat treatment may be performed at 100° C. to 200° C. inclusive for one hour to 30 hours in the air. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100° C. to 200° C. and then decreased to room temperature. This heat treatment may be performed before the formation of the oxide insulating layer under a reduced pressure. Under a reduced pressure, the heat treatment time can be shortened. With this heat treatment, a normally-off thin film transistor can be obtained.

A protective insulating layer may be additionally formed over the oxide insulating layer 356. For example, a silicon nitride film is formed by an RE sputtering method. In this embodiment, a protective insulating layer 343 serving as a protective insulating layer is formed using a silicon nitride film (see FIG. 10D).

A planarization insulating layer for planarization may be provided over the protective insulating layer 343.

When the above-described thin film transistor is used in the analog circuit described in Embodiment 1, the analog circuit can have stable electric characteristics and high reliability.

This embodiment can be implemented in appropriate combination with any of the other embodiments.

Embodiment 9

In this embodiment, an example of a thin film transistor which is included in the analog circuit described in Embodiment 1 will be described.

Figure 11:
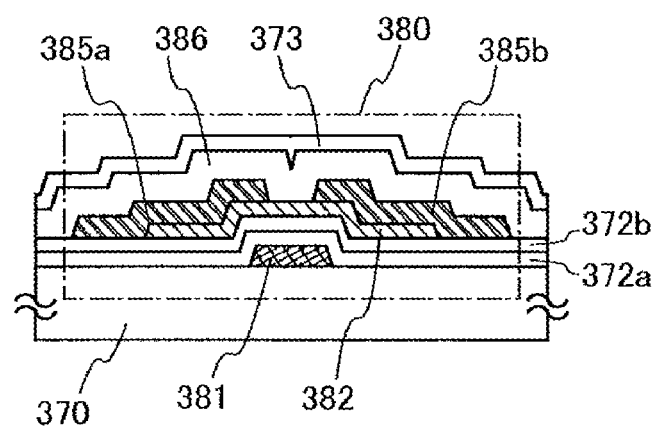
FIG. 11 shows a cross-sectional structure of a semiconductor device.

In this embodiment, an example which is different from Embodiment 6 in part of the manufacturing process of a thin film transistor will be described with reference to FIG. 11. Since FIG. 11 is the same as FIGS. 8A to 8E except for part of the process, the same reference numerals are used for the same portions, and detailed description of the same portions is not repeated.

In accordance with Embodiment 6, a gate electrode layer 381 is formed over a substrate 370, and a first gate insulating layer 372a and a second gate insulating layer 372b are stacked. In this embodiment, the gate insulating layer has a two-layer structure: a nitride insulating layer is used for the first gate insulating layer 372a and an oxide insulating layer is used for the second gate insulating layer 372b.

As the oxide insulating layer, a silicon oxide layer, a silicon oxynitride layer, an aluminum oxide layer, an aluminum oxynitride layer, or the like can be used. Further, as the nitride insulating layer, a silicon nitride layer, a silicon nitride oxide layer, an aluminum nitride layer, an aluminum nitride oxide layer, or the like can be used.

In this embodiment, the gate insulating layer has a structure in which a silicon nitride layer and a silicon oxide layer are stacked in this order over the gate electrode layer 381. A gate insulating layer having a thickness of 150 nm is formed in such a manner that a silicon nitride layer ($SiN_y$ (y>0)) having a thickness of 50 nm to 200 nm inclusive (50 nm in this embodiment) is formed as the first gate insulating layer 372a by a sputtering method and a silicon oxide layer ($SiO_x$ (x>0)) having a thickness of 5 nm to 300 nm inclusive (100 nm in this embodiment) is stacked as the second gate insulating layer 372b over the first gate insulating layer 372a.

Next, an oxide semiconductor film is formed and is processed into an island-shaped oxide semiconductor layer 382 by a photolithography step. In this embodiment, the oxide semiconductor film is formed by a sputtering method with use of an In—Ga—Zn—O-based metal oxide target.

In this case, the oxide insulating film is preferably formed while residual moisture in the treatment chamber is removed, in order to prevent hydrogen, hydroxyl, or moisture from being included in the oxide semiconductor film.

In order to remove residual moisture from the treatment chamber, an adsorption-type vacuum pump is preferably used. For example, a cryopump, an ion pump, or a titanium sublimation pump is preferably used. As an exhaustion unit, a turbo pump to which a cold trap is added may be used. From the chamber in which exhaustion is performed with the use of a cryopump, a hydrogen atom, a compound including a hydrogen atom such as water ($H_2O$), or the like, for example, is exhausted. Accordingly, the concentration of an impurity included in the oxide semiconductor film formed in the film formation chamber can be reduced.

As a sputtering gas used in formation of the oxide semiconductor film, a high-purity gas in which the concentration of an impurity such as hydrogen, water, hydroxyl, or hydride is reduced to approximately the ppm level or the ppb level is preferably used.

Next, dehydration or dehydrogenation of the oxide semiconductor layer 382 is performed. The temperature of first heat treatment for dehydration or dehydrogenation is higher than or equal to 400° C. and lower than or equal to 750° C., preferably higher than or equal to 425° C. When the temperature is 425° C. or higher, the heat treatment time may be one hour or less, whereas when the temperature is lower than 425° C., the heat treatment time is longer than one hour. Here, the substrate is introduced into an electric furnace which is one of heat treatment apparatuses, heat treatment is performed on the oxide semiconductor layer in a nitrogen atmosphere, and then, the oxide semiconductor layer is not exposed to the air so that entry of water and hydrogen into the oxide semiconductor layer is prevented; thus, the oxide semiconductor layer is obtained. After that, cooling is performed by introduction of a high-purity oxygen gas, a high-purity $N_2O$ gas, or ultra-dry air (having a dew point of −40° C., or lower, preferably −60° C. or lower) into the same furnace. It is preferable that the oxygen gas and the $N_2O$ gas do not include water, hydrogen, and the like. The purity of an oxygen gas or an $N_2O$ gas which is introduced into the heat treatment apparatus is preferably 6N (99.9999%) or higher, further preferably 7N (99.99999%) or higher (that is, the impurity concentration of the oxygen gas or the $N_2O$ gas is 1 ppm or lower, preferably 0.1 ppm or lower).

The heat treatment apparatus is not limited to the electric furnace and, for example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In addition, the LRTA apparatus may be provided with not only a lamp but also a device which heats a process object by heat conduction or heat radiation from a heater such as a resistance heater. GRTA is a method of heat treatment using a high-temperature gas. As the gas, an inert gas which does not react with a process object by heat treatment, such as nitrogen or a rare gas such as argon is used. The heat treatment may be performed at 600° C. to 750° C. for several minutes using an RTA method.

Further, after the first heat treatment for dehydration or dehydrogenation, heat treatment may be performed at 200° C. to 400° C. inclusive, preferably 200° C. to 300° C. inclusive, in an atmosphere of an oxygen gas or an $N_2O$ gas.

The first heat treatment may be performed on the oxide semiconductor film before being processed into the island-shaped oxide semiconductor layer, instead of on the island-shaped oxide semiconductor layer. In that case, after the first heat treatment, the substrate is taken out of the heating apparatus and a photolithography step is performed.

Through the above-described process, impurities in the oxide semiconductor are reduced, whereby the oxide semiconductor layer 382 whose entire region is I-type or substantially I-type can be obtained.

Next, a conductive film is formed over the oxide semiconductor layer 382, a resist mask is formed by a photolithography step, and the conductive film is selectively etched, so that a source electrode layer 385a and a drain electrode layer 385b are formed. Then, an oxide insulating layer 386 is formed by a sputtering method.

In this case, the oxide insulating layer 386 is preferably formed while residual moisture in the treatment chamber is removed, in order to prevent hydrogen, hydroxyl, or moisture from being included in the oxide semiconductor layer 382 and the oxide insulating layer 386.

In order to remove residual moisture from the treatment chamber, an adsorption-type vacuum pump is preferably used. For example, a cryopump, an ion pump, or a titanium sublimation pump is preferably used. As an exhaustion unit, a turbo pump to which a cold trap is added may be used. From the chamber in which exhaustion is performed with the use of a cryopump, a hydrogen atom, a compound including a hydrogen atom such as water ($H_2O$), or the like, for example, is exhausted. Accordingly, the concentration of an impurity included in the oxide insulating layer 386 formed in the film formation chamber can be reduced.

As a sputtering gas used in formation of the oxide insulating layer 386, a high-purity gas in which the concentration of an impurity such as hydrogen, water, hydroxyl, or hydride is reduced to approximately the ppm level or the ppb level is preferably used.

Through the above-described process, a thin film transistor 380 can be formed.

Next, in order to reduce variation in electric characteristics of the thin film transistor, heat treatment (preferably at higher than or equal to 150° C. and lower than 350° C.) may be performed in an inert gas atmosphere or a nitrogen gas atmosphere. For example, the heat treatment is performed at 250° C. in a nitrogen atmosphere for one hour.

Further, heat treatment may be performed at 100° C. to 200° C. inclusive for one hour to 30 hours in the air. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100° C. to 200° C. and then decreased to room temperature. This heat treatment may be performed before the formation of the oxide insulating layer under a reduced pressure. Under a reduced pressure, the heat treatment time can be shortened. With this heat treatment, a normally-off thin film transistor can be obtained.

A protective insulating layer 373 is formed over the oxide insulating layer 386. In this embodiment, a silicon nitride film having a thickness of 100 nm is formed by a sputtering method as the protective insulating layer 373.

The protective insulating layer 373 and the first gate insulating layer 372a, which are formed using a nitride insulating layer, do not include impurities such as moisture, hydrogen, hydride, or hydroxide and have an effect of blocking entry of these from the outside.

Accordingly, entry of impurities such as moisture from the outside can be prevented in a manufacturing process after formation of the protective insulating layer 373. Further, even after a device is completed as a semiconductor device such as a liquid crystal display device, entry of impurities such as moisture from the outside can be prevented in the long term; therefore, long-term reliability of the device can be improved.

Further, a structure in which the protective insulating layer 373 is in contact with the first gate insulating layer 372a by removing an insulating layer provided between the protective insulating layer 373 and the first gate insulating layer 372a, which are formed using a nitride insulating layer.

With the structure in which the protective insulating layer 373 is in contact with the first gate insulating layer 372a, impurities such as moisture, hydrogen, hydride, or hydroxide in the oxide semiconductor layer can be reduced to a minimum amount, and in addition, the impurities can be prevented from entering the oxide semiconductor layer again. Accordingly, the impurity concentration in the oxide semiconductor layer can be kept low.

A planarization insulating layer for planarization may be provided over the protective insulating layer 373.

When the above-described thin film transistor is used in the analog circuit described in Embodiment 1, the analog circuit can have stable electric characteristics and high reliability.

This embodiment can be implemented in appropriate combination with any of the other embodiments.

Embodiment 10

Figure 12:
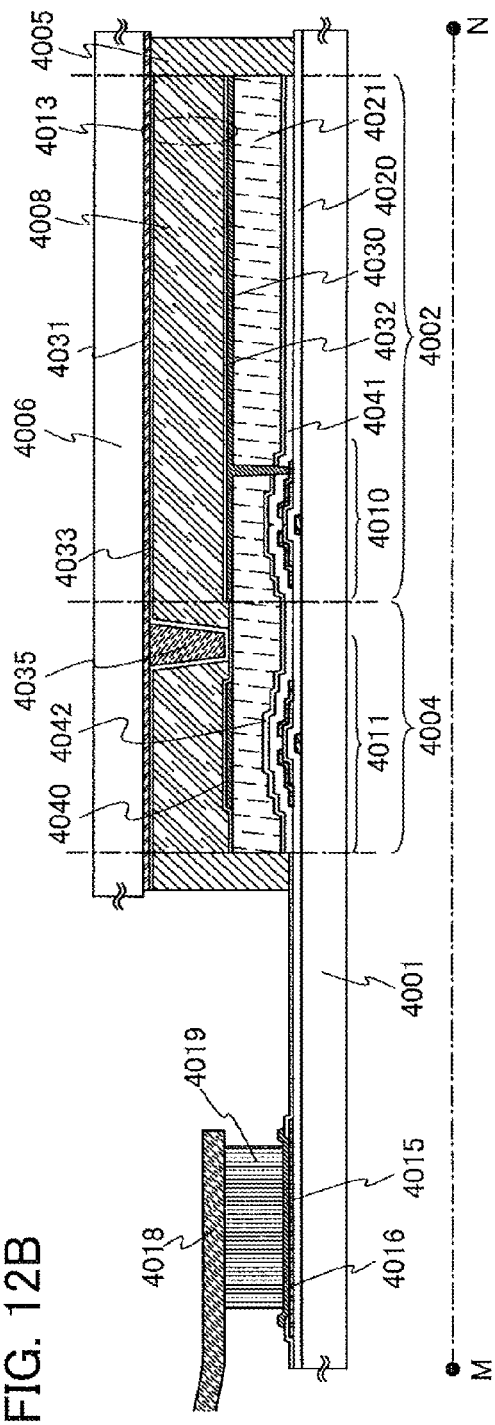
FIGS. 12A to 12C each show a semiconductor device.

In this embodiment, an example of a semiconductor device including the analog circuit described in Embodiment 1 will be described. Specifically, the appearance and a cross section of a liquid crystal display panel including the photodetector described in Embodiment 1 will be described with reference to FIGS. 12A to 12C. FIGS. 12A and 12C are plan views of panels in which thin film transistors 4010 and 4011 and a liquid crystal element 4013 are sealed between a first substrate 4001 and a second substrate 4006 with a sealant 4005. FIG. 12B is a cross-sectional view taken along M-N in FIG. 12A or FIG. 12C.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

A photodetector 4100 described in Embodiment 1 is provided in a region that is different from the region surrounded by the sealant 4005 over the first substrate 4001. The photodetector 4100 may be formed over the first substrate 4001 at the same time as the pixel portion or may be formed over a different substrate and then mounted on the first substrate 4001. Note that in the case of using a light-transmitting substrate as the first substrate 4001, the photodetector 4100 can have a structure of detecting light that enters from the substrate side, while in the case of using a substrate that does not transmit visible light as the first substrate 4001, a light-receiving portion of the photodetector needs to face in such a direction as not to be influenced by blocking of light due to the substrate.

Note that there is no particular limitation on the connection method of the driver circuit which is separately formed, and a COG method, a wire bonding method, a TAB method, or the like can be used. FIG. 12A illustrates an example in which the signal line driver circuit 4003 is mounted by a COG method. FIG. 12C illustrates an example in which the signal line driver circuit 4003 is mounted by a TAB method.

The pixel portion 4002 and the scan line driver circuit 4004 provided over the first substrate 4001 include a plurality of thin film transistors. FIG. 12B illustrates the thin film transistor 4010 included in the pixel portion 4002 and the thin film transistor 4011 included in the scan line driver circuit 4004, as an example. An insulating layer 4041, a protective insulating layer 4042, an insulating layer 4020, and an insulating layer 4021 are provided over the thin film transistors 4010 and 4011.

Any of the thin film transistors of Embodiments 3 to 9 can be used as appropriate as the thin film transistors 4010 and 4011, and they can be formed using steps and materials similar to those for the thin film transistors of Embodiments 3 to 9. The thin film transistors 4010 and 4011 each include an oxide semiconductor layer in which hydrogen or water is reduced. Therefore, the thin film transistors 4010 and 4011 are highly reliable thin film transistors. In this embodiment, the thin film transistors 4010 and 4011 are n-channel thin film transistors.

A conductive layer 4040 is provided over part of the insulating layer 4021, which overlaps with a channel region of an oxide semiconductor layer in the thin film transistor 4011 for the driver circuit. The conductive layer 4040 is provided in the position overlapping with the channel region of the oxide semiconductor layer, whereby the amount of change in threshold voltage of the thin film transistor 4011 before and after the BT test can be reduced. A potential of the conductive layer 4040 may be the same or different from that of a gate electrode layer of the thin film transistor 4011. The conductive layer 4040 can also function as a second, gate electrode layer. Further, the potential of the conductive layer 4040 may be GND or 0 V, or the conductive layer 4040 may be in a floating state. Note that it is acceptable if the conductive layer 4040 is not provided.

A pixel electrode layer 4030 included in the liquid crystal element 4013 is electrically connected to a source or drain electrode layer of the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the electrode layers with the insulating layers 4032 and 4033 therebetween.

Note that a light-transmitting substrate can be used as the first substrate 4001 and the second substrate 4006; glass, ceramics, or plastics can be used. The plastic may be a fiberglass-reinforced plastics (FRP) plate, a polyvinyl fluoride (PVF) film, a polyester film, or an acrylic resin film.

A spacer 4035 is a columnar spacer obtained by selective etching of an insulating film, and the columnar spacer 4035 is provided in order to control the distance (a cell gap) between the pixel electrode layer 4030 and the counter electrode layer 4031. Alternatively, a spherical spacer may be used as the spacer 4035. The counter electrode layer 4031 is electrically connected to a common potential line formed over the substrate where the thin film transistor 4010 is formed. The counter electrode layer 4031 and the common potential line can be electrically connected to each other through conductive particles provided between the pair of substrates using the common connection portion. Note that the conductive particles are included in the sealant 4005.

Alternatively, a liquid crystal exhibiting a blue phase for which an alignment film is unnecessary may be used. A blue phase is one of liquid crystal phases, and is generated just before a cholesteric phase changes into an isotropic phase while the temperature of cholesteric liquid crystal is increased. Since the blue phase is only generated within a narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of 1 msec or less and is optically isotropic; therefore, alignment treatment is not necessary and viewing angle dependence is small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A thin film transistor that uses an oxide semiconductor layer particularly has a possibility that electric characteristics of the thin film transistor may fluctuate significantly by the influence of static electricity and deviate from the designed range. Therefore, it is more effective to use a blue phase liquid crystal material for a liquid crystal display device including a thin film transistor that uses an oxide semiconductor layer.

Note that an embodiment of the present invention can also be applied to a transflective liquid crystal display device in addition to a transmissive liquid crystal display device.

Although a polarizing plate is provided on the outer surface of the substrate (on the viewer side) and a coloring layer and an electrode layer used for a display element are sequentially provided on the inner surface of the substrate in the example of the liquid crystal display device, the polarizing plate may be provided on the inner surface of the substrate. The stacked structure of the polarizing plate and the coloring layer is not limited to that in this embodiment and may be set as appropriate depending on materials of the polarizing plate and the coloring layer or conditions of the manufacturing process. Further, a light-blocking film serving as a black matrix may be provided in a portion other than the display portion.

Over the thin film transistors 4011 and 4010, the insulating layer 4041 is formed in contact with the oxide semiconductor layers. The insulating layer 4041 can be formed using a material and a method similar to those of the oxide insulating layer described in any of the other embodiments. Here, as the insulating layer 4041, a silicon oxide layer is formed by a sputtering method. Further, the protective insulating layer 4042 is formed on and in contact with the insulating layer 4041. The protective insulating layer 4042 can be formed in a manner similar to that of the protective insulating layer described in any of the other embodiments, and a silicon nitride film can be used, for example. In order to reduce the surface roughness caused by the thin film transistors, the insulating layer 4021 serving as a planarization film is formed over the protective insulating layer 4042.

As the insulating layer 4021 functioning as a planarization insulating film, an organic material having heat resistance such as polyimide, an acrylic resin, a beuzocyclobutene-based resin, polyamide, or an epoxy resin can be used. Other than such organic materials, it is possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

There is no particular limitation on the method for forming the insulating layer 4021. The insulating layer 4021 can be formed, depending on the material, by a method such as a sputtering method, an SOG method, a spin coating method, a dipping method, a spray coating method, or a droplet discharge method (e.g., an ink-jet method, screen printing, or offset printing), or a tool (equipment) such as a doctor knife, a roll coater, a curtain coater, or a knife coater. A baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium tin oxide (ITO), indium zinc oxide (IZO), a conductive material in which silicon oxide ($SiO_x$ (x>0)) is mixed in indium oxide, organoindium, organotin, indium oxide containing tungsten oxide, indium zinc oxide containing tungsten oxide, indium oxide containing titanium oxide, indium tin oxide containing titanium oxide, or the like. Further, in the case where a light-transmitting property is not needed or a reflecting property is needed in a reflective liquid crystal display device, the pixel electrode layer 4030 and the counter electrode layer 4031 can be formed using one or more kinds of materials selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of these metals; and a nitride of these metals.

A conductive composition containing a conductive molecule of high molecular weight (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive polymer contained in the conductive composition is preferably less than or equal to 0.1 Ω·cm.

As the conductive polymer, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

A connection terminal electrode 4015 is formed from the same conductive film as the pixel electrode layer 4030 included in the liquid crystal element 4013, and a terminal electrode 4016 is formed from the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 12A to 12C illustrate an example in which the signal line driver circuit 4003 is formed separately and mounted on the first substrate 4001; however, the present invention is not limited to this structure. The scan line driver circuit may be separately formed and then mounted, or only part of the signal line driver circuit or part of the scan line driver circuit may be separately formed and then mounted.

A black matrix (a light-blocking layer), an optical element (an optical substrate) such as a polarizing member, a retardation member, or an anti-reflection member, and the like are provided as appropriate. For example, circular polarization may be employed by using a polarizing substrate and a retardation substrate. In addition, a backlight, a sidelight, or the like may be used as a light source.

In an active matrix liquid crystal display device, display patterns are formed on a screen by driving of pixel electrodes that are arranged in matrix. Specifically, voltage is applied between a selected pixel electrode and a counter electrode corresponding to the pixel electrode, and thus, a liquid crystal layer disposed between the pixel electrode and the counter electrode is optically modulated. This optical modulation is recognized as a display pattern by a viewer.

A liquid crystal display device has a problem in that, when displaying a moving image, image sticking occurs or the moving image is blurred because the response speed of liquid crystal molecules themselves is low. As a technique for improving moving image characteristics of a liquid crystal display device, there is a driving technique so-called black insertion by which an entirely black image is displayed every other frame.

Alternatively, a driving method called double-frame rate driving may be employed in which a vertical synchronizing frequency is 1.5 times or more, preferably 2 times or more as high as a normal vertical synchronizing frequency, whereby moving image characteristics are improved.

Furthermore, as a technique for improving moving image characteristics of a liquid crystal display device, there is another driving technique in which, as a backlight, a surface light source including a plurality of LED (light-emitting diode) light sources or a plurality of EL light sources is used, and each light source included in the surface light source is independently driven so as to perform intermittent lighting in one frame period. As the surface light source, three or more kinds of LEDs may be used, or a white-light-emitting LED may be used. Since a plurality of LEDs can be controlled independently, the timing at which the LEDs emit light can be synchronized with the timing at which optical modulation of a liquid crystal layer is switched. In this driving technique, part of LEDs can be turned off. Therefore, especially in the case of displaying an image in which the proportion of a black image area in one screen is high, a liquid crystal display device can be driven with low power consumption.

When combined with any of these driving techniques, a liquid crystal display device can have better display characteristics such as moving image characteristics than conventional liquid crystal display devices.

Since the thin film transistor is easily broken due to static electricity or the like, the protective circuit is preferably provided over the same substrate as the pixel portion and the driver circuit portion. The protective circuit is preferably formed using a non-linear element including an oxide semiconductor layer. For example, a protective circuit is provided between the pixel portion, and a scan line input terminal and a signal line input terminal. In this embodiment, a plurality of protective circuits are provided so that the pixel transistor and the like are not broken when surge voltage due to static electricity or the like is applied to the scan line, the signal line, or a capacitor bus line. Accordingly, the protective circuit has a structure for releasing charge to a common wiring when surge voltage is applied to the protective circuit. The protective circuit includes non-linear elements which are arranged in parallel between the scan line and the common wiring. Each of the non-linear elements includes a two-terminal element such as a diode or a three-terminal element such as a transistor. For example, the non-linear element can be formed through the same steps as the thin film transistor of the pixel portion. For example, characteristics similar to those of a diode can be achieved by connecting a gate terminal to a drain terminal.

Further, for the liquid crystal display module, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

There is no particular limitation in the semiconductor device disclosed in this specification, and a liquid crystal display device including a TN liquid crystal, an OCB liquid crystal, an STN liquid crystal, a VA liquid crystal, an ECB liquid crystal, a GH liquid crystal, a polymer dispersed liquid crystal, a discotic liquid crystal, or the like can be used. In particular, a normally black liquid crystal panel such as a transmissive liquid crystal display device utilizing a vertical alignment (VA) mode is preferable. Some examples are given as a vertical alignment mode. For example, an MVA (multi-domain vertical alignment) mode, a PVA (patterned vertical alignment) mode, an ASV mode, or the like can be employed.

An embodiment of the present invention can also be applied to a VA liquid crystal display device. The VA liquid crystal display device has a kind of form in which alignment of liquid crystal molecules in a liquid crystal display panel is controlled. In the VA liquid crystal display device, liquid crystal molecules are aligned in a vertical direction with respect to a panel surface when no voltage is applied. A method called multi-domain or multi-domain design in which a pixel is divided into some regions (subpixels) and molecules are aligned in different directions in their respective regions can be used.

The photodetector 4100 detects the illuminance in the vicinity of the liquid crystal display device, and the light-emission luminance from the backlight can be adjusted, whereby the visibility can be increased and lower power consumption can be achieved.

If the photodetector described in Embodiment 1 is provided in the pixel portion 4002, the device can be used as an optical touch sensor.

This embodiment can be implemented in appropriate combination with any of the other embodiments.

Embodiment 11

In this embodiment, an example of an active matrix light-emitting display device will be described. Specifically, an example of a light-emitting display device including a light-emitting element utilizing electroluminescence will be described.

Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) recombine and light emission is caused. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission which utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made in this embodiment using an organic EL element as a light-emitting element.

Figure 13:
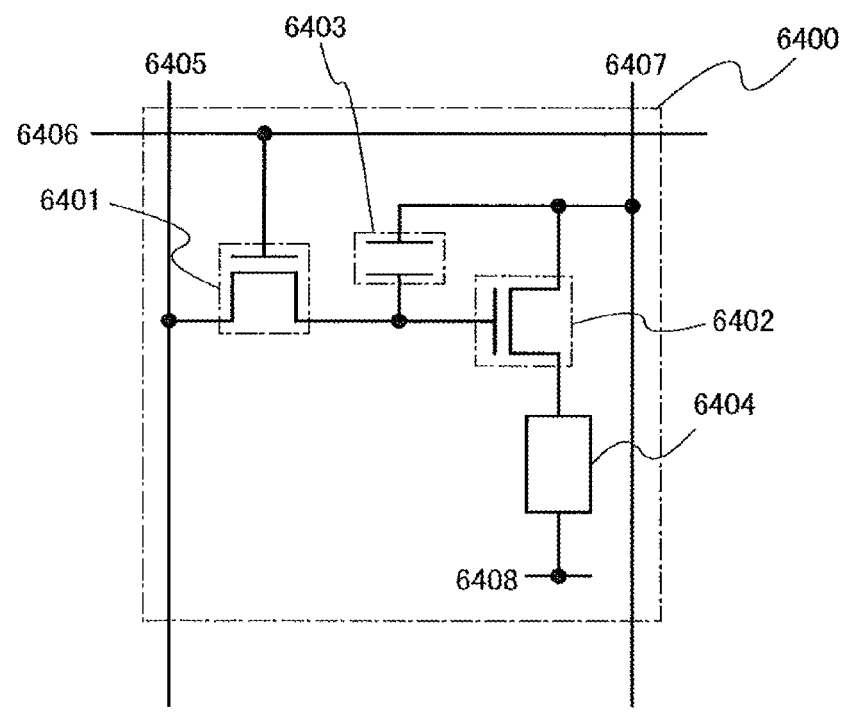
FIG. 13 shows an equivalent circuit of a pixel in a semiconductor device.

FIG. 13 illustrates an example of a pixel configuration to which digital time grayscale driving can be applied as an example of the semiconductor device.

The configuration and operation of a pixel to which digital time grayscale driving can be applied will be described. An example is described in this embodiment in which one pixel includes two n-channel transistors using an oxide semiconductor layer in a channel region.

A pixel 6400 includes a switching transistor 6401, a transistor 6402 for driving a light-emitting element, a light-emitting element 6404, and a capacitor 6403. In the switching transistor 6401, a gate thereof is connected to a scan line 6406, a first electrode thereof (one of source and drain electrodes) is connected to a signal line 6405, and a second electrode thereof (the other of the source and drain electrodes) is connected to a gate of the transistor 6402 for driving a light-emitting element. In the transistor 6402 for driving a light-emitting element, the gate thereof is connected to a power supply line 6407 through the capacitor 6403, a first electrode thereof is connected to the power supply line 6407, and a second electrode thereof is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (common electrode 6408) of the light-emitting element 6404 is set to a low power supply potential. Note that the low power supply potential is a potential satisfying the low power supply potential<a high power supply potential with reference to the high power supply potential that is set on the power supply line 6407. As the low power supply potential, GND, 0 V, or the like may be employed, for example. The difference between the high power supply potential and the low power supply potential is applied to the light-emitting element 6404 so that current flows through the light-emitting element 6404, whereby the light-emitting element 6404 emits light. Thus, each potential is set so that the difference between the high power supply potential and the low power supply potential is greater than or equal to a forward threshold voltage of the light-emitting element 6404.

When the gate capacitance of the transistor 6402 for driving a light-emitting element is used as a substitute for the capacitor 6403, the capacitor 6403 can be omitted. The gate capacitance of the transistor 6402 for driving a light-emitting element may be formed between the channel region and the gate electrode.

In the case of using a voltage-input voltage driving method, a video signal is inputted to the gate of the transistor 6402 for driving a light-emitting element so that the transistor 6402 for driving a light-emitting element is in either of two states of being sufficiently turned on and turned off. That is, the transistor 6402 for driving a light-emitting element operates in a linear region, and thus a voltage higher than the voltage of the power supply line 6407 is applied to the gate of the transistor 6402 for driving a light-emitting element. Note that a voltage higher than or equal to the following is applied to the signal line 6405: power supply line voltage+$V_{th}$ of the transistor 6402 for driving a light-emitting element.

In the case of performing analog grayscale driving instead of digital time grayscale driving, the same pixel configuration as FIG. 13 can be employed by changing signal input.

In the case of performing analog grayscale driving, voltage higher than or equal to the following is applied to the gate of the transistor 6402 for driving a light-emitting element: forward voltage of the light-emitting element 6404+$V_{th}$ of the transistor 6402 for driving a light-emitting element. The forward voltage of the light-emitting element 6404 refers to voltage to obtain a desired luminance, and includes at least forward threshold voltage. By input of a video signal which enables the transistor 6402 for driving a light-emitting element to operate in a saturation region, it is possible to feed current to the light-emitting element 6404. In order that the transistor 6402 for driving a light-emitting element can operate in the saturation region, the potential of the power supply line 6407 is set higher than a gate potential of the transistor 6402 for driving a light-emitting element. When an analog video signal is used, it is possible to feed current to the light-emitting element 6404 in accordance with the video signal and perform analog grayscale driving.

Figure 14:
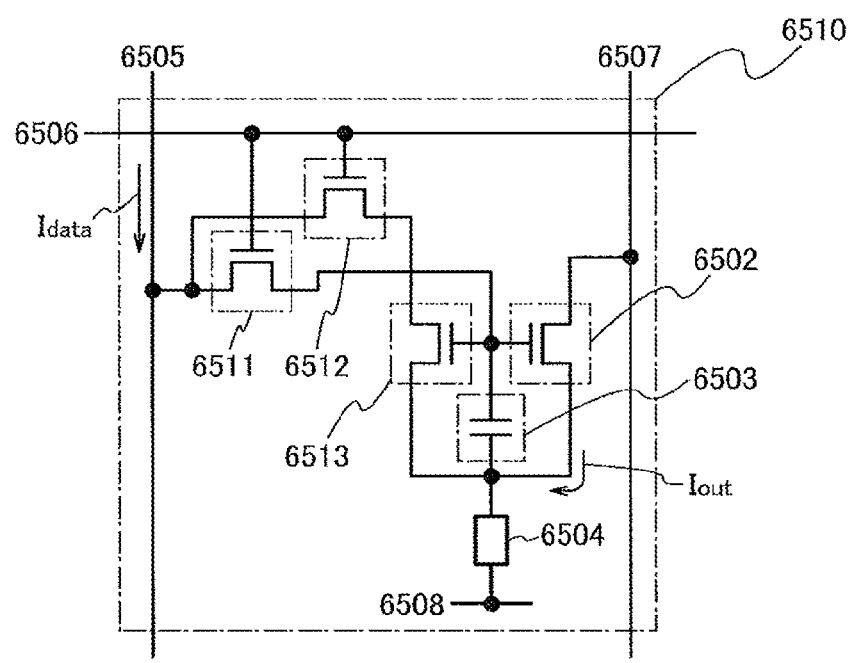
FIG. 14 shows an equivalent circuit of a pixel in a semiconductor device.

Next, an example of a pixel configuration which is different from that of FIG. 13 will be described with reference to FIG. 14. FIG. 14 illustrates an example of a pixel configuration to which a current mirror circuit is applied. The example here is an example in which four n-channel transistors in which an oxide semiconductor layer is used for a channel region are used in one pixel.

A pixel 6510 includes a switching transistor 6511, a switching transistor 6512, a reference transistor 6513, a transistor 6502 for driving a light-emitting element, a light-emitting element 6504, and a capacitor 6503. Gates of the switching transistor 6511 and the switching transistor 6512 are connected to a scan line 6506. A first electrode (one of a source electrode and a drain electrode) of the switching transistor 6511 is connected to a signal line 6505, and a second electrode (the other of the source electrode and the drain electrode) thereof is connected to gates of the reference transistor 6513 and the transistor 6502 for driving a light-emitting element. A first electrode of the switching transistor 6512 is connected to the signal line 6505, and a second electrode thereof is connected to a first electrode of the reference transistor 6513.

A first electrode of the transistor 6502 for driving a light-emitting element is connected to a power supply line 6507, and the gate thereof is connected to a first electrode (pixel electrode) of the light-emitting element 6504 through the capacitor 6503. Note that although the capacitor 6503 is connected to the first electrode of the light-emitting element 6504 in FIG. 14, the capacitor 6503 may be connected to not the first electrode of the light-emitting element 6504 but the power supply line 6507 or an electrode having a fixed potential such as a common electrode 6508. A structure may be employed in which gates of the switching transistor 6511 and the switching transistor 6512 are connected to a scan line different from the scan line 6506.

In addition, second electrodes of the reference transistor 6513 and the transistor 6502 for driving a light-emitting element are connected to the first electrode (pixel electrode) of the light-emitting element 6504, and a second electrode of the light-emitting element 6504 is connected to the common electrode 6508. The common electrode 6508 is electrically connected to a common potential line that is formed over the same substrate.

The common electrode 6508 is set to a low power supply potential. Note that the low power supply potential is a potential lower than a high power supply potential which is set to the power supply line 6507. As the low power supply potential, GND, 0 V, or the like may be employed, for example. The light-emitting element 6504 is made to emit light by flow of current $I_{out}$, which is supplied from the power supply line 6507, to the light-emitting element 6504 through the transistor 6502 for driving a light-emitting element. Thus, each potential is set so that the difference between the high power supply potential and the low power supply potential is greater than or equal to a forward threshold voltage of the light-emitting element 6504.

When the gate capacitance of the transistor 6502 for driving a light-emitting element is used as a substitute for the capacitor 6503, the capacitor 6503 can be omitted. The gate capacitance of the transistor 6502 for driving a light-emitting element may be formed between a channel region and a gate electrode.

First, a potential of the scan line 6506 is set to such a potential as to turn on the switching transistor 6511 and the switching transistor 6512, so that the first electrode and the second electrode of the switching transistor 6511 are brought into electrical conduction and the first electrode and the second electrode of the switching transistor 6512 are also brought into electrical conduction, whereby current $I_{data}$ is supplied from the signal line 6505 to the pixel circuit Current $I_{data}$ is supplied through the switching transistor 6511 to the capacitor 6503, and the capacitor 6503 is charged. The potential of the capacitor 6503 is increased by the charging, and when the potential becomes higher than Vth of the reference transistor 6513, the reference transistor 6513 is turned on. Then, current $I_{data}$ flows through the switching transistor 6512, the reference transistor 6513, and the light-emitting element 6504 to the common electrode 6508.

The increase in potential of the capacitor 6503 continues until the time when the drain current of the reference transistor 6513 becomes equal to a current value of current $I_{data}$. In other words, the increase in potential of the capacitor 6503 stops when the flow of current $I_{data}$ through the switching transistor 6511 stops.

Since the gates of the reference transistor 6513 and the transistor 6502 for driving a light-emitting element are connected to each other, the gate of the transistor 6502 for driving a Light-emitting element and the gate of the reference transistor 6513 have the same potential. If the reference transistor 6513 and the transistor 6502 for driving a light-emitting element have the same transistor characteristics and the same ratio of the channel width W to the channel length L (W/L ratio), current $I_{out}$ having an equal current value to current $I_{data}$ is supplied from the power supply line 6507 to the light-emitting element 6504 through the transistor 6502 for driving a light-emitting element.

Next, the potential of the scan line 6506 is set to such a potential as to turn off the switching transistor 6511 and the switching transistor 6512, so that the switching transistor 6511 and the switching transistor 6512 become in an off state and supply of current $I_{data}$ stops. However, current $I_{out}$ can continue to be supplied to the light-emitting element 6504 by the potential held in the capacitor 6503.

Note that current $I_{out}$ can be made larger or smaller than current $I_{data}$ by devising transistor characteristics and the relation between the channel width W and the channel length L of the reference transistor 6513 and the transistor 6502 for driving a light-emitting element. For example, if a transistor which has the same transistor characteristics and the same channel length L as the reference transistor 6513 and has half the channel width W of the reference transistor 6513 is used as the transistor 6502 for driving a light-emitting element, current $I_{out}$ can become half of current $I_{data}$.

Since a transistor including an oxide semiconductor layer used in this embodiment has an extremely small off-state current, the potential of the capacitor 6503 can be held easily and the size of the capacitor 6503 can be made small. Further, a phenomenon of faint light emission due to off-state current caused when the light-emitting element 6504 is in a non-emitting state without being supplied with a current can be prevented.

Note that the pixel configuration is not limited to those illustrated in FIG. 13 and FIG. 14. For example, the pixels illustrated in FIG. 13 and FIG. 14 may further include a switch, a resistor, a capacitor, a transistor, a logic circuit, or the like.

Next, structures of the light-emitting element will be described with reference to FIGS. 15A to 15C. A cross-sectional structure of a pixel will be described by taking an n-channel thin film transistor for driving a light-emitting element as an example. A transistor 7011 for driving a light-emitting element, a transistor 7021 for driving a light-emitting element, and a transistor 7001 for driving a light-emitting element which are used for semiconductor devices illustrated in FIGS. 15A, 15B, and 15C, respectively, can be manufactured in a manner similar to that of the thin film transistor described in any of the above embodiments, and examples of using a thin film transistor including an oxide semiconductor layer will be described.

In order to extract light emitted from the light-emitting element, at least one of the anode and the cathode is required to transmit light. A thin film transistor and a light-emitting element are formed over a substrate. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The pixel configuration can be applied to a light-emitting element having any of these emission structures.

A light-emitting element having a bottom emission structure will be described with reference to FIG. 15A.

Figure 15A:
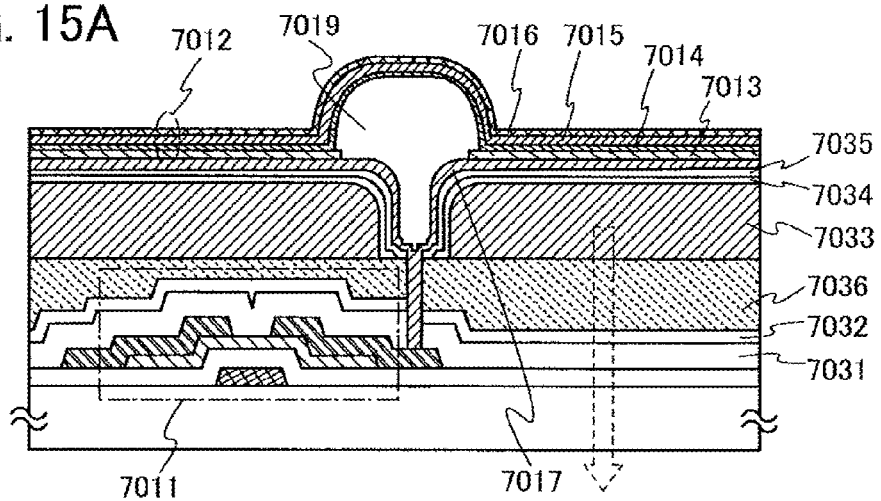
FIGS. 15A to 15C each show a cross-sectional structure of a semiconductor device.

FIG. 15A is a cross-sectional view of a pixel in the case where the transistor 7011 for driving a light-emitting element is of an n-type and light is emitted from a light-emitting element 7012 to a first electrode 7013 side. In FIG. 15A, the first electrode 7013 of the light-emitting element 7012 is formed over a light-transmitting conductive film 7017 which is electrically connected to a drain, electrode layer of the transistor 7011 for driving a light-emitting element, and an EL layer 7014 and a second electrode 7015 are stacked in that order over the first electrode 7013.

As the light-transmitting conductive film 7017, a light-transmitting conductive film such as a film of indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

The first electrode 7013 of the light-emitting element can be formed using various materials. For example, in the case where the first electrode 7013 is used as a cathode, a material having a low work function, for example, an alkali metal such as Li or Cs, an alkaline-earth metal such as Mg, Ca, or Sr, an alloy containing any of these (Mg:Ag, Al:Li, or the like), a rare-earth metal such as Yb or Er, or the like, is preferably used. In FIG. 15A, the thickness of the first electrode 7013 is such that the first electrode transmits light (preferably, approximately 5 nm to 30 nm). For example, an aluminum film having a thickness of 20 nm is used for the first electrode 7013.

Note that the light-transmitting conductive film and the aluminum film may be stacked and then selectively etched, so that the light-transmitting conductive film 7017 and the first electrode 7013 may be formed. In this case, the etching can be performed using the same mask, which is preferable.

The peripheral portion of the first electrode 7013 is covered with a partition 7019. The partition 7019 is formed using an organic resin film such as polyimide, an acrylic resin, polyamide, or an epoxy resin, an inorganic insulating film, or organic polysiloxane. It is particularly preferable that the partition 7019 be formed using a photosensitive resin material to have an opening over the first electrode 7013 so that a sidewall of the opening is formed as an inclined surface with continuous curvature. In the case where a photosensitive resin material is used for the partition 7019, a step of forming a resist mask can be omitted.

The EL layer 7014 formed over the first electrode 7013 and the partition 7019 may be formed using a single layer or a plurality of layers stacked as long as it includes at least a light-emitting layer. When the EL layer 7014 is formed using a plurality of layers, the EL layer 7014 is formed by stacking an electron-injection layer, an electron-transport layer, a light-emitting layer, a hole-transport layer, and a hole-injection layer in that order over the first electrode 7013 functioning as a cathode. Note that not all of these layers need to be provided.

The stacking order is not limited to the above stacking order. The first electrode 7013 may function as an anode, and a hole-injection layer, a hole-transport layer, a light-emitting layer, an electron-transport layer, and an electron-injection layer may be stacked in that order over the first electrode 7013. However, when power consumption is compared, it is preferable that the first electrode 7013 function as a cathode and an electron-injection layer, an electron-transport layer, a light-emitting layer, a hole-transport layer, and a hole-injection layer be stacked in that order over the first electrode 7013, because an increase in voltage in the driver circuit portion can be suppressed and power consumption can be reduced.

As the second electrode 7015 formed over the EL layer 7014, various materials can be employed. For example, in the case where the second electrode 7015 is used as an anode, a material having a high work function such as ZrN, Ti, W, Ni, Pt, or Cr; or a light-transmitting conductive material such as ITO, IZO, or ZnO is preferably used. A light-blocking film 7016 is formed over the second electrode 7015. As the light-blocking film 7016, a metal which blocks light, a metal which reflects light, or the like is used. In this embodiment, an ITO film is used for the second electrode 7015, and a Ti film is used for the light-blocking film 7016.

The light-emitting element 7012 corresponds to a region where the EL layer 7014 including a light-transmitting layer is sandwiched between the first electrode 7013 and the second electrode 7015. In the case of the element structure illustrated in FIG. 15A, light is emitted from the light-emitting element 7012 to the first electrode 7013 side as indicated by an arrow. Light emitted from the light-emitting element 7012 passes through a color filter layer 7033, and can be emitted through the substrate.

The color filter layer 7033 is formed by a droplet discharge method such as an ink-jet method, a printing method, an etching method with the use of a photolithography technique, or the like.

The color filter layer 7033 is covered with an overcoat layer 7034, and also covered with a protective insulating layer 7035. Note that the overcoat layer 7034 with a thin thickness is illustrated in FIG. 15A; however, the overcoat layer 7034 has a function to planarize a surface with unevenness due to the color filter layer 7033.

A contact hole which is formed in the protective insulating layer 7035, an overcoat layer 7034, a color filter layer 7033, a planarizing insulating film 7036, an insulating layer 7032, and an insulating layer 7031 and which reaches the drain electrode layer is provided in a portion which overlaps with the partition 7019.

Next, a light-emitting element having a dual emission structure will be described with reference to FIG. 15B.

Figure 15B:
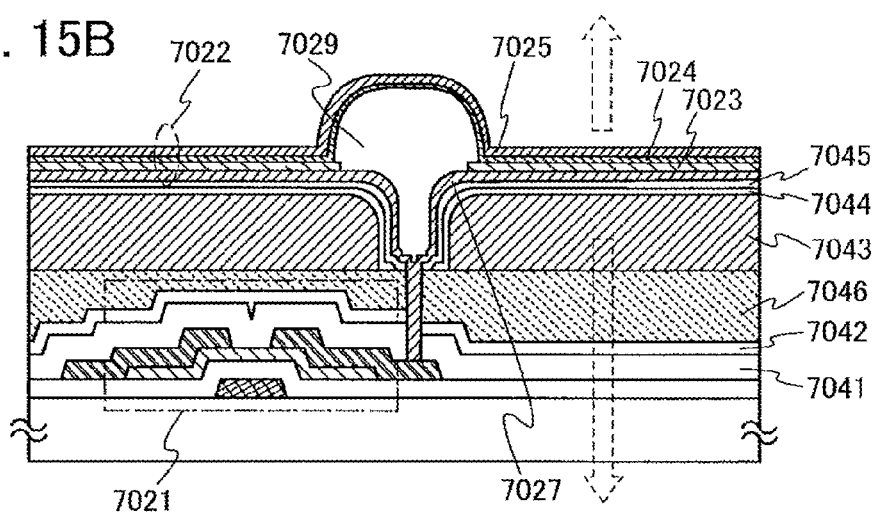

In FIG. 15B, a first electrode 7023 of a light-emitting element 7022 is formed over a light-transmitting conductive film 7027 which is electrically connected to a drain electrode layer of the transistor 7021 for driving a light-emitting element, and an EL layer 7024 and a second electrode 7025 are stacked in that order over the first electrode 7023.

For the light-transmitting conductive film 7027, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

The first electrode 7023 can be formed using various materials. For example, in the case where the first electrode 7023 is used as a cathode, a material having a low work function, specifically, an alkali metal such as Li or Cs; an alkaline-earth metal such as Mg, Ca, or Sr; an alloy containing any of these (Mg:Ag, Al:Li, or the like); a rare-earth metal such as Yb or Er; or the like is preferable. In this embodiment, the first electrode 7023 is used as a cathode and the first electrode 7023 is formed to a thickness such that the first electrode 7023 can transmit light (preferably, approximately 5 nm to 30 nm). For example, a 20-nm-thick aluminum film is used as the cathode.

Note that the light-transmitting conductive film and the aluminum film may be stacked and then selectively etched, so that the light-transmitting conductive film 7027 and the first electrode 7023 may be formed. In that case, etching can be performed with the use of the same mask, which is preferable.

The periphery of the first electrode 7023 is covered with a partition 7029. The partition 7029 is formed using an organic resin film such as polyimide, an acrylic resin, polyamide, or an epoxy resin; an inorganic insulating film; or organic polysiloxane. It is particularly preferable that the partition 7029 be formed using a photosensitive resin material to have an opening over the first electrode 7023 so that a sidewall of the opening is formed as an inclined surface with continuous curvature. In the case where a photosensitive resin material is used for the partition 7029, a step of forming a resist mask can be omitted.

The EL layer 7024 formed over the first electrode 7023 and the partition 7029 may be formed using either a single layer or a plurality of layers stacked as long as it includes at least a light-emitting layer. When the EL layer 7024 is formed using a plurality of layers, the EL layer 7024 is formed by stacking an electron-injection layer, an electron-transport layer, a light-emitting layer, a hole-transport layer, and a hole-injection layer in that order over the first electrode 7023 functioning as a cathode. Note that not all of these layers need to be provided.

The stacking order is not limited to the above. The first electrode 7023 may be used as an anode, and a hole-injection layer, a hole-transport layer, a light-emitting layer, an electron-transport layer, and an electron-injection layer may be stacked in that order over the anode. However, for lower power consumption, it is preferable that the first electrode 7023 be used as a cathode and an electron-injection layer, an electron-transport layer, a light-emitting layer, a hole-transport layer, and a hole-injection layer be stacked in this order over the cathode.

In addition, the second electrode 7025 formed over the EL layer 7024 can be formed using a variety of materials. For example, when the second electrode 7025 is used as an anode, a material with a high work function or a transparent conductive material such as ITO, IZO, or ZnO is preferable. In this embodiment, the second electrode 7025 is formed using an ITO film including silicon oxide and is used as an anode.

The light-emitting element 7022 corresponds to a region where the EL layer 7024 including a light-emitting layer is sandwiched between the first electrode 7023 and the second electrode 7025. In the case of the element structure illustrated in FIG. 15B, light emitted from the light-emitting element 7022 is emitted to both the second electrode 7025 side and the first electrode 7023 side as indicated by arrows.

Note that an example in which a light-transmitting conductive film is used as a gate electrode layer and a light-transmitting thin film is used as source and drain electrode layers is illustrated in FIG. 15B. Light emitted from the light-emitting element 7022 to the first electrode 7023 side passes through a color filter layer 7043, and can be extracted through the substrate.

The color filter layer 7043 is formed by a droplet discharge method such as an ink-jet method, a printing method, an etching method with the use of a photolithography technique, or the like.

The color filter layer 7043 is covered with an overcoat layer 7044, and also covered with a protective insulating layer 7045.

A contact hole which is formed in the protective insulating layer 7045, the overcoat layer 7044, the color filter layer 7043, a planarization insulating layer 7046, an insulating layer 7042, and an insulating layer 7041 and which reaches the drain electrode layer is provided so as to be overlapped with the partition 7029.

Note that when a light-emitting element having a dual emission structure is used and full color display is performed on both display surfaces, light from the second electrode 7025 side does not pass through the color filter layer 7043; therefore, a sealing substrate provided with another color filter layer is preferably provided over the second electrode 7025.

Next, a light-emitting element having a top emission structure is described with reference to FIG. 15C.

Figure 15C:
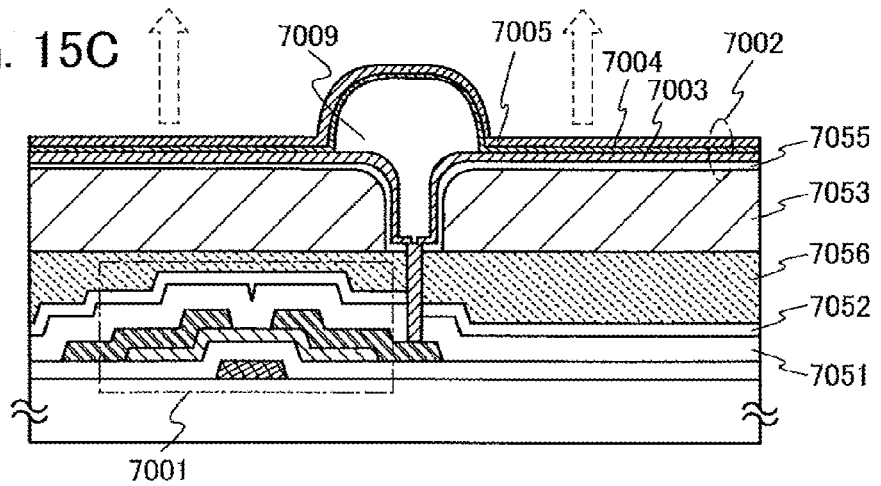

FIG. 15C is a cross-sectional view of a pixel in the case where the transistor 7001 for driving a light-emitting element is of n-type and light is emitted from a light-emitting element 7002 to a second electrode 7005 side. In FIG. 15C, a drain electrode layer of the transistor 7001 for driving a light-emitting element and a first electrode 7003 are in contact with each other, and the transistor 7001 for driving a light-emitting element and the first electrode 7003 of the light-emitting element 7002 are electrically connected to each other. An EL layer 7004 and a second electrode 7005 are stacked in this order over the first electrode 7003.

The first electrode 7013 can be formed using a variety of materials. For example, in the case where the first electrode 7013 is used as a cathode, a material having a low work function, for example, an alkali metal such as Li or Cs, an alkaline-earth metal such as Mg, Ca, or Sr, an alloy containing any of these (Mg:Ag, Al:Li, or the like), a rare-earth metal such as Yb or Er, or the like, is preferably used.

The periphery of the first electrode 7003 is covered with a partition 7009. The partition 7009 is formed using an organic resin film such as polyimide, an acrylic resin, polyamide, or an epoxy resin; an inorganic insulating film; or organic polysiloxane. It is particularly preferable that the partition 7009 be formed using a photosensitive resin material to have an opening over the first electrode 7003 so that a sidewall of the opening is inclined with continuous curvature. When the partition 7009 is formed using a photosensitive resin material, a step of forming a resist mask can be omitted.

The EL layer 7004 formed over the first electrode 7003 and the partition 7009 may be formed using either a single layer or a plurality of layers stacked as long as it includes at least a light-emitting layer. When the EL layer 7004 is formed using a plurality of layers, the EL layer 7004 is formed by stacking an electron-injection layer, an electron-transport layer, a light-emitting layer, a hole-transport layer, and a hole-injection layer in that order over the first electrode 7003 used as a cathode. Note that not all of these layers need to be provided.

The stacking order is not limited to the above stacking order, and a hole-injection layer, a hole-transport layer, a light-emitting layer, an electron-transport layer, and an electron-injection layer may be stacked in that order over the first electrode 7003 used as an anode.

In FIG. 15C, a hole-injection layer, a hole-transport layer, a light-emitting layer, an electron-transport layer, and an electron-injection layer are stacked in that order over a stacked film in which a Ti film, an aluminum film, and a Ti film are stacked in that order, and thereover, a stacked layer of a Mg:Ag alloy thin film and ITO is formed.

However, in the case where the transistor 7001 for driving a light-emitting element is of an n-type, it is preferable that an electron-injection layer, an electron-transport layer, a light-emitting layer, a hole-transport layer, and a hole-injection layer be stacked in that order over the first electrode 7003, because an increase in voltage in the driver circuit can be suppressed and power consumption can be reduced.

The second electrode 7005 is formed using a light-transmitting conductive material through which light can pass, and for example, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

The light-emitting element 7002 corresponds to a region where the EL layer 7004 is sandwiched between the first electrode 7003 and the second electrode 7005. In the case of the pixel illustrated in FIG. 15C, light is emitted from the light-emitting element 7002 to the second electrode 7005 side as indicated by an arrow.

In FIG. 15C, the drain electrode layer of the transistor 7001 for driving a light-emitting element is electrically connected to the first electrode 7003 through a contact hole provided in a silicon oxide layer 7051, a protective insulating layer 7052, a planarization insulating layer 7056, a planarization insulating layer 7053, and an insulating layer 7055.

The partition 7009 is provided in order to insulate the first electrode 7003 from a first electrode of an adjacent pixel. The partition 7009 is formed using an organic resin film of polyimide, an acrylic resin, polyimide, an epoxy resin, or the like; an inorganic insulating film; or organic polysiloxane. It is particularly preferable that the partition 7009 be formed using a photosensitive resin material to have the opening over the first electrode 7003 so that the sidewall of the opening is formed as a tilted surface with continuous curvature. When the partition 7009 is formed using a photosensitive resin material, a step of forming a resist mask can be omitted.

In the structure of FIG. 15C, when full color display is performed, for example, the light-emitting element 7002 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements, which include white light-emitting elements in addition to three kinds of light-emitting elements.

In the structure of FIG. 15C, a light-emitting display device capable of full color display may be manufactured in such a way that all of a plurality of light-emitting elements which is arranged is white light-emitting elements and a sealing substrate having a color filter or the like is arranged on the light-emitting element 7002. A material which exhibits light of a single color such as white can be formed and combined with a color filter or a color conversion layer, whereby full color display can be performed.

Note that the planarization insulating layers 7036, 7046, 7053, and 7056 can be formed using a resin material such as polyimide, an acrylic resin, a benzocyclobutene-based resin, polyamide, or an epoxy resin. In addition to such resin materials, it is also possible to use a low-dielectric constant material (low-k material), a siloxane-based resin, phosphosilicate glass (PSG), borophosphosilicate glass (BPSG), or the like. Note that the planarization insulating layers 7036, 7046, 7053, and 7056 may be formed by stacking a plurality of insulating films formed of these materials. There is no particular limitation on the method for forming the planarization insulating layers 7036, 7046, 7053, and 7056, and the planarization insulating layers 7036, 7046, 7053, and 7056 can be formed, depending on the material, by a method such as a sputtering method, an SOG method, spin coating, dip coating, spray coating, or a droplet discharge method (such as an ink-jet method, screen printing, offset printing, or the like), or a tool (equipment) such as a doctor knife, a roll coater, a curtain coater, or a knife coater.

Any of the thin film transistors of the above embodiments can be used as appropriate as the transistor 7001 for driving a light-emitting element, the transistor 7011 for driving a light-emitting element, and the transistor 7021 for driving a light-emitting element used for semiconductor devices, and they can be formed using steps and materials similar to those for the thin film transistors of the above embodiments. In oxide semiconductor layers of the transistors 7001, 7011, and 7021 for driving light-emitting elements, hydrogen or water is reduced. Therefore, the transistors 7001, 7011, and 7021 for driving light-emitting elements are highly reliable thin film transistors.

Needless to say, display of monochromatic light can also be performed. For example, a lighting device may be formed with the use of white light emission, or an area-color light-emitting device may be formed with the use of a single color light emission.

If necessary, an optical film such as a polarizing film including a circularly polarizing plate may be provided.

Although an organic EL element is described here as a light-emitting element, an inorganic EL element can also be provided as a light-emitting element.

Note that the example is described in which a thin film transistor which controls the driving of a light-emitting element (a transistor for driving a light-emitting element) is electrically connected to the light-emitting element; however, a structure may be employed in which a transistor for current control is connected between the transistor for driving a light-emitting element and the light-emitting element.

Next, the appearance and a cross section of a light-emitting display panel (also referred to as a light-emitting panel) will be described with reference to FIGS. 16A and 16B. FIG. 16A is a plan view of a panel in which a thin film transistor and a light-emitting element are sealed between a first substrate and a second substrate with a sealant. FIG. 16B is a cross-sectional view taken along line H-I of FIG. 16A.

A sealant 4505 is provided to surround a pixel portion 4502, a signal line driver circuit 4503a, a signal line driver circuit 4503b, a scan line driver circuit 4504a, and a scan line driver circuit 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

A photodetector 4580 described in Embodiment 1 is provided in a region that is different from the region surrounded by the sealant 4505 over the first substrate 4501. The photodetector 4580 may be formed over the first substrate 4501 at the same time as the pixel portion or may be formed over a different substrate and then mounted on the first substrate 4501. Note that in the case of using a light-transmitting substrate as the first substrate 4501, the photodetector 4580 can have a structure of detecting light that enters from the substrate side, while in the case of using a substrate that does not transmit visible light as the first substrate 4501, a light-receiving portion of the photodetector needs to face in such a direction as not to be influenced by blocking of light due to the substrate.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 16B.

Any of the thin film transistors of the above embodiments can be used as appropriate as the thin film transistors 4509 and 4510, and they can be formed using steps and materials similar to those for the thin film transistors of the above embodiments. Hydrogen or water is reduced in oxide semiconductor layers of the thin film transistors 4509 and 4510.

Note that the thin film transistor 4509 for a driver circuit has a conductive layer in a position which overlaps with the channel region of the oxide semiconductor layer in the thin film transistor. In this embodiment, the thin film transistors 4509 and 4510 are n-channel thin film transistors.

A conductive layer 4540 is provided over a silicon oxide layer 4542 in a portion which overlaps with the channel region of the oxide semiconductor layer of the thin film transistor 4509 for a driver circuit. When the conductive layer 4540 is provided in a portion which overlaps with the channel region of the oxide semiconductor layer, the amount of shift in the threshold voltage of the thin film transistor 4509 between before and after a BT (Bias Temperature) test can be reduced. The conductive layer 4540 may have a potential which is the same as or different from that of the gate electrode layer of the thin film transistor 4509, and can function as a second gate electrode layer. The potential of the conductive layer 4540 may be GND, 0 V or in a floating state.

Further, the silicon oxide layer 4542 is formed to cover the oxide semiconductor layer of the thin film transistor 4510. The source or drain electrode layer of the thin film transistor 4510 is electrically connected to a wiring layer 4550 in an opening formed in the silicon oxide layer 4542 and an insulating layer 4551 which are formed over the thin film transistor. The wiring layer 4550 is formed in contact with a first electrode 4517, and the thin film transistor 4510 and the first electrode 4517 are electrically connected to each other through the wiring layer 4550.

The silicon oxide layer 4542 may be formed using a material and a method similar to those of the oxide insulating layers described in the other embodiments.

A color filter layer 4545 is formed over the insulating layer 4551 so as to overlap with a light-emitting region of a light-emitting element 4511.

Further, in order to reduce the surface roughness of the color filter layer 4545, the color filter layer 4545 is covered with an overcoat layer 4543 functioning as a planarization insulating film.

Further, an insulating layer 4544 is formed over the overcoat layer 4543. The insulating layer 4544 may be formed in a manner similar to that of the protective insulating layers described in the other embodiments, and a silicon nitride film may be formed by a sputtering method, for example.

Reference numeral 4511 denotes a light-emitting element, and the first electrode 4517 that is a pixel electrode included in the light-emitting element 4511 is electrically connected to a source electrode layer or a drain electrode layer of the thin film transistor 4510 through the wiring layer 4550. Note that a structure of the light-emitting element 4511 is not limited to the illustrated structure, which includes the first electrode 4517, an electroluminescent layer 4512, and a second electrode 4513. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed of a photosensitive material to have an opening over the first electrode 4517 so that a sidewall of the opening is formed as an inclined surface with continuous curvature.

The electroluminescent layer 4512 may be formed using a single layer or a plurality of layers stacked.

A protective film may be formed over the second electrode 4513 and the partition 4520 in order to prevent oxygen, hydrogen, moisture, carbon dioxide, or the like from entering the light-emitting element 4511. As the protective film, a silicon nitride film, a silicon nitride oxide film, a DLC (Diamond-Like Carbon) film, or the like can be formed.

In addition, a variety of signals and potentials are supplied to the signal line driver circuits 4503a and 4503b, the scan line driver circuits 4504a and 4504b, or the pixel portion 4502 from an FPC 4518a and an FPC 4518b.

A connection terminal electrode 4515 is formed from the same conductive film as the first electrode 4517 included in the light-emitting element 4511, and a terminal electrode 4516 is formed from the same conductive film as the source and drain electrode layers included in the thin film transistor 4509.

The connection terminal electrode 4515 is electrically connected to a terminal included in the FPC 4518a through an anisotropic conductive film 4519.

The substrate located in the direction in which light is extracted from the light-emitting element 4511 needs to have a light-transmitting property. In that case, a light-transmitting material such as a glass plate, a plastic plate, a polyester film, or an acrylic resin film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (a copolymer of ethylene with vinyl acetate) can be used. For example, nitrogen is used as the filler.

In addition, if needed, an optical film such as a polarizing plate, a circularly polarizing plate (including an elliptically polarizing plate), or a retardation plate (a quarter-wave plate or a half-wave plate) may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The sealant can be deposited using a screen printing method, an ink-jet apparatus, or a dispensing apparatus. As the sealant, typically, a material containing a visible light curable resin, an ultraviolet curable resin, or a thermosetting resin can be used. Further, a filler may be contained.

The signal line driver circuits 4503a and 4503b and the scan line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 16A and 16B.

Through the above process, a light-emitting display device (display panel) as a semiconductor device can be manufactured.

The photodetector 4580 detects the illuminance in the vicinity of the light-emitting display device, and the light-emission luminance can be adjusted, whereby the visibility can be increased and lower power consumption can be achieved.

If the photodetector described in Embodiment 1 is provided in the pixel portion 4502, the device can be used as an optical touch sensor.

This embodiment can be implemented in appropriate combination with any of the other embodiments.

Embodiment 12

In this embodiment, an embodiment of a semiconductor device disclosed in this specification will be described. Specifically, an example of electronic paper will be described as an embodiment of a semiconductor device disclosed in this specification.

Figure 17:
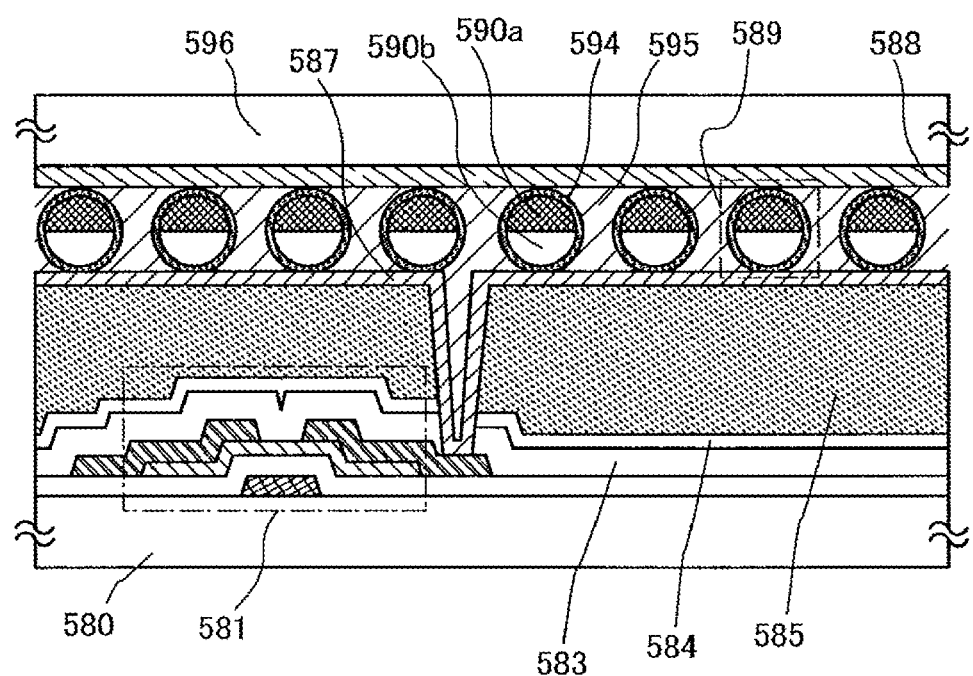
FIG. 17 shows a semiconductor device.

FIG. 17 illustrates active matrix electronic paper. A thin film transistor 581 used for the electronic paper can be any of the thin film transistors described in the above embodiments and can be manufactured using steps and materials similar to those of the thin film transistors described in the above embodiments. In this embodiment, an example in which the thin film transistor described in Embodiment 6 is used as the thin film transistor 581 will be described. Hydrogen or water is reduced in the oxide semiconductor layer of the thin film transistor 581.

The electronic paper in FIG. 17 is an example of a display device using a twisting ball display system. The twisting ball display system refers to a method in which spherical particles each colored in black and white are used for a display element and arranged between a first electrode layer and a second electrode layer which are electrode layers, and a potential difference is generated between the first electrode layer and the second electrode layer to control orientation of the spherical particles, so that display is performed.

The thin film transistor 581 provided over a substrate 580 is a thin film transistor having a bottom-gate structure. A source or drain electrode layer of the thin film transistor 581 is electrically connected to a first electrode layer 587 through an opening formed in the silicon oxide layer 583, a protective insulating layer 584, and an insulating layer 585.

Between the first electrode layer 587 and a second electrode layer 588, spherical particles 589 each having a black region 590a, a white region 590b, and a cavity 594 which is filled with liquid around the black region 590a and the white region 590b are provided. A space around the spherical particles 589 is filled with a filler 595 such as a resin (see FIG. 17). In this embodiment, the first electrode layer 587 corresponds to a pixel electrode, and the second electrode layer 588 provided on a counter substrate 596 corresponds to a common electrode.

Instead of the twisting ball, an electrophoretic element can also be used. A microcapsule having a diameter of approximately 10 μm to 200 μm in which transparent liquid, positively-charged white microparticles, and negatively-charged black microparticles are encapsulated is used. In the microcapsule which is provided between the first electrode layer and the second electrode layer, when an electric field is applied by the first electrode layer and the second electrode layer, the white microparticles and the black microparticles move to opposite sides from each other, so that white or black can be displayed. A display element using this principle is an electrophoretic display element and is generally called electronic paper. The electrophoretic display element has higher reflectance than a liquid crystal display element, and thus an auxiliary light is unnecessary, power consumption is low, and a display portion can be recognized even in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

The electronic paper of this embodiment is a reflective display device, in which display is performed by controlling voltage applied to the twisting ball with a driver circuit.

Through the above-described process, electronic paper as a semiconductor device can be manufactured.

If the photodetector described in Embodiment 1 is provided in the display portion, the device can be used as an optical touch sensor.

This embodiment can be implemented in appropriate combination with any of the other embodiments.

Embodiment 13

A semiconductor device disclosed in this specification can be applied to a variety of electronic appliances (including amusement machines). Examples of electronic appliances include television sets (also referred to as televisions or television receivers), monitors of computers or the like, cameras such as digital cameras or digital video cameras, digital photo frames, cellular phones (also referred to as mobile phones or mobile phone sets), portable game consoles, portable information terminals, audio reproducing devices, large-sized game machines such as pachinko machines, and the like.

Figure 18A:
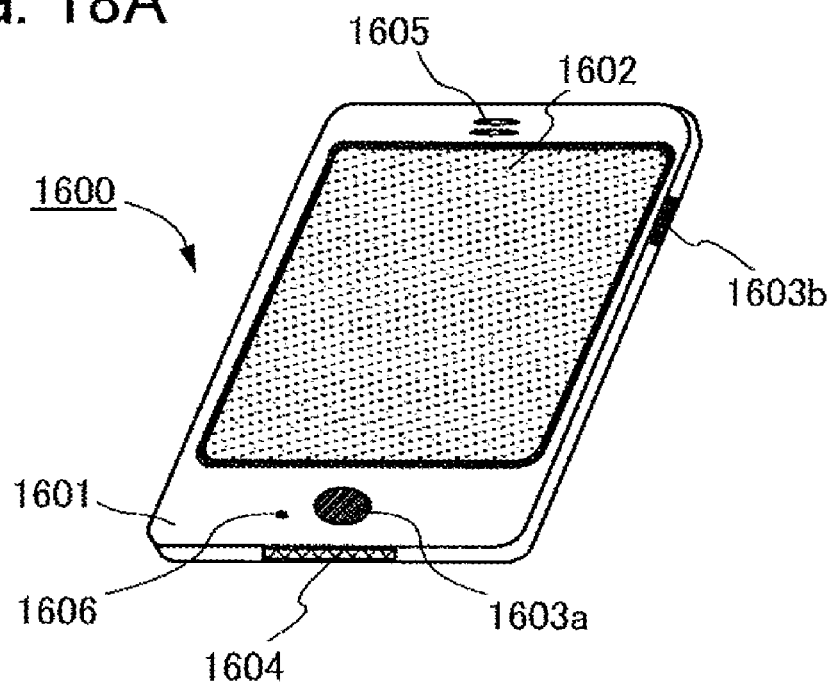
FIGS. 18A and 18B each show a semiconductor device.

FIG. 18A illustrates an example of a cellular phone. A cellular phone 1600 is provided with a display portion 1602 incorporated in a housing 1601, operation buttons 1603a and 1603b, an external connection port 1604, a speaker 1605, a microphone 1606, and the like.

When the display portion 1602 of the cellular phone 1600 illustrated in FIG. 18A is touched with a finger or the like, data can be input into the cellular phone 1600. Further, operations such as making calls and composing mails can be performed by touching the display portion 1602 with a finger or the like.

There are mainly three screen modes of the display portion 1602. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected in the display portion 1602 so that text displayed on a screen can be input. In this case, it is preferable to display a keyboard or number buttons on almost all area of the screen of the display portion 1602.

When a detection device including a sensor for detecting inclination, such as a gyroscope or an acceleration sensor, is provided inside the cellular phone 1600, display of the screen on the display portion 1602 can be automatically switched by determining the direction of the cellular phone 1600 (whether the cellular phone 1600 is placed horizontally or vertically for a landscape mode or a portrait mode).

The screen modes are switched by touching the display portion 1602 or operating the operation buttons 1603a and 1603b of the housing 1601. Alternatively, the screen modes may be switched depending on the kind of the image displayed on the display portion 1602. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1602 is not performed for a certain period while a signal detected by the optical sensor in the display portion 1602 is detected, the screen mode may be controlled so as to be switched from the input mode to the display mode.

The display portion 1602 may function as an image sensor. For example, an image of the palm print, the fingerprint, or the like is taken by touching the display portion 1602 with the palm or the finger, whereby personal authentication can be performed. Further, by providing a backlight or sensing light source emitting a near-infrared light for the display portion, an image of a finger vein, a palm vein, or the like can be taken.

Any of the semiconductor devices described in the above embodiments can be applied to the display portion 1602. For example, a plurality of thin film transistors described in the above embodiments can be disposed as switching elements in pixels.

Figure 18B:
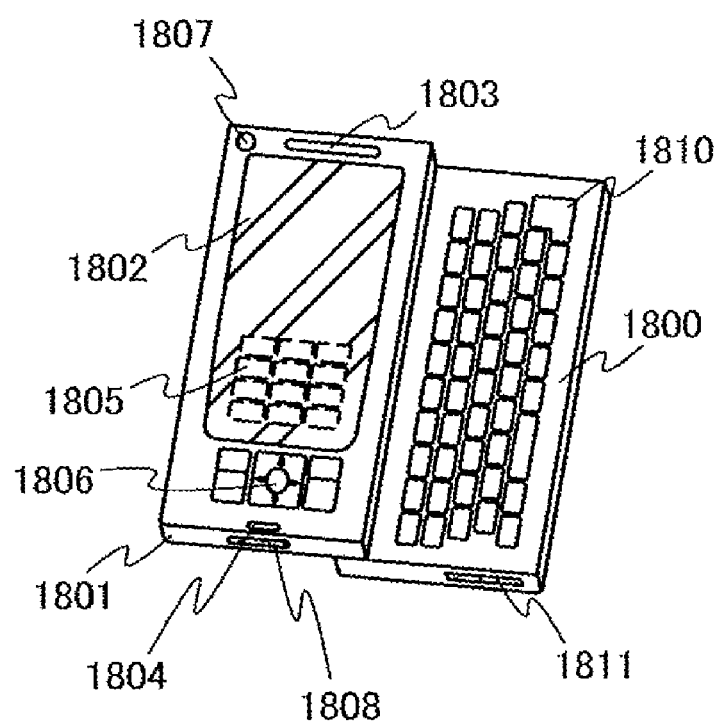

FIG. 18B also illustrates an example of a mobile phone. A portable information terminal such as the one illustrated in FIG. 18B can have a plurality of functions. For example, in addition to a telephone function, such a portable information terminal can have a function of processing a variety of pieces of data by incorporating a computer.

The portable information terminal illustrated in FIG. 18B has a housing 1800 and a housing 1801. The housing 1801 includes a display panel 1802, a speaker 1803, a microphone 1804, a pointing device 1806, a camera lens 1807, an external connection terminal 1808, and the like. The housing 1800 includes a keyboard 1810, an external memory slot 1811, and the like. In addition, an antenna is incorporated in the housing 1801.

The display panel 1802 is provided with a touch panel. A plurality of operation keys 1805 which is displayed as images is illustrated by dashed lines in FIG. 18B.

Further, in addition to the above structure, a contactless IC chip, a small memory device, or the like may be incorporated.

Any of the semiconductor devices described in the above embodiments can be used for the display panel 1802 and the direction of display is changed appropriately depending on an application mode. Further, the camera lens 1807 is provided on the same surface as the display panel 1802, and thus a videophone is realized. The speaker 1803 and the microphone 1804 can be used for videophone calls, recording, and playing sound, etc. as well as voice calls. Moreover, the housings 1800 and 1801 in a state where they are developed as illustrated in FIG. 18B can shift so that one is lapped over the other by sliding; therefore, the size of the portable information terminal can be reduced, which makes the portable information terminal suitable for being carried.

The external connection terminal 1808 can be connected to an AC adapter and various types of cables such as a USB cable, and charging and data communication with a personal computer are possible. Moreover, a storage medium can be inserted into the external memory slot 1811 so that a large amount of data can be stored and can be moved.

Further, in addition to the above functions, an infrared communication function, a television reception function, or the like may be provided.

Figure 19A:
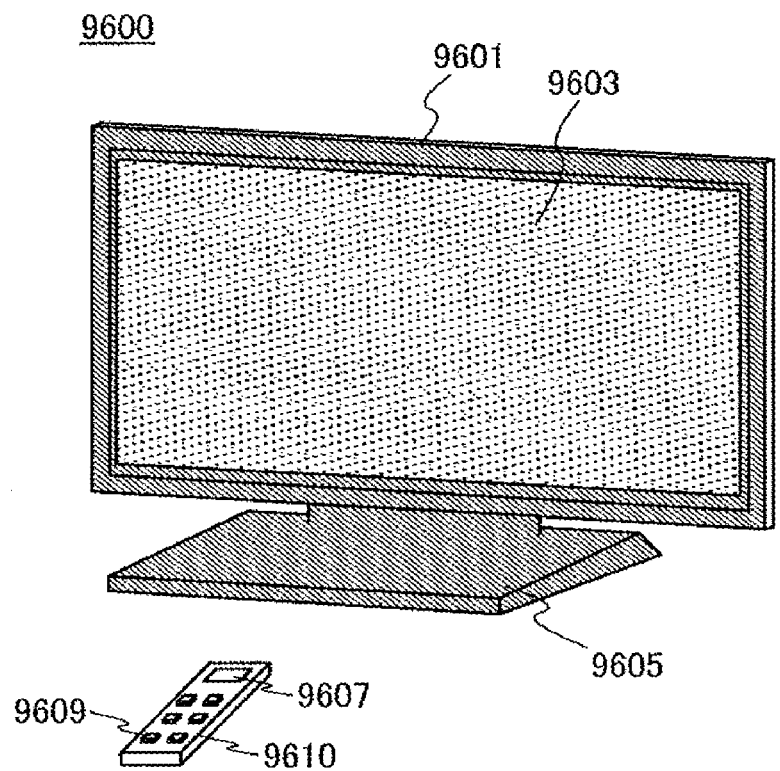
FIGS. 19A and 19B each show a semiconductor device.

FIG. 19A illustrates an example of a television set. In a television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled.

Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Any of the semiconductor devices described in the above embodiments can be applied to the display portion 9603. For example, a plurality of thin film transistors described in the above embodiments can be disposed as switching elements in pixels.

Figure 19B:
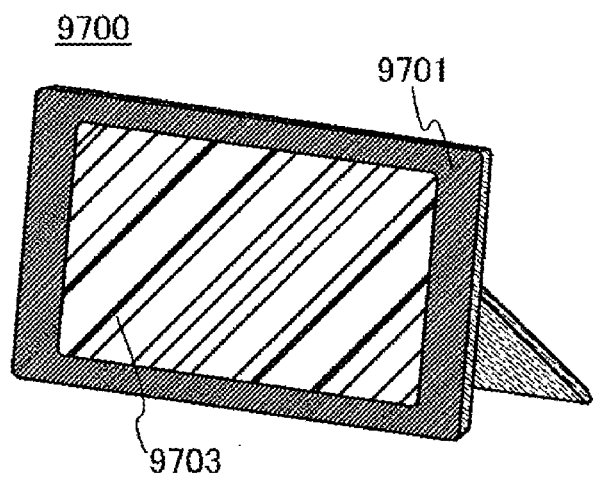

FIG. 19B illustrates an example of a digital photo frame. For example, in a digital photo frame 9700, a display portion 9703 is incorporated in a housing 9701. Various images can be displayed on the display portion 9703. For example, the display portion 9703 can display data of an image shot by a digital camera or the like to function as a normal photo frame.

Any of the semiconductor devices described in the above embodiments can be applied to the display portion 9703. For example, a plurality of thin film transistors described in the above embodiments can be disposed as switching elements in pixels.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the same surface as the display portion, they are preferably provided on the side surface or the back surface for the design of the digital photo frame 9700. For example, a memory that stores data of an image shot by a digital camera is inserted into the recording medium insertion portion of the digital photo frame, whereby the image data can be transferred and displayed on the display portion 9703.

The digital photo frame 9700 may have a configuration capable of wirelessly transmitting and receiving data. Through wireless communication, desired image data can be transferred to be displayed.

Figure 20:
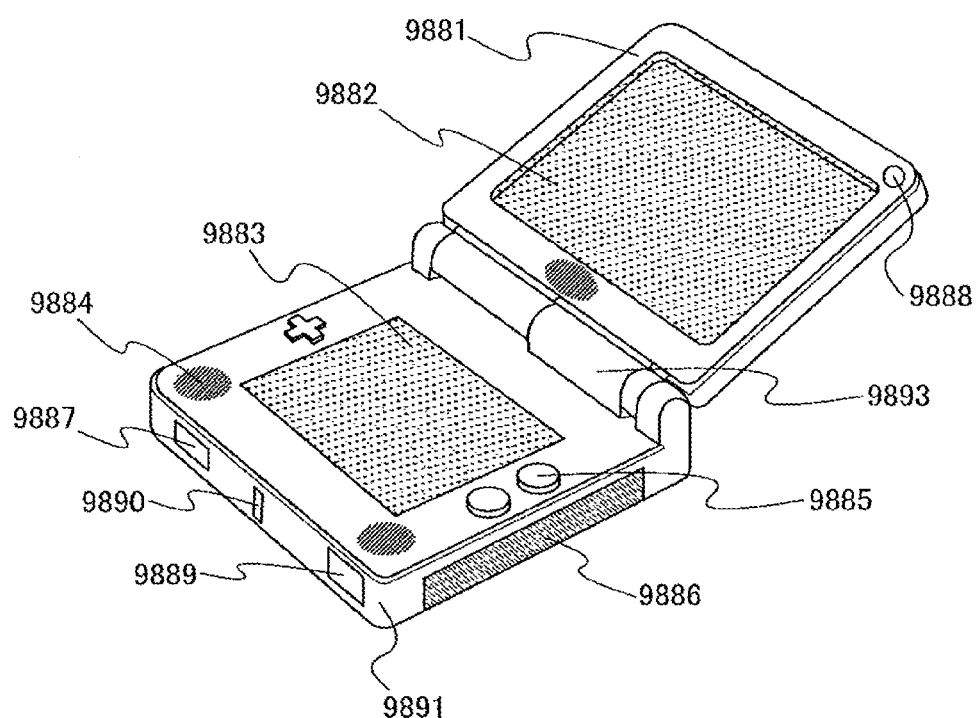
FIG. 20 shows a semiconductor device.

FIG. 20 illustrates an example of a portable amusement machine. The portable amusement machine illustrated in FIG. 20 is formed of two housings: a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively.

Any of the semiconductor devices described in the above embodiments can be applied to the display portion 9883. For example, a plurality of thin film transistors described in the above embodiments can be disposed as switching elements in pixels.

In addition, the portable amusement machine illustrated in FIG. 20 includes a speaker portion 9884, a recording medium insertion portion 9886, an LED lamp 9890, an input unit (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a thin film transistor disclosed in this specification can be employed. The portable amusement machine may include other accessory equipment as appropriate. The portable amusement machine illustrated in FIG. 20 has a function of reading a program or data stored in a recording medium to display it on the display portion, and a function of sharing information with another portable amusement machine by wireless communication. The portable amusement machine illustrated in FIG. 20 can have various functions without limitation to the above.

Embodiment 14

A semiconductor device disclosed in this specification can be applied to electronic paper. Electronic paper can be used for electronic appliances of a variety of fields as long as they can display data. For example, electronic paper can be applied to display portions of an e-book (electronic book) reader, a poster, an advertisement in a vehicle such as a train, various cards such as a credit card, and the like. An example of the electronic appliances is illustrated in FIG. 21.

Figure 21:
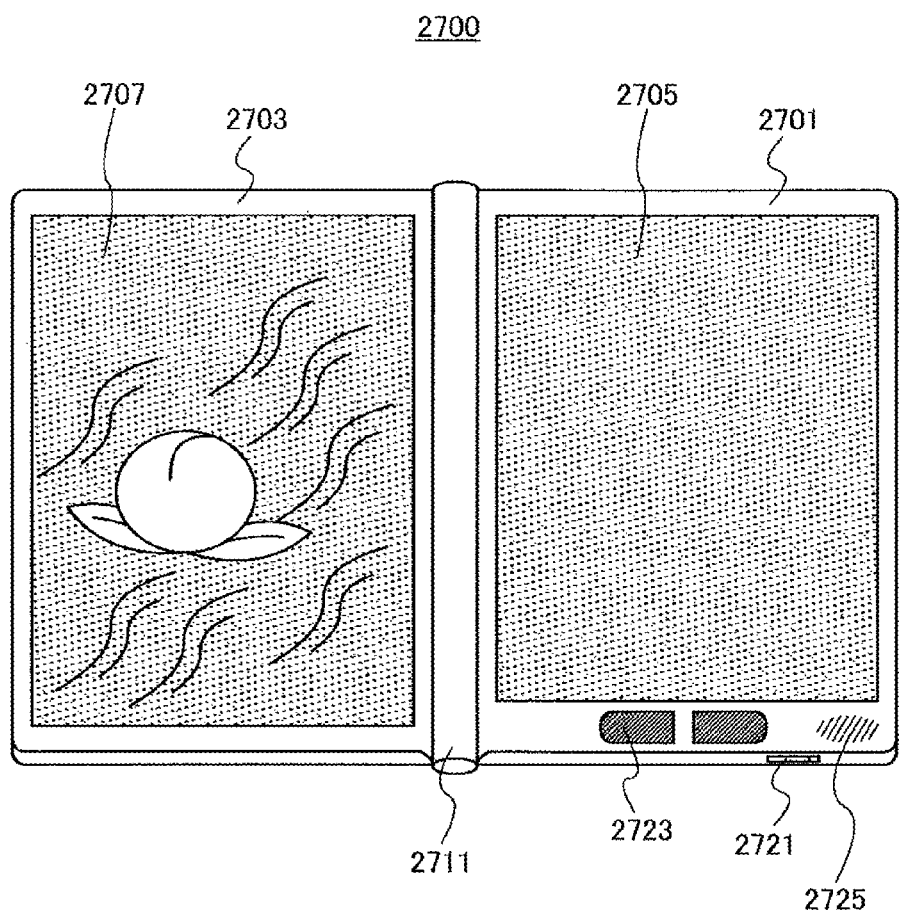
FIG. 21 shows a semiconductor device.

FIG. 21 illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 21) and images can be displayed on a display portion on the Left side (the display portion 2707 in FIG. 21).

FIG. 21 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to an AC adapter or various cables such as a USB cable, or the like), a recording medium insertion portion, or the like may be provided on the back surface or the side surface of the housing. Moreover, the electronic book reader 2700 may have a function of an electronic dictionary.

Further, the electronic book reader 2700 may send and receive information wirelessly. Through wireless communication, desired book data or the like can be purchased and downloaded from an electronic book server.

This embodiment can be implemented in appropriate combination with any of the other embodiments.

This application is based on Japanese Patent Application serial no. 2009-242853 filed with Japan Patent Office on Oct. 21, 2009, the entire contents of which are hereby incorporated by reference.

EXPLANATION OF REFERENCE

300: substrate, 302: gate insulating layer, 303: protective insulating layer, 310: thin film transistor, 311: gate electrode layer, 316: oxide insulating layer, 320: substrate, 322: gate insulating layer, 323: protective insulating layer, 330: oxide semiconductor film, 331: oxide semiconductor layer, 332: oxide semiconductor layer, 340: substrate, 342: gate insulating layer, 343: protective insulating layer, 345: oxide semiconductor film, 346: oxide semiconductor layer, 350: thin film transistor, 351: gate electrode layer, 356: oxide insulating layer, 360: thin film transistor, 361: gate electrode layer, 366: oxide insulating layer, 370: substrate, 373: protective insulating layer, 380: thin film transistor, 381: gate electrode layer, 382: oxide semiconductor layer, 386: oxide insulating layer, 400: substrate, 402: gate insulating layer, 407: insulating layer, 410: thin film transistor, 411: gate electrode layer, 412: oxide semiconductor layer, 420: silicon substrate, 422: insulating layer, 423: opening, 424: conductive layer, 425: thin film transistor, 426: thin film transistor, 427: conductive layer, 450: substrate, 452: gate insulating layer, 457: insulating layer, 460; thin film transistor, 461: gate electrode layer, 461a: gate electrode layer, 461b: gate electrode layer, 462: oxide semiconductor layer, 464: wiring layer, 468: wiring layer, 580; substrate, 581: thin film transistor, 583; oxide silicon layer, 584: protective insulating layer, 585: insulating layer, 587; electrode layer, 588: electrode layer, 589: spherical particle, 594: cavity, 595: filler, 596: counter substrate, 601: substrate, 608: adhesive layer, 613: substrate, 622: light, 631: insulating layer, 632: protective insulating layer, 633: interlayer insulating layer, 634: interlayer insulating layer, 641: electrode layer, 642: electrode layer, 643: conductive layer, 644: electrode layer, 645: gate electrode layer, 1300: photodetector, 1301: detector, 1302: amplifier circuit, 1305: transistor, 1306: transistor, 1311: power supply terminal, 1312: power supply terminal, 1320: protection circuit, 1321: diode, 1600: cellular phone, 1601: housing, 1602: display portion, 1604: external connection port, 1605: speaker, 1606: microphone, 1800: housing, 1801: housing, 1802: display panel, 1803: speaker, 1804: microphone, 1805: operation key, 1806: pointing device, 1807: camera lens, 1808: external connection terminal, 1810: keyboard, 1811: external memory slot, 2700: electronic book reader, 2701: housing, 2703: housing, 2705: display portion, 2707: display portion, 2711: hinge, 2721: power supply, 2723: operation key, 2725: speaker, 4001: substrate, 4002: pixel portion, 4003: signal line driver circuit, 4004: scan line driver circuit, 4005: sealant, 4006: substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4020: insulating layer, 4021: insulating layer, 4030: pixel electrode layer, 4031: counter electrode layer, 4032: insulating layer, 4033: insulating layer, 4035: spacer, 4040: conductive layer, 4041: insulating layer, 4042: protective insulating layer, 4100: photodetector, 4501: substrate, 4502: pixel portion, 4505: sealant, 4506: substrate, 4507: filler, 4509: thin film transistor, 4510: thin film transistor, 4511: light-emitting element, 4512: electroluminescent layer, 4513: electrode, 4515: connection terminal electrode, 4516: terminal electrode, 4517: electrode, 4519: anisotropic conductive film, 4520: partition, 4540: conductive layer, 4542: silicon oxide layer, 4543: overcoat layer, 4544: insulating layer, 4545: color filter layer, 4550: wiring layer, 4551: insulating layer, 4580: photodetector, 6400: pixel, 6401: switching transistor, 6402: transistor for driving a light-emitting element, 6403: capacitor, 6404: light-emitting element, 6405: signal line, 6406: scan line, 6407: power supply line, 6408: common electrode, 6502: transistor for driving a light-emitting element, 6503: capacitor, 6504: light-emitting element, 6505: signal line, 6506: scan line, 6507: power supply line, 6508:

common electrode, 6510: pixel, 6511: switching transistor, 6512: switching transistor, 6513: reference transistor, 7001: transistor for driving a light-emitting element, 7002: light-emitting element, 7003: electrode, 7004: EL layer, 7005: electrode, 7009: partition, 7011: transistor for driving a light-emitting element, 7012: light-emitting element, 7013: electrode, 7014: EL layer, 7015: electrode, 7016: light-blocking film, 7017: conductive film, 7019: partition, 7021: transistor for driving a light-emitting element, 7022: light-emitting element, 7023: electrode, 7024: EL layer, 7025: electrode, 7027: conductive film, 7029: partition, 7031: insulating layer, 7032: insulating layer, 7033: color filter layer, 7034: overcoat layer, 7035: protective insulating layer, 7036: planarization insulating layer, 7041: insulating layer, 7042: insulating layer, 7043: color filter layer, 7044: overcoat layer, 7045: protective insulating layer, 7046: planarization insulating layer, 7051: silicon oxide layer, 7052: protective insulating layer, 7053: planarization insulating layer, 7055: insulating layer, 7056: planarization insulating layer, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording medium insertion portion, 9887: connection terminal, 9888: sensor, 9889: microphone, 9890: LED lamp, 9891: housing, 9893: connection portion, 1603*a*: operation button, 1603*b*: operation button, 315*a*: source electrode layer, 315*b*: drain electrode layer, 355*a*: source electrode layer, 355*b*: drain electrode layer, 365*a*: source electrode layer, 365*b*: drain electrode layer, 372*a*: gate insulating layer, 372*b*: gate insulating layer, 385*a*: source electrode layer, 385*b*: drain electrode layer, 414*a*: wiring layer, 414*b*: wiring layer, 415*a*: source or drain electrode layer, 415*b*: source or drain electrode layer, 421*a*: opening, 421*b*: opening, 4503*a*: signal line driver circuit, 4503*b*: signal line driver circuit, 4504*a*: scan line driver circuit, 4504*b*: scan line driver circuit, 4518*a*: FPC, 4518*b*: FPC, 465*a*1: source or drain electrode layer, 465*a*2: source or drain electrode layer, 465*b*: source or drain electrode layer, 590*a*: black region, 590*b*: white region, 606*a*: semiconductor layer, 606*b*: semiconductor layer, and 606*c*: semiconductor layer.

What is claimed is:

1. A semiconductor device comprising:
a first transistor; and
a plurality of transistors connected in parallel to each other,
wherein a drain and a gate of the first transistor are electrically connected to each other,
wherein the gate of the first transistor is electrically connected to a gate of one of the plurality of transistors,
wherein each of the first transistor and the plurality of transistors comprises an oxide semiconductor, and
wherein an off-state current of each of the first transistor and the plurality of transistors is $10^{-13}$ A or less.

2. The semiconductor device according to claim 1, wherein the plurality of transistors have a longer channel width than the first transistor.

3. The semiconductor device according to claim 1, wherein a channel region of the oxide semiconductor has a carrier concentration of $5\times10^{14}/cm^3$ or lower.

4. The semiconductor device according to claim 1, further comprising a detector electrically connected to the first transistor.

5. The semiconductor device according to claim 4, wherein the detector is any of a photo-sensor, an audio sensor and a temperature sensor.

6. A display device comprising the semiconductor device according to claim 1.

7. An electronic appliance comprising the semiconductor device according to claim 1.

8. A semiconductor device comprising:
a first transistor; and
a plurality of transistors connected in parallel to each other,
wherein a drain and a gate of the first transistor are electrically connected to each other,
wherein the gate of the first transistor is electrically connected to a gate of one of the plurality of transistors,
wherein each of the first transistor and the plurality of transistors comprises an oxide semiconductor, and
wherein the oxide semiconductor has a hydrogen concentration of $5\times10^{19}$ atoms/cm$^3$ or lower.

9. The semiconductor device according to claim 8, wherein the plurality of transistors have a longer channel width than the first transistor.

10. The semiconductor device according to claim 8, wherein a channel region of the oxide semiconductor has a carrier concentration of $5\times10^{14}/cm^3$ or lower.

11. The semiconductor device according to claim 8, further comprising a detector electrically connected to the first transistor.

12. The semiconductor device according to claim 11, wherein the detector is any of a photo-sensor, an audio sensor and a temperature sensor.

13. A display device comprising the semiconductor device according to claim 8.

14. An electronic appliance comprising the semiconductor device according to claim 8.

15. A semiconductor device comprising:
a first transistor;
a second transistor;
a capacitor;
a light-emitting element;
a first line; and
a second line,
wherein one of a source and a drain of the first transistor is electrically connected to the first line,
wherein the other one of the source and the drain of the first transistor is electrically connected to a gate of the second transistor and one terminal of the capacitor,
wherein the other one terminal of the capacitor is electrically connected to one of a source and a drain of the second transistor and the light-emitting element,
wherein the other one of the source and the drain of the second transistor is electrically connected to the second line,
wherein each of the first transistor and the second transistor comprises an oxide semiconductor, and
wherein an off-state current of each of the first transistor and the second transistor is $10^{-13}$ A or less.

16. The semiconductor device according to claim 15, wherein the oxide semiconductor has a hydrogen concentration of $5\times10^{19}$ atoms/cm$^3$ or lower.

17. The semiconductor device according to claim 15, wherein a channel region of the oxide semiconductor has a carrier concentration of $5\times10^{14}/cm^3$ or lower.

18. The semiconductor device according to claim 15, further comprising:
a third transistor;
a fourth transistor; and
a third line,
wherein one of a source and a drain of the third transistor is electrically connected to the first line, wherein a gate of the first transistor and a gate of the third transistor are electrically connected to the third line, wherein the other one of the source and the drain of the third transistor is electrically connected to one of a source and a drain of the fourth transistor, wherein the other one of the source and the drain of the fourth transistor is electrically connected to the other one terminal of the capacitor, the one of the source and the drain of the second transistor, and the light-emitting element, wherein a gate of the fourth transistor is electrically connected to the other one of the source and the drain of the first transistor, the gate of the second transistor, and the one terminal of the capacitor, and wherein each of the third transistor and the fourth transistor comprises the oxide semiconductor.

19. A display device comprising the semiconductor device according to claim 15.

20. An electronic appliance comprising the semiconductor device according to claim 15.

* * * * *

UNITED STATES PATENT AND TRADEMARK OFFICE
CERTIFICATE OF CORRECTION

PATENT NO.           : 8,350,621 B2
APPLICATION NO.      : 13/568186
DATED                : January 8, 2013
INVENTOR(S)          : Shunpei Yamazaki et al.

It is certified that error appears in the above-identified patent and that said Letters Patent is hereby corrected as shown below:

In the Specification

Column 2, line 27, replace "folined" with --formed--;

Column 2, line 47, replace "farther" with --further--;

Column 3, line 10, replace "fihn" with --film--;

Column 4, line 9, replace "238" with --23B--;

Column 8, line 58, replace "noting" with --normal--;

Column 14, line 19, replace "foiined" with --formed--;

Column 14, line 54, replace "RE" with --RIE--;

Column 16, line 31, replace "fog wed" with --formed--;

Column 16, line 48, replace "Iayer" with --layer--;

Column 19, line 64, replace "(7 temperature)" with --(T: temperature)--;

Column 29, line 10, replace "urn" with --nm--;

Column 33, line 50, replace "Off" with --OH⁻--;

Column 34, line 25, replace "i-type" with --I-type--;

Column 34, line 43, replace "Ruined" with --formed--;

Signed and Sealed this
Seventh Day of May, 2013

Teresa Stanek Rea
*Acting Director of the United States Patent and Trademark Office*

CERTIFICATE OF CORRECTION (continued)
U.S. Pat. No. 8,350,621 B2

Column 34, line 44, replace "RE" with --RF--;

Column 37, line 32, replace "200 T" with --200 °C--;

Column 38, line 25, replace "108" with --10B--;

Column 40, line 22, replace "RE" with --RF--;

Column 46, line 8, replace "beuzocyclobutene" with --benzocyclobutene--;

Column 51, line 63, replace "Light" with --light--;

Column 57, line 14, replace "polyimide" with --polyamide--; and

Column 65, line 38, replace "Left" with --left--.